(12) United States Patent
Ichikawa et al.

(10) Patent No.: US 9,048,225 B2
(45) Date of Patent: Jun. 2, 2015

(54) SEMICONDUCTOR DEVICE AND METHOD FOR MANUFACTURING SEMICONDUCTOR DEVICE

(71) Applicant: Shinko Electric Industries Co., LTD., Nagano-ken (JP)

(72) Inventors: Sumihiro Ichikawa, Nagano (JP); Takaharu Yamano, Nagano (JP)

(73) Assignee: Shinko Electric Industries Co., LTD., Nagano-ken (JP)

( * ) Notice: Subject to any disclaimer, the term of this patent is extended or adjusted under 35 U.S.C. 154(b) by 0 days.

(21) Appl. No.: 14/185,872

(22) Filed: Feb. 20, 2014

(65) Prior Publication Data

US 2014/0239508 A1    Aug. 28, 2014

(30) Foreign Application Priority Data

Feb. 27, 2013   (JP) .................................. 2013-037899
Oct. 18, 2013   (JP) .................................. 2013-217624

(51) Int. Cl.
*H01L 29/02*    (2006.01)
*H01L 23/48*    (2006.01)
*H01L 25/065*   (2006.01)
*H01L 23/31*    (2006.01)
*H01L 25/00*    (2006.01)

(52) U.S. Cl.
CPC ............ *H01L 23/481* (2013.01); *H01L 23/3128* (2013.01); *H01L 25/0657* (2013.01); *H01L 25/50* (2013.01); *H01L 2225/06517* (2013.01); *H01L 2225/06513* (2013.01); *H01L 2225/06544* (2013.01); *H01L 2225/06568* (2013.01); *H01L 2224/16225* (2013.01); *H01L 2924/15174* (2013.01)

(58) Field of Classification Search
USPC ........................................ 257/621, 751, 774
See application file for complete search history.

(56) References Cited

U.S. PATENT DOCUMENTS

2013/0037943 A1    2/2013  Yamano
2013/0200526 A1*   8/2013  Moon et al. .................... 257/774

FOREIGN PATENT DOCUMENTS

JP        2006-179562        7/2006

* cited by examiner

*Primary Examiner* — Jasmine Clark
(74) *Attorney, Agent, or Firm* — Wolf, Greenfield & Sacks, P.C.

(57) ABSTRACT

A semiconductor device includes a semiconductor substrate. A through hole extends through the semiconductor substrate. A first insulating layer covers an upper surface of the semiconductor substrate and includes an opening in communication with the through hole. An insulating film covers wall surfaces of the through hole and the opening. A through electrode is formed in the through hole and the opening. A first connection terminal includes an electroless plating metal layer formed on an end surface of the through electrode and an end surface of the insulating film. The first connection terminal has a larger diameter than the through electrode. A wiring pattern is laminated on a lower surface of the semiconductor substrate. An electrode pad is connected to the wiring pattern. The through electrode is connected to the wiring pattern.

14 Claims, 33 Drawing Sheets

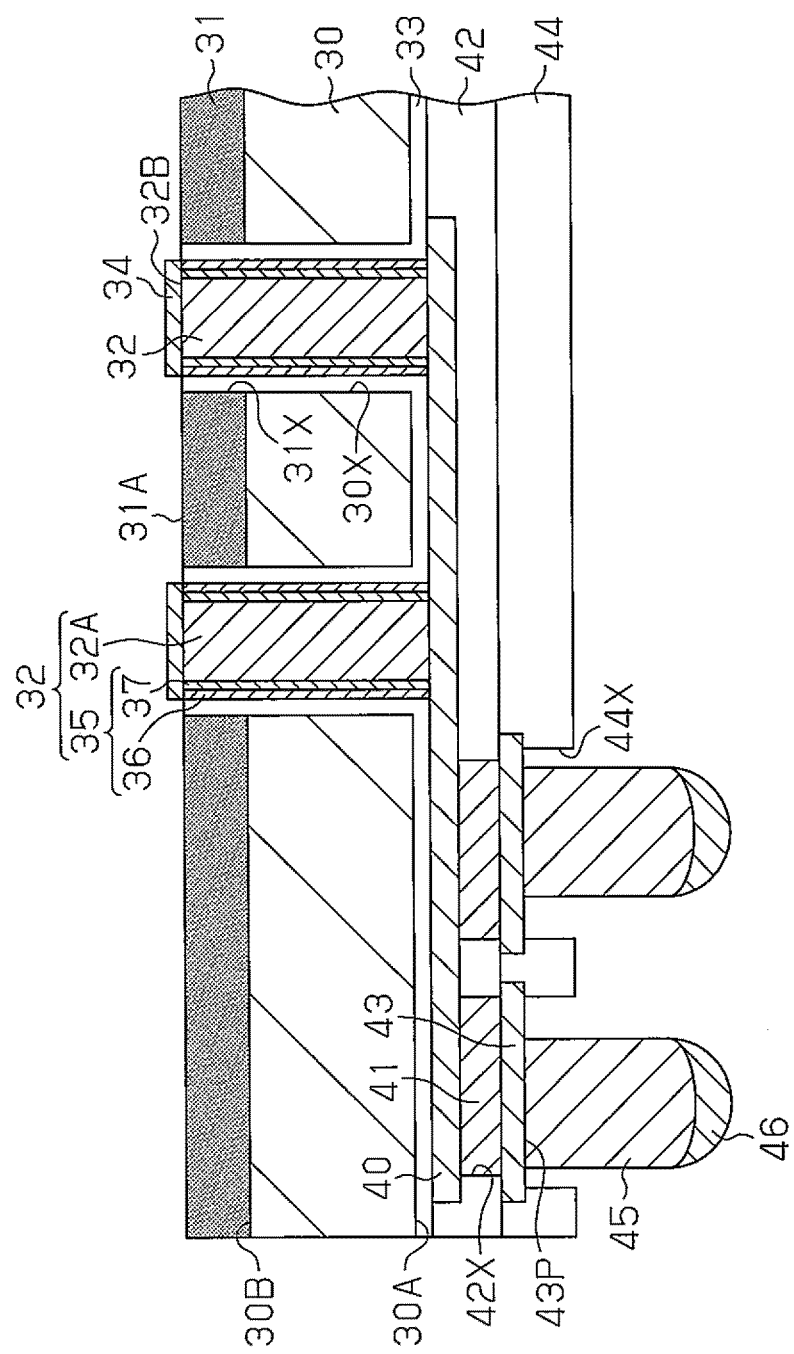

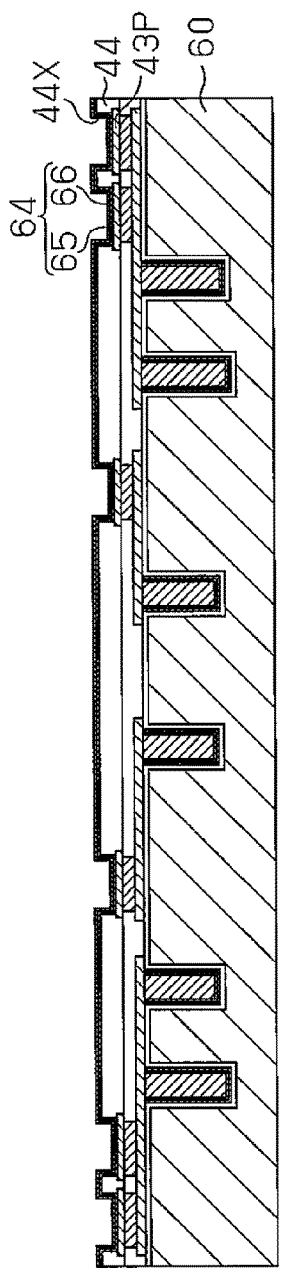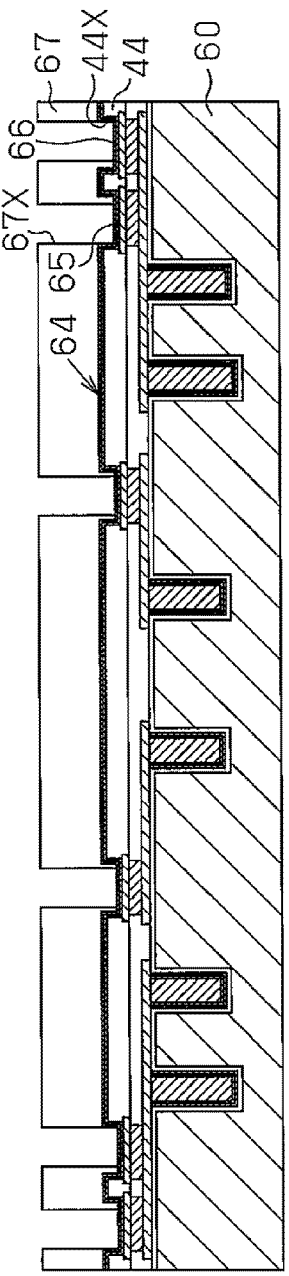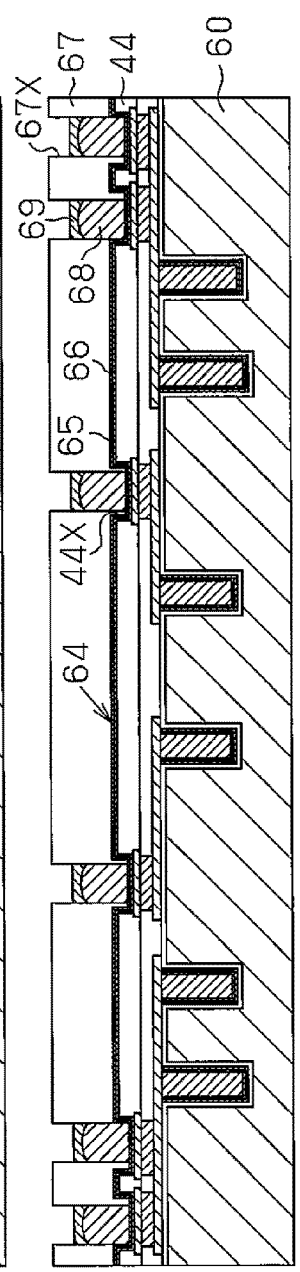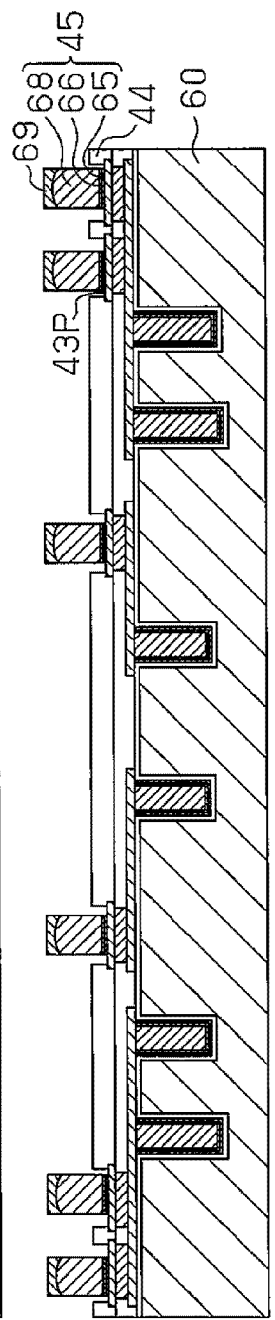

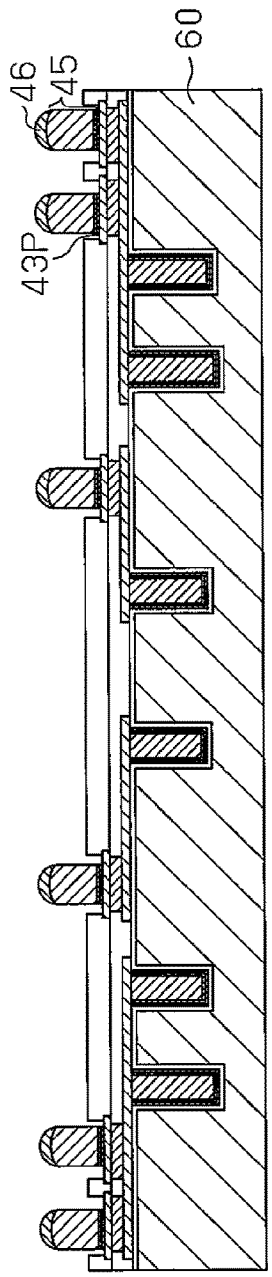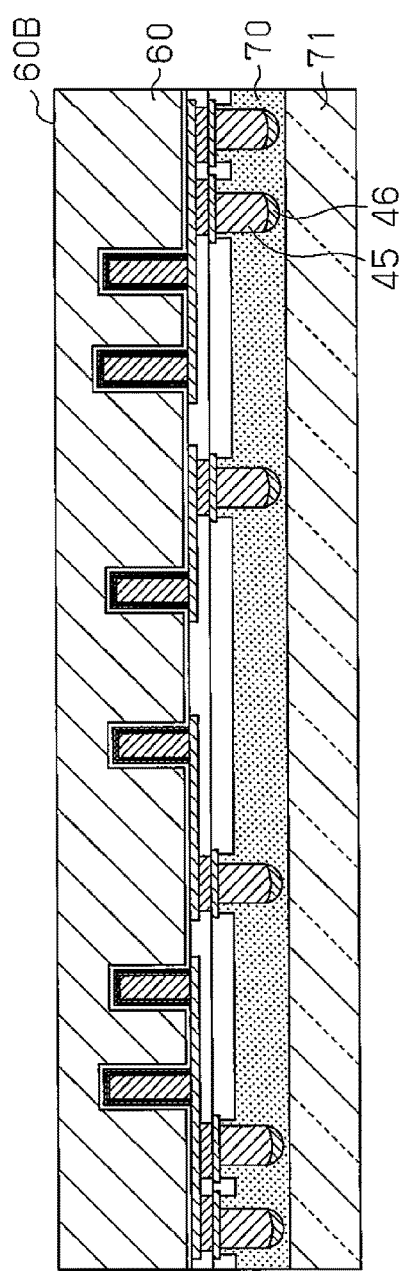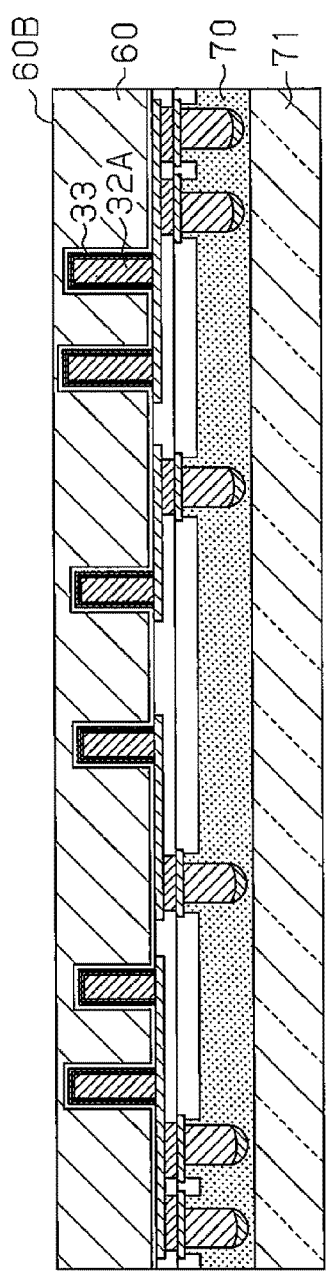

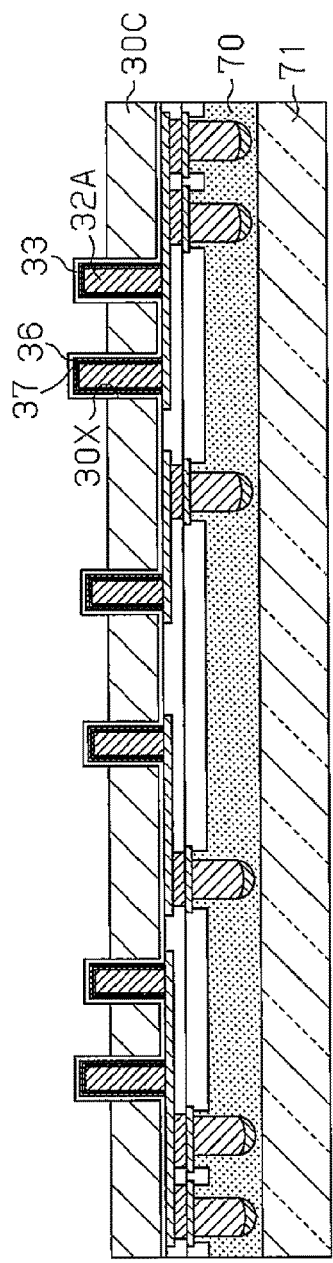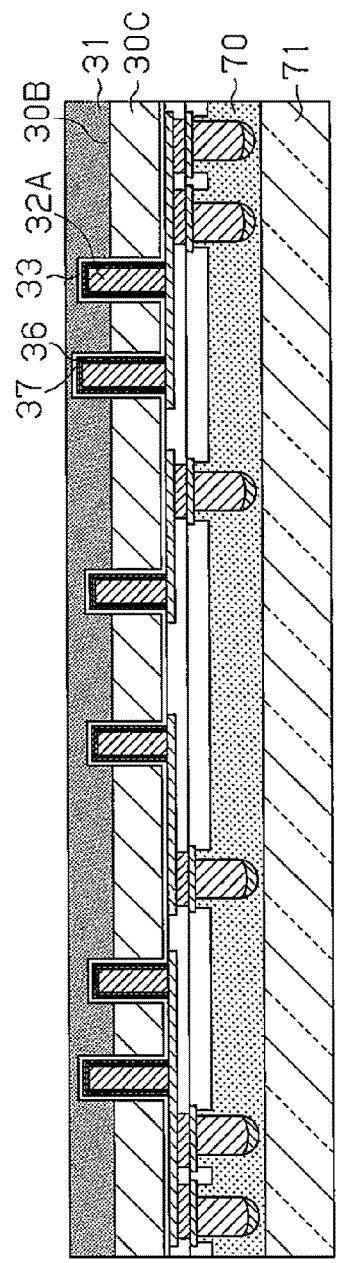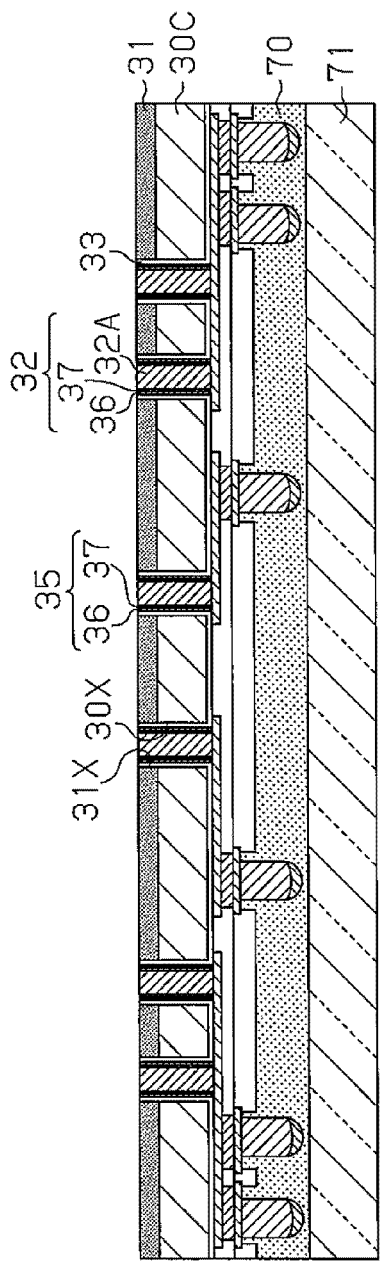

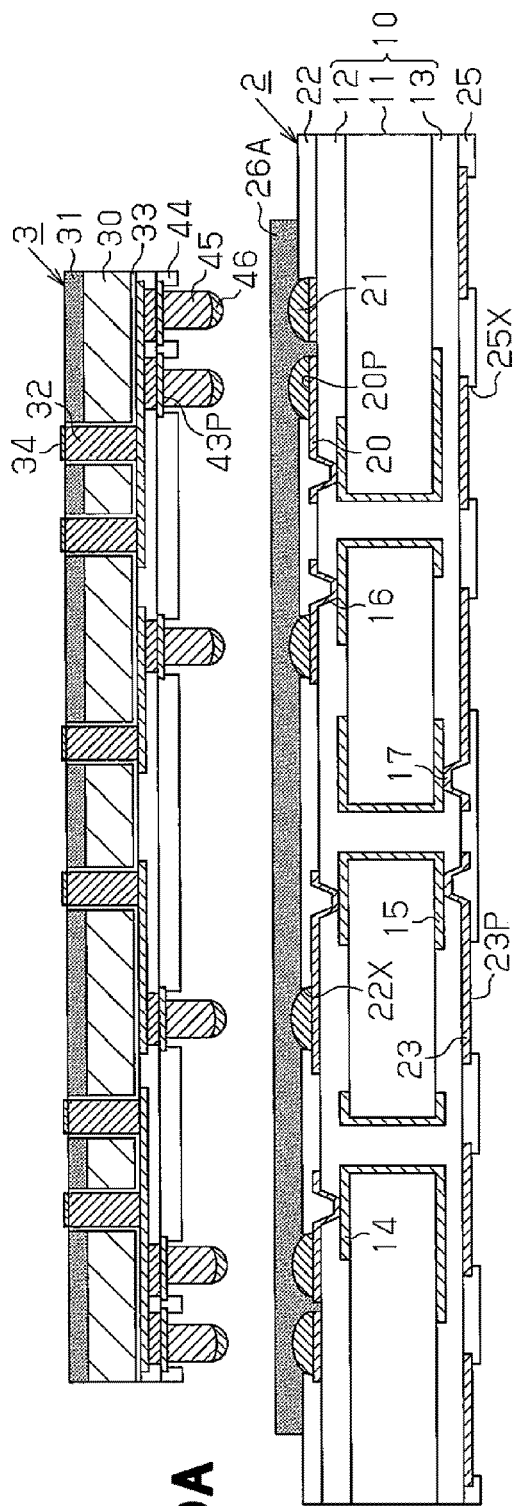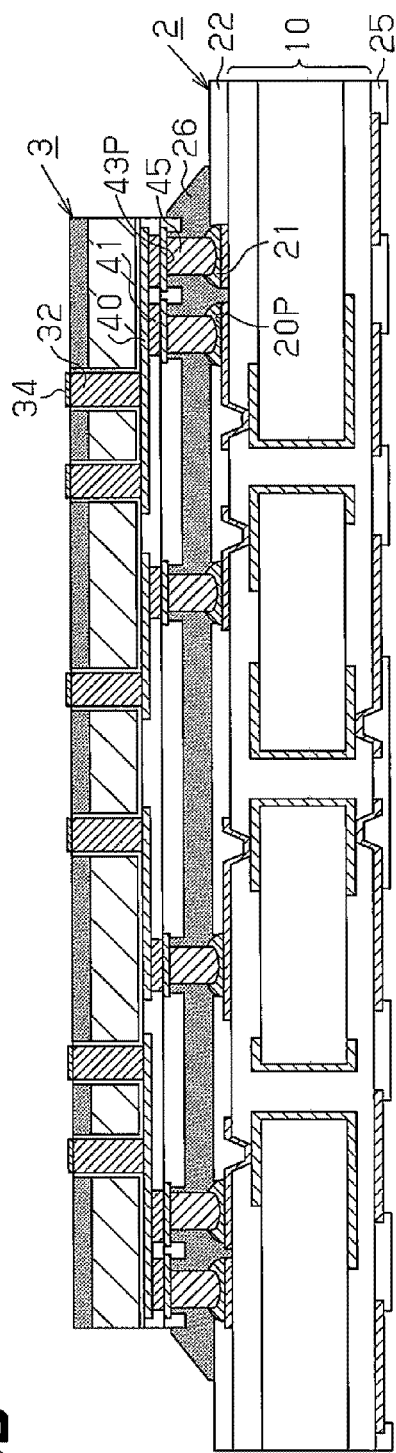

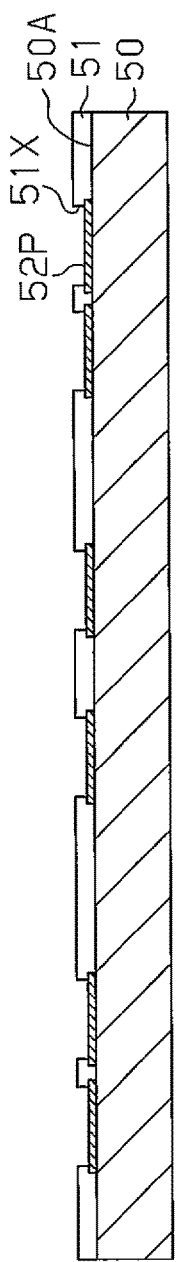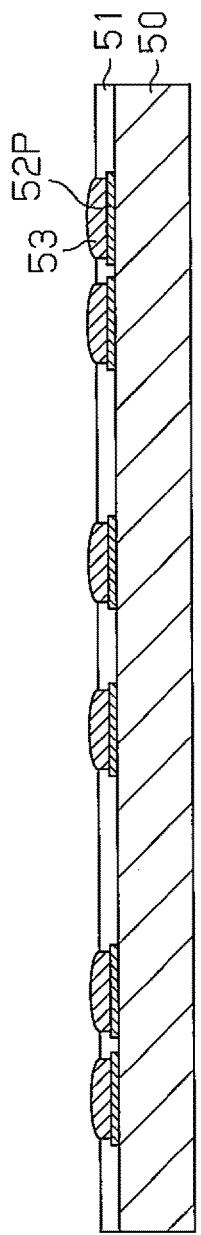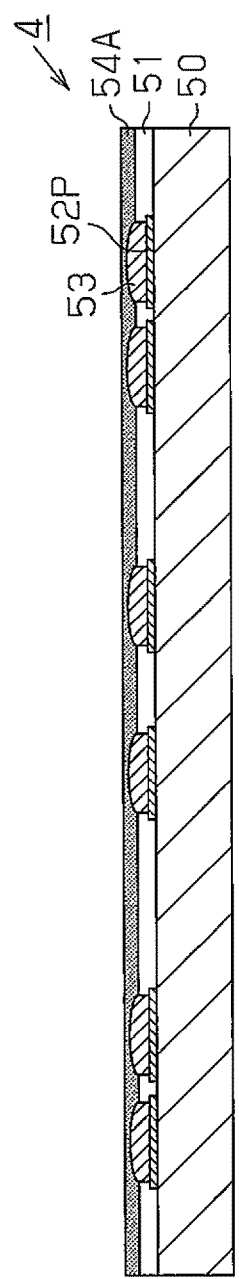

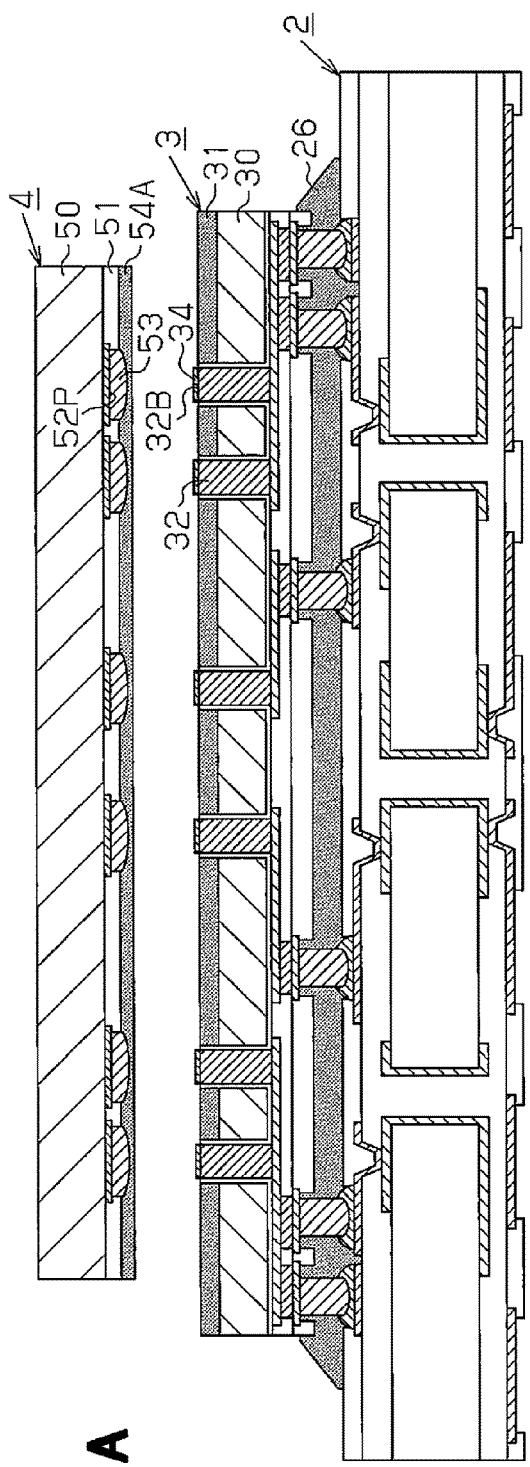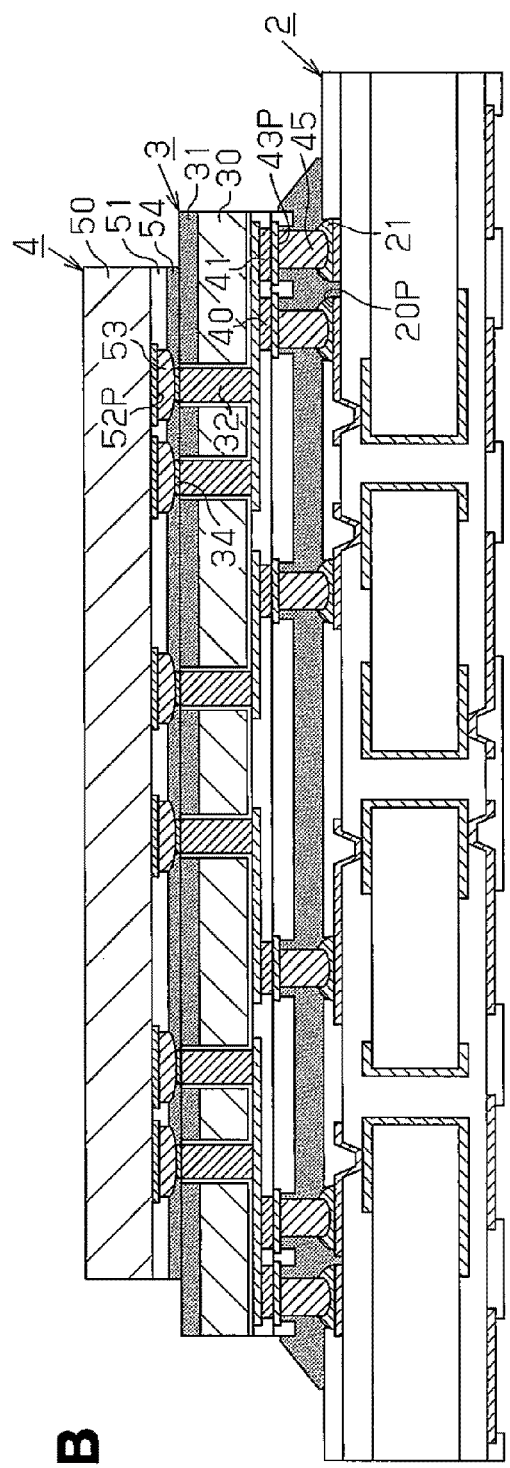
Fig.11A
Fig.11B

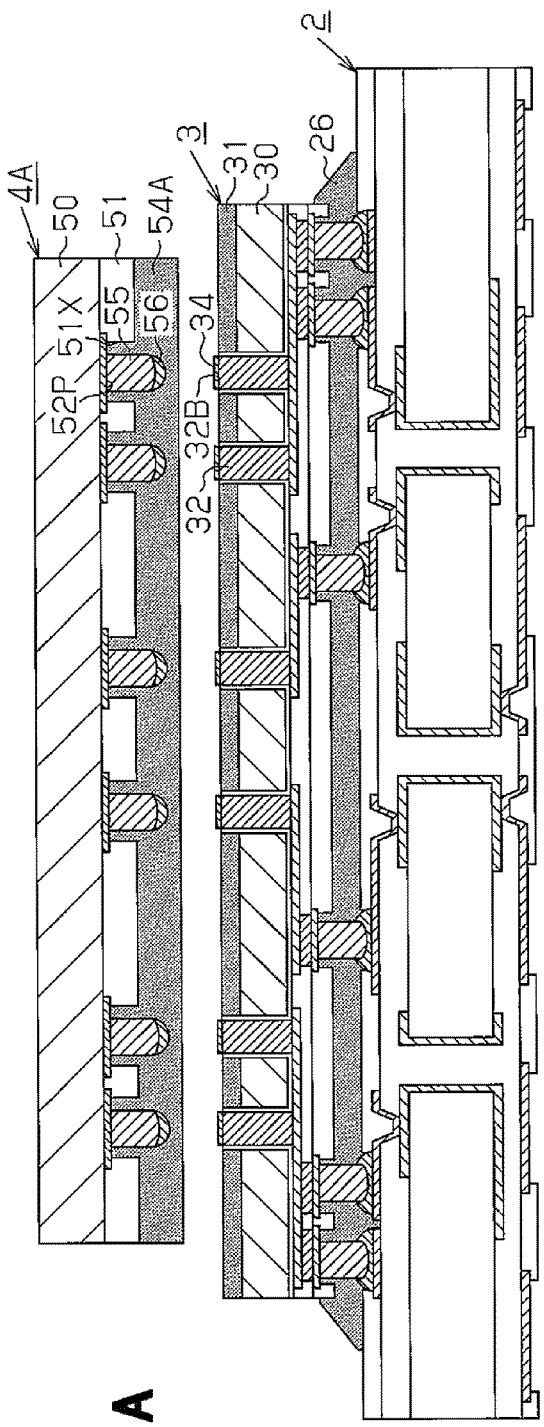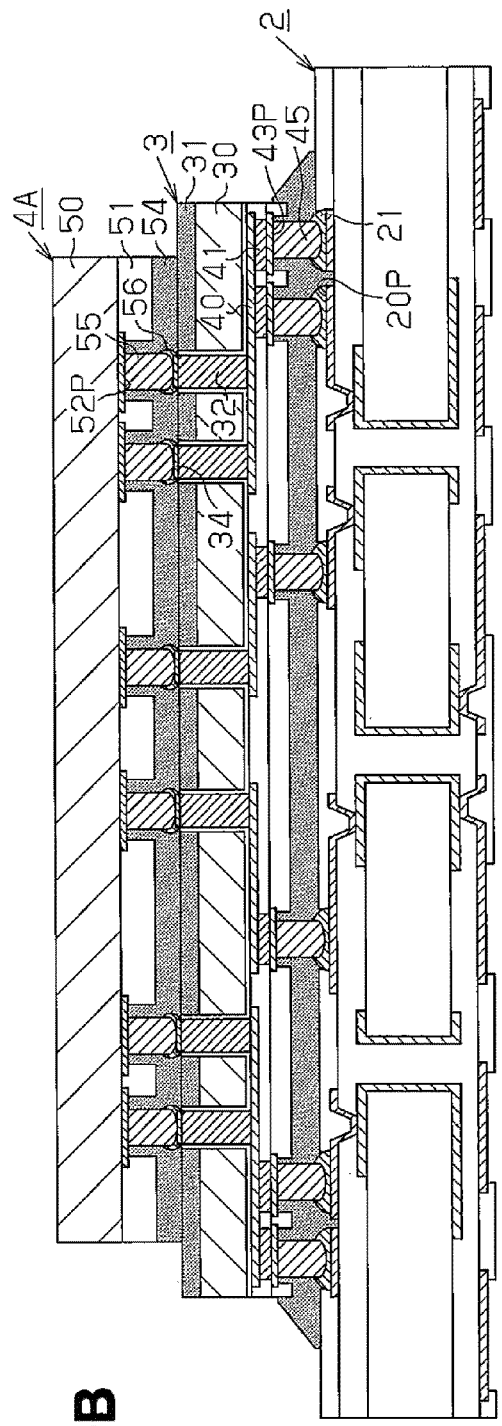

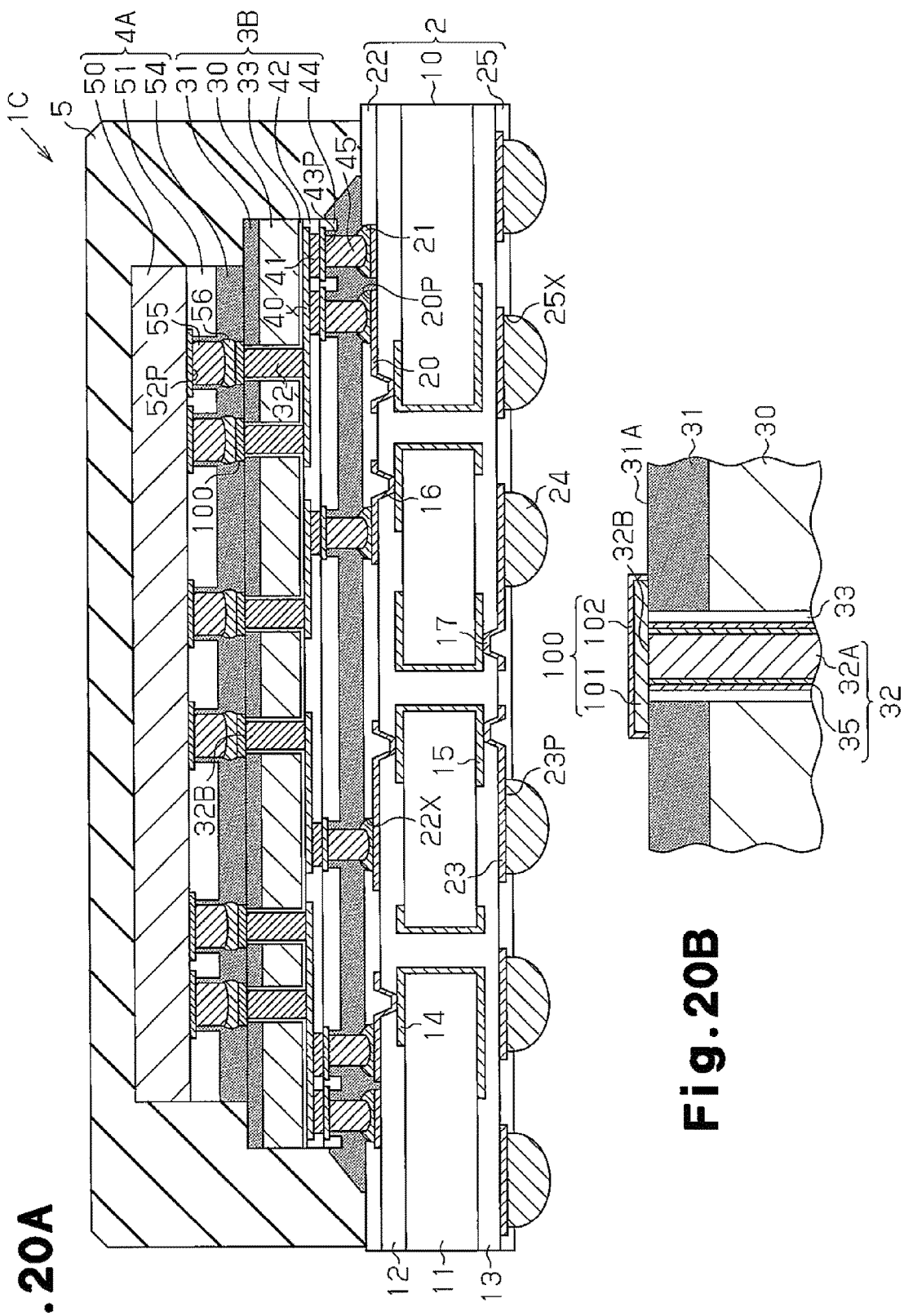

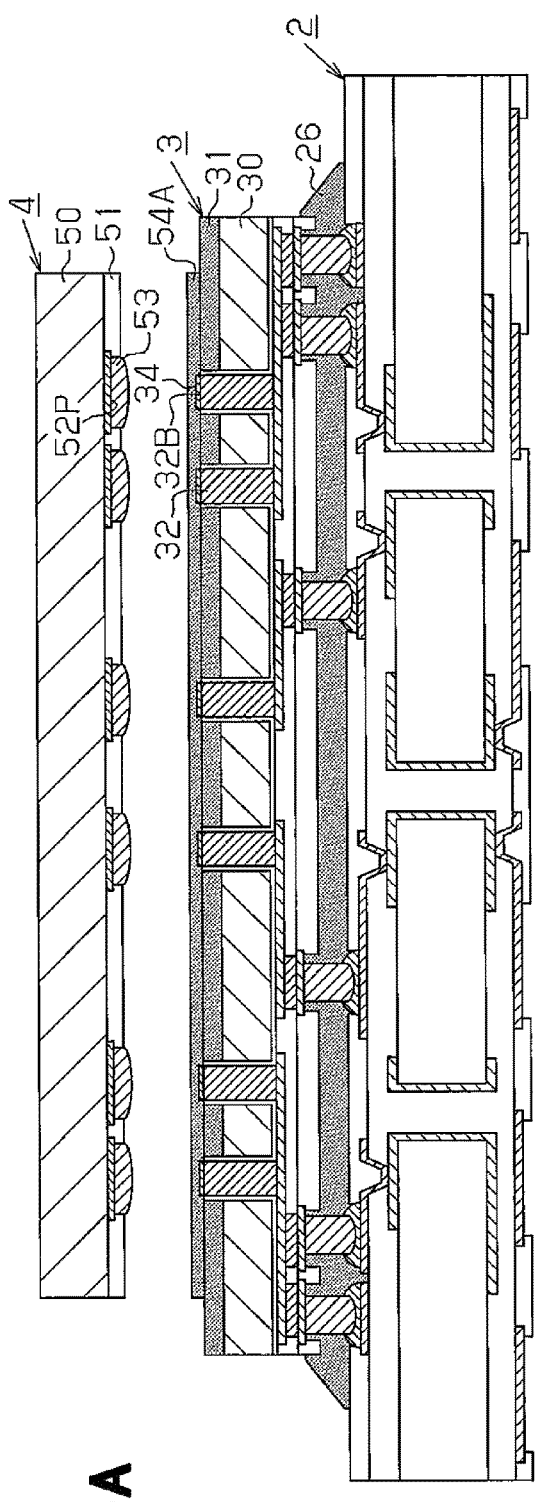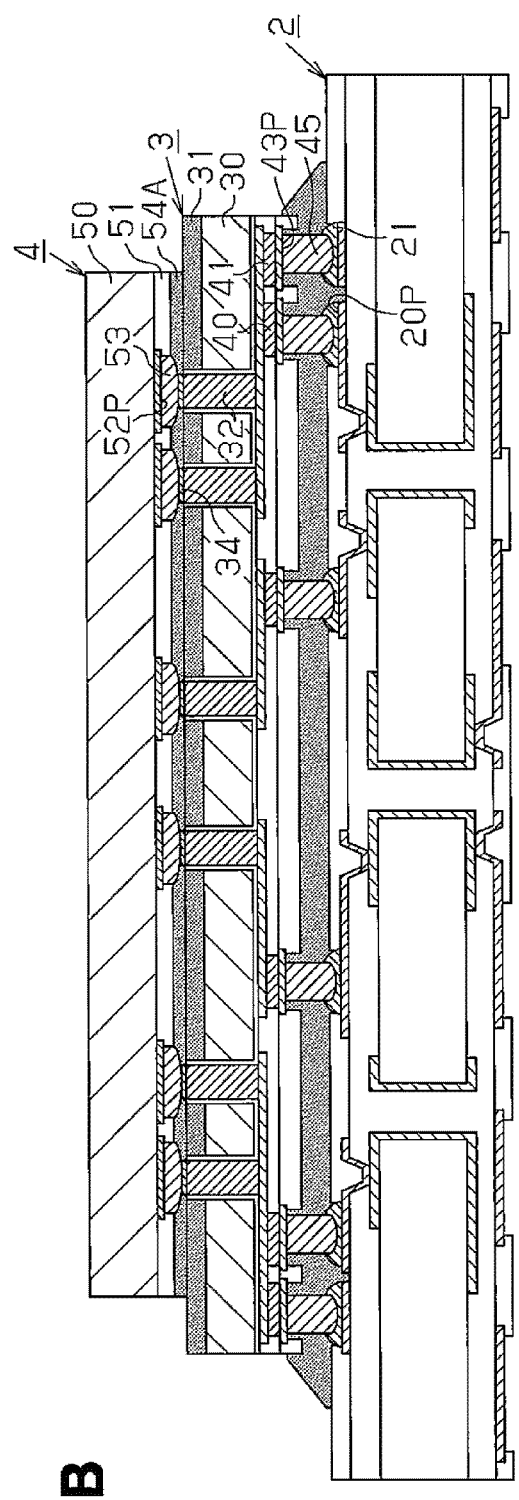
Fig.50A
Fig.50B

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from prior Japanese Patent Application Nos. 2013-037899 filed on Feb. 27, 2013 and 2013-217624 filed on Oct. 18, 2013, the entire contents of which are incorporated herein by reference.

FIELD

The present disclosure relates to a semiconductor device and a method for manufacturing a semiconductor device.

BACKGROUND

The demand for smaller and more sophisticated electronic appliances has resulted in semiconductor devices (semiconductor chips) such as ICs and LSIs used in such appliances having a higher level of integration and an increased capacity. There are also demands for packages of semiconductor chips to be smaller (thinner), include more pins, and have a higher density. To meet these demands, a system in package (SiP), in which a plurality of semiconductor chips are mounted on the same substrate, has been developed. For example, a SiP implementing a three-dimensional mounting technique for stacking semiconductor chips in a three-dimensional manner, namely, a chip-stacked package, has become popular. Such a chip-stacked package allows for high integration. In addition, since the wiring length may be reduced, circuits may operate at a higher speed and stray capacitance in wires may be reduced.

A known three-dimensional mounting technique manufactures a chip-stacked package by stacking a plurality of semiconductor chips onto a substrate and electrically connecting electrodes of the semiconductor chips to electrodes on the substrate with wire-bonded wires. However, in such a configuration in which the semiconductor chips are electrically connected to the substrate by wires, the wires are fine and thus increase the impedance. As a result, such a configuration cannot be applied to high-speed semiconductor chips. Further, there would be a need to provide a region for a wire loop in the package thereby enlarging the package in size.

Another known three-dimensional mounting technique manufactures a chip-stacked package by stacking a plurality of semiconductor chips that include through electrodes onto a substrate and electrically connecting the semiconductor chips to one another with the through electrodes (refer to, for example, Japanese Laid-Open Patent Publication No. 2006-179562). This technique allows for the wiring length to be decreased as compared to wire bonding thereby allowing for the package to be further reduced in size.

SUMMARY

However, when a plurality of semiconductor chips are stacked on the substrate, voids easily form in an underfill material that is filled between the semiconductor chips. When the stacked semiconductor chips are electrically connected to one another with the through electrodes as described above, the gaps between the semiconductor chips are extremely narrow. It is thus difficult to uniformly charge the underfill material between the semiconductor chips. Thus, voids are easily formed in the gaps. When the underfill material includes voids and the temperature of the package rises during, for example, a reflow process, the gas in the voids expands and causes cracking between the semiconductor chips. This lowers the reliability of the electrical connection between the semiconductor chips.

One aspect of the present invention is a semiconductor device including a semiconductor substrate, a first insulating layer, an insulating film, a through electrode, first connection terminal, a wiring pattern, a second insulating layer, and an electrode pad. The semiconductor substrate includes a first surface, a second surface, and a through hole extending through the semiconductor substrate from the first surface to the second surface. The first insulating layer covers the second surface of the semiconductor substrate. The first insulating layer includes an opening that is in communication with the through hole and has a diameter that is the same as that of the through hole. An insulating film covers a wall surface of the through hole and a wall surface of the opening. The through electrode is formed in the through hole and the opening that are covered by the insulating film. The through electrode includes a metal barrier layer, which covers the insulating film in the through hole and the opening, and a conductive layer, which fills the through hole and the opening and which is surrounded by the metal barrier layer. The first connection terminal includes an electroless plating metal layer that is formed on an end surface of the through electrode and on an end surface of the insulating film. The first connection terminal has a larger diameter than the through electrode. The wiring pattern and the second insulating layer are laminated on the first surface of the semiconductor substrate. The electrode pad is connected to the wiring pattern. The through electrode is connected to the wiring pattern.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The invention, together with objects and advantages thereof, may best be understood by reference to the following description of the presently preferred embodiments together with the accompanying drawings in which:

FIG. 2 is an enlarged cross-sectional view illustrating a semiconductor chip in the first embodiment;

FIGS. 3A to 3D, 4A to 4D, 5A to 5D, 6A to 6C, 7A to 7C, 8A to 8C, 9A, 9B and 10A to 10C, 11A, 11B, and 12 are schematic cross-sectional views each illustrating a method for manufacturing a semiconductor chip in the first embodiment;

FIGS. 19A and 19B are schematic cross-sectional views each illustrating a method for manufacturing a semiconductor package in a fourth embodiment;

FIG. 20A is a schematic cross-sectional view illustrating a semiconductor package in a fifth embodiment;

FIG. 20B is an enlarged cross-sectional view illustrating part of the semiconductor chip in FIG. 20A;

FIGS. 50A and 50B are schematic cross-sectional views each illustrating another method for manufacturing a semiconductor package.

DESCRIPTION OF EMBODIMENTS

Figure 1:
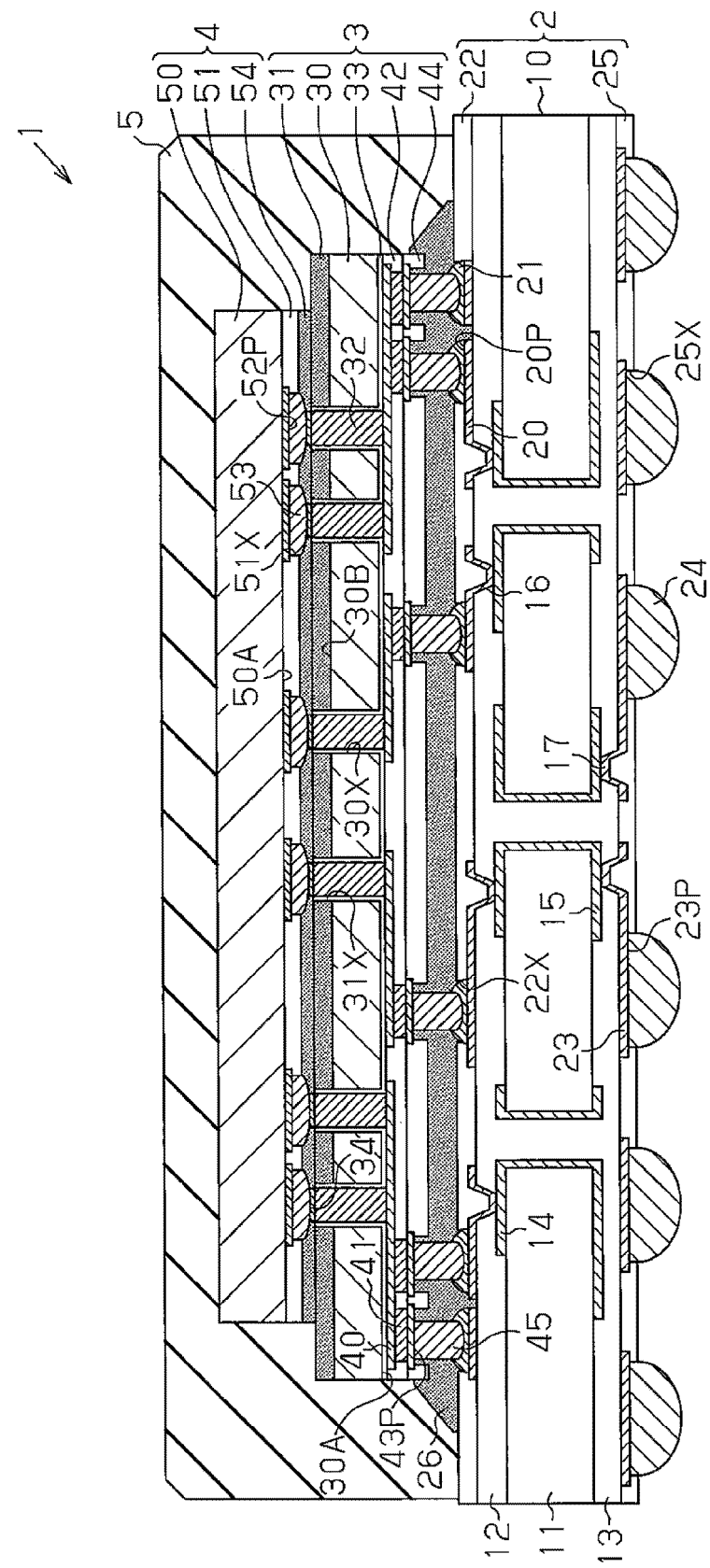
FIG. 1 is a schematic cross-sectional view illustrating a semiconductor package in a first embodiment.

Embodiments will now be described with reference to the drawings. In the drawings, elements are illustrated for simplicity and clarity and have not necessarily been drawn to scale. To facilitate understanding, hatching lines may not be illustrated in the cross-sectional drawings. Further, like or same reference numerals are given to those components that are the same or similar in all embodiments.

As illustrated in FIG. 1, a semiconductor package 1 includes a wiring substrate 2, a semiconductor chip 3 mounted on the wiring substrate 2, a semiconductor chip 4 stacked on the semiconductor chip 3, and a encapsulation resin 5 sealing the semiconductor chips 3 and 4 stacked on the wiring substrate 2. The semiconductor package 1 is a so-called chip-stacked package in which the semiconductor chips 3 and 4 are three-dimensionally stacked on the wiring substrate 2. The stacked semiconductor chip 3 may be a semiconductor chip for a logic device such as a CPU or MPU. The semiconductor chip 4 may be a semiconductor chip for a memory device such as a DRAM or SDRAM. In the description hereafter, among the two semiconductor chips stacked on the wiring substrate 2, the lower semiconductor chip 3 is also referred to as the lower chip 3, and the upper semiconductor chip 4 is also referred to as the upper chip 4.

The encapsulation resin 5 is applied to the wiring substrate 2 to seal the stacked lower chip 3 and upper chip 4. The material of the encapsulation resin 5 may be an insulating resin such as an epoxy resin or a polyimide resin. The encapsulation resin 5 may be formed from resin liquid, resin tablets, or resin powder. The encapsulation resin 5 may be applied through transfer molding, compression molding, injection molding, or potting. Alternatively, the encapsulation resin 5 may be applied for printing a paste of resin.

Next, the structure of the wiring substrate 2 will be described. The wiring substrate 2 includes a substrate body 10, a wiring pattern 20 that forms an uppermost layer, a solder resist layer 22, a wiring pattern 23 that forms a lowermost layer, and a solder resist layer 25.

The substrate body 10 includes a substrate core 11, a plurality of insulating layers 12 and 13 laminated on the substrate core 11, and wires 14 and 15 and vias 16 and 17 that are formed on the insulating layers 12 and 13. The wires 14 and 15 and the vias 16 and 17 on the substrate body 10 are electrically connected to the wiring pattern 20 and the wiring pattern 23. The material of the wires 14 and 15 and the vias 16 and 17 may be copper (Cu). The material of the insulating layers 12 and 13 may be an insulating resin such as an epoxy resin or a polyimide resin.

The wiring pattern 20 is provided on the mounting surface side (in FIG. 1, upper side) on which the lower chip 3 and the upper chip 4 are mounted. The wiring pattern 20 includes an electrode pad 20P. The material of the wiring pattern 20 may be copper.

A connection terminal 21 is formed on each electrode pad 20P. The connection terminal 21 may be a pre-solder or a surface-treated layer. The material of the pre-solder may be an eutectic solder or a lead (Pb)-free solder (an Sn—Ag alloy, an Sn—Cu alloy, an Sn—Ag—Cu alloy, or the like). Examples of the surface-treated layer include an Sn layer, a gold (Au) layer, a nickel (Ni) layer/Au layer (metal layer formed by laminating an Ni layer and an Au layer in this order), an Ni layer/palladium (Pd) layer/Au layer (metal layer formed by laminating a Ni layer, a Pd layer, and an Au layer in this order), and a Pd layer/Au layer (metal layer formed by laminating a Pd layer and an Au layer in this order). Each of the Sn layer, the Ni layer, the Au layer, and the Pd layer may be a metal layer (electroless plating metal layer) formed through electroless plating. The Sn layer is a metal layer made of Sn or Sn alloy, the Au layer is a metal layer made of Au or Au alloy, the Ni layer is a metal layer made of Ni or Ni alloy, and the Pd layer is a metal layer made of Pd or Pd alloy. The electrode pad 20P may be subjected to an anti-oxidizing treatment such as an organic solderability preservative (OSP) treatment to form a surface-treated layer (connection terminal 21).

The solder resist layer 22 is located at the upper side of the substrate body 10 to cover part of the wiring pattern 20. The solder resist layer 22 has a plurality of openings 22X. Part of the wiring pattern 20 exposed from each of the openings 22X functions as the electrode pad 20P. The material of the solder resist layer 22 may be an insulating resin such as epoxy resin.

The wiring pattern 23 is located at the lower side of the substrate body 10. The wiring pattern 23 includes a plurality of external connection pads 23P. Each of the external connection pads 23P includes an external connection terminal 24 for mounting the wiring substrate 2 on a mounting board such as a motherboard. Each external connection terminal 24 may be a solder ball or a lead pin. The external connection pads 23P are formed by exposing portions of the wiring pattern 23 from openings 25X in the solder resist layer 25 formed at the lower side of the substrate body 10. The material of the wiring pattern 23 may be copper. The wiring pattern 23 may be formed by applying a certain plating (for example, nickel plating or gold plating) to the surface of a copper layer. The material of the solder resist layer 25 may be an insulating resin such as an epoxy resin.

An insulating layer 26 is formed between the wiring substrate 2 and the lower chip 3, which is mounted on the wiring substrate 2. The insulating layer 26 increases the strength of the connection between the electrode pads 20P on the wiring substrate 2 and connection terminals 45 on the lower chip 3. Further, the insulating layer 26 suppresses the corrosion of the wiring pattern 20 and the occurrence of electromigration and thereby maintains the reliability of the wiring pattern 20. The material of the insulating layer 26 may be an insulating resin such as an epoxy resin and a polyimide resin. For example, the material of the insulating layer 26 may be an adhesive sheet of insulating resin, such as a non-conductive film (NCF), or a paste of insulating resin, such as a non-conductive paste (NCP). The material of the insulating layer 26 may be a build-up resin (filler-containing epoxy resin) or a crystal polymer liquid. The material of the insulating layer 26 may be an adhesive sheet of anisotropic conductive resin, such as an anisotropic conductive film (ACF), or a paste of anisotropic conductive resin, such as anisotropic conductive paste (ACP). Here, ACP and ACF are resins that are formed by dispersing small pellets of resin coated with Ni/Au in an insulating resin of which the base is an epoxy resin or a cyanate ester resin. Further, ACP and ACF are conductive in the vertical direction and insulative in the horizontal direction. The thickness of the insulating layer 26 is, for example, about 10 to 100 μm.

In this manner, in the semiconductor package 1 of the present embodiment, the wiring substrate 2 functions as an interposer connecting the semiconductor chips 3 and 4 to a mounting board (not illustrated) such as a motherboard. The wiring substrate 2 only needs to have a structure that electrically connects the wiring patterns 20 and 23, which are outermost layers, through the inside of the board. Thus, there is no limit to the structure of layers inward from the wiring pattern 20 and 23. For example, a wiring layer does not have to be formed in the substrate. Instead of a cored build-up substrate including the substrate core 11, the substrate body 10 may be a coreless substrate that does not include the substrate core 11

Next, the structure of the lower chip 3 will be described. The lower chip 3 includes a semiconductor substrate 30, an insulating layer 31, a plurality of through electrodes 32, an insulating film 33, a wiring pattern 40, vias 41, an insulating layer 42 (second insulating layer), electrode pads 43P, a protective film 44, and connection terminals 45. The lower chip 3 is flip-chip bonded to the wiring substrate 2.

In the semiconductor substrate 30, a semiconductor integrated circuit (not illustrated) is formed on the side of a first surface 30A (lower surface in FIG. 1). The semiconductor integrated circuit includes a diffusion layer (not illustrated) formed on the semiconductor substrate 30, an insulating layer laminated on the semiconductor substrate 30, and vias and wiring arranged in the laminated insulating layer. A plurality of through holes 30X extending from the first surface 30A to a second surface 30B (upper surface in FIG. 1) of the semiconductor substrate 30 are formed in the semiconductor substrate 30 at certain locations. The material of the semiconductor substrate 30 may be silicon (Si). The thickness of the semiconductor substrate 30 is, for example, about 10 to 200 μm. The semiconductor substrate 30 is, for example, a fragment of a thinned Si wafer.

The insulating layer 31 (first insulating layer) is formed to cover the second surface 30B (surface on which the upper chip 4 is stacked) of the semiconductor substrate 30. The insulating layer 31 includes a plurality of openings 31X opposing the through holes 30X. Each opening 31X has substantially the same diameter as the diameter of the corresponding through hole 30X and is in communication with the corresponding through hole 30X.

The material of the insulating layer 31 may be an insulating resin such as an epoxy resin or a polyimide resin. For example, the material of the insulating layer 31 may be an adhesive sheet of insulating resin (for example, NCF), a paste of insulating resin (for example, NCP), a build-up resin (filler-containing epoxy resin), or a crystal polymer liquid. The thickness of the insulating layer 31 is, for example, about 0.1 to 50 μm.

The insulating film 33 is formed to cover the first surface 30A of the semiconductor substrate 30, the wall surfaces of the through holes 30X, and the wall surfaces of the openings 31X. The insulating film 33 may be an inorganic insulating film made of SiN or $SiO_2$. The thickness of the insulating film 33 is, for example, about 0.1 to 1.0 μm.

Each of the through electrodes 32 fills the through hole 30X and the opening 31X that are covered by the insulating film 33. The lower end surfaces of the through electrodes 32 are substantially flush with the insulating film 33 at the side of the first surface 30A of the semiconductor substrate 30. The lower end surfaces of the through electrodes 32 are electrically connected to the wiring pattern 40.

As illustrated in FIG. 2, the insulating layer 31 includes a contact surface in contact with the second surface 30B of the semiconductor substrate 30 and an outer surface (also referred to as first surface 31A) on the opposite side of the contact surface. Upper end surfaces (first end surfaces) 32B of the through electrodes 32 are substantially flush with the first surface 31A of the insulating layer 31. When the upper chip 4 is stacked on the lower chip 3, the upper end surfaces 32B of the through electrodes 32 function as pads of the lower chip 3. For example, each through electrode 32 is cylindrical and has a diameter about 5 to 20 μm. For example, the through electrodes 32 have a pitch about 20 to 200 μm.

A connection terminal 34 is formed on each upper end surface 32B of the through electrodes 32. The connection terminal 34 may be an Sn layer, a Ni layer/Sn layer, an Au layer, a Ni layer/Au layer (a metal layer formed by laminating a Ni layer and an Au layer in this order), a Pd layer/Au layer (a metal layer formed by laminating a Pd layer and an Au layer in this order), or a Ni layer/Pd layer/Au layer (a metal layer formed by laminating a Ni layer, a Pd layer, and an Au layer in this order). Each of the Sn layer, the Ni layer, the Au layer, and the Pd layer may be a metal layer (electroless plating metal layer) formed through electroless plating. When the connection terminal 34 is the Ni layer/Au layer, for example, the Ni layer has a thickness of about 0.1 to 5.0 μm, and the Au layer has a thickness of about 0.001 to 1.0 μm. When the connection terminal 34 is the Ni layer/Pd layer/Au layer, for example, the Ni layer has a thickness of about 0.1 to 5.0 μm, the Pd layer has a thickness of about 0.01 to 0.3 μm, and Au layer has a thickness of about 0.001 to 1.0 μm.

In a space including the through hole 30X and the opening 31X, in which the through electrode 32 is formed, the insulating film 33 is formed to entirely cover the wall surface of the through hole 30X and the wall surface of the opening 31X. A seed layer 35 entirely covers the wall surface of the insulating film 33 in the through hole 30X and the opening 31X. In the illustrated example, the seed layer 35 may be a laminated body formed by a metal film 36 made of tantalum nitride (TaN) and a metal film 37 that is laminated on the inner side of the metal film 36 and is made of copper (Cu). A conductive layer 32A is filled into the through hole 30X and the opening 31X at the inner side of the seed layer 35 (metal film 37). The conductive layer 32A and the seed layer 35 (the metal film 36 and the metal film 37) form the through electrode 32. The outer metal film 36 forming the seed layer 35 is a metal barrier layer for preventing copper from diffusing from the inner metal film 37(Cu film) or the conductive layer 32A to the insulating film 33. The material of the metal barrier layer, that is, the metal film 36 is not limited to TaN, and may be tantalum (Ta), chromium (Cr), or titanium (Ti). The material of the conductive layer 32A may be copper or a copper alloy.

The wiring pattern 40 is formed on the lower surface of the insulating film 33 that covers the first surface 30A of the semiconductor substrate 30. A first end of the wiring pattern 40 is connected to the lower end surfaces of the through electrodes 32, and a second end of the wiring pattern 40 is connected to the electrode pads 43P through the vias 41. That is, the wiring pattern 40 and the vias 41 electrically connect the through electrodes 32 to the electrode pads 43P. The materials for the wiring pattern 40 and the vias 41 may be copper or copper alloy.

The insulating layer 42 is formed to cover the wiring pattern 40. Openings 42X for exposing portions of the wiring pattern 40 are formed in the insulating layer 42 at certain locations. The vias 41 are formed in the openings 42X. The material of the insulating layer 42 may be a low-dielectric material having a low dielectric constant (so-called Low-k material). Examples of the low-dielectric material include SiOC, SiOF, and organic polymers. The dielectric constant of the insulating layer 42 is, for example, about 3.0 to 3.5. The thickness of the insulating layer 42 is, for example, about 0.5 to 2 μm.

A wiring layer 43 is formed on the lower surface of each vias 41. The shape of the wiring layers 43 as viewed from above is larger than that of the via 41. The material of the wiring layers 43 may be aluminum (Al). The material of the wiring layers 43 may be a Cu/Al alloy or a Cu/Al/Si alloy.

The protective film 44 is formed on the lower surface of the insulating layer 42 to cover the lower surface of the insulating layer 42 and portions of the wiring layer 43. The protective film 44 has a plurality of openings 44X for exposing portions of the wiring layer 43 as the electrode pads 43P. The protective film 44 serves to protect the semiconductor integrated circuit (not illustrated) formed at the side of the first surface 30A of the semiconductor substrate 30 and is also referred to as a passivation film. The protective film 44 may be an SiN film or a PSG film. The protective film 44 may be a laminated body formed by laminating a polyimide layer on the SiN film or the PSG film.

The connection terminals 45 are formed on the respective electrode pads 43P. The connection terminals 45 are electrically connected to the through electrodes 32 and the semiconductor integrated circuit (not illustrated). Each connection terminal 45 is a cylindrical connection bump extending downward from the lower surface of the electrode pad 43P. The connection terminals 45 are located at positions corresponding to the electrode pads 20P of the wiring substrate 2. When the lower chip 3 is mounted on the wiring substrate 2 as illustrated in FIG. 1, the connection terminals 45 are electrically connected to the corresponding electrode pads 20P. The height of the connection terminals 45 is, for example, about 20 to 40 μm. The diameter of the connection terminals 45 is, for example, about 10 to 40 μm. The material of the connection terminals 45 may be copper.

As illustrated in FIG. 2, a metal layer 46 is formed on the lower surface of each connection terminal 45. The metal layer 46 may be an Au layer, a Ni layer/Au layer (a metal layer formed by laminating a Ni layer and an Au layer in this order), a Pd layer/Au layer (a metal layer formed by laminating a Pd layer and an Au layer in this order), or a Ni layer/Pd layer/Au layer (a metal layer formed by laminating a Ni layer, a Pd layer, and an Au layer in this order). The metal layer 46 may be a lead-free solder (for example, Sn—Ag-based) plated layer.

Next, the structure of the upper chip 4 will be described with reference to FIG. 1.

The upper chip 4 includes a semiconductor substrate 50, a protective film 51, electrode pads 52P, connection terminals 53, and an insulating layer 54. The upper chip 4 is flip-chip bonded to the lower chip 3.

A semiconductor integrated circuit (not illustrated) is formed on the side of a first surface 50A (lower surface in FIG. 1) of the semiconductor substrate 50. The semiconductor integrated circuit has a diffusion layer formed on the semiconductor substrate 50, a laminated insulating layer on the semiconductor substrate 50, and vias and wiring that are arranged in the laminated insulating layer. The material of the semiconductor substrate 50 may be silicon (Si). The thickness of the semiconductor substrate 50 is, for example, about 30 to 200 μm. The semiconductor substrate 50 is, for example, a fragment of a thinned Si wafer.

The protective film 51 is formed to cover the first surface 50A of the semiconductor substrate 50. The protective film 51 has a plurality of openings 51X exposing the electrode pads 52P. The protective film 51 serves to protect the semiconductor integrated circuit (not illustrated) formed at the side of the first surface 50A of the semiconductor substrate 50, and is also referred to as the passivation film. The protective film 51 may be an SiN film or a PSG film. The protective film 51 may be a laminated film formed by laminating a polyimide layer on a layer made of an SiN film or PSG film.

The electrode pads 52P are electrically connected to the semiconductor integrated circuit (not illustrated). The electrode pads 52P are located at positions corresponding to the through electrodes 32 of the lower chip 3. When the upper chip 4 is stacked on the lower chip 3 as illustrated in FIG. 1, the electrode pads 52P are electrically connected to the corresponding through electrodes 32 (connection terminals 34). Further, the electrode pads 52P are electrically connected to the respective electrode pads 20P on the wiring substrate 2 by the through electrodes 32. The electrode pads 52P are formed when exposed from the openings 51X in the protective film 51. The material of the electrode pads 52P may be aluminum (Al). The material of the electrode pads 52P may be Cu/Al alloy or Cu/Al/Si alloy.

The connection terminals 53 are formed on the corresponding electrode pads 52P. The connection terminals 53 are electrically connected to the semiconductor integrated circuit (not illustrated) through the electrode pads 52P. When the upper chip 4 is stacked on the lower chip 3 as illustrated in FIG. 1, the connection terminals 53 are electrically connected to the corresponding through electrodes 32 by the connection terminals 34 of the semiconductor chip 3. As described above, the lower chip 3 is electrically connected to the upper chip 4 by the through electrodes 32 formed in the lower chip 3.

The connection terminal 53 may be a Ni layer/Au layer/Sn layer (a metal layer formed by laminating a Ni layer, an Au layer, and an Sn layer in this order) or Ni layer/Pd layer/Au layer/Sn layer (a metal layer formed by laminating a Ni layer, a Pd layer, an Au layer, and an Sn layer in this order), which is formed by Al zincate or electroless plating. The connection terminal 53 may be a Ni layer/Au layer (a metal layer formed by laminating a Ni layer and an Au layer in this order), a Ni layer/Pd layer/Au layer (a metal layer formed by laminating a Ni layer, a Pd layer, and an Au layer in this order), a Ni/Sn layer (a metal layer formed by laminating a Ni layer and an Sn layer in this order), which is formed by Al zincate or electroless plating. Like the connection terminal 45 and the metal layer 46 of the lower chip 3, the connection terminal 53 may be a solder layer formed on the cylindrical connection bump, or a laminated body of a cylindrical connection bump, a Ni layer and a solder layer. In this case, the material of the connection bump may be a Cu layer, and the material of the solder layer may be a lead-free solder (for example, Sn-2.5 Ag).

When the upper chip 4 is stacked on the lower chip 3, the insulating layer 54 is formed on the lower surface of the protective film 51 to cover the connection terminals 53 of the upper chip 4 and the connection terminals 34 and the through electrodes 32 of the lower chip 3. The insulating layer 54 increases the strength connecting the connection terminals 34 of the lower chip 3 and the connection terminals 53 of the upper chip 4, suppresses corrosion of the through electrodes 32 and the occurrence of electromigration, and maintains the reliability of the through electrodes 32. The material of the insulating layer 54 is made of the same insulating resin as that of the insulating layer 31 formed as the uppermost layer of the lower chip 3, that is, the insulating layer 31 in contact with the insulating layer 54 when the upper chip 4 is stacked on the lower chip 3 or an insulating resin that is differs from the insulating layer 31. For example, when the insulating layer 54 and the insulating layer 31 are made of the same insulating resin, the material of the insulating layer 54 may be an insulating resin such as an epoxy resin or a polyimide resin. For example, the material of the insulating layer 54 may be an adhesive sheet of insulating resin (for example, NCF), a paste of insulating resin (for example, NCP), a build-up resin (filler-containing epoxy resin), or a crystal polymer liquid. The material of the insulating layer 54 may be an adhesive sheet of anisotropic conductive resin (for example, ACF) or a paste of anisotropic conductive resin (for example, ACP). The thickness of the insulating layer 54 is, for example, about 5 to 15 µm.

In the lower chip 3, the upper end surfaces of the through electrodes 32 are substantially flush with the first surface 31A of the insulating layer 31 at the side of the second surface 30B of the semiconductor substrate 30. Thus, the upper surface of the lower chip 3 (that is, the lower surface in a gap between the stacked lower chip 3 and upper chip 4) are flat surfaces. In the present embodiment, the insulating layer 54 of the upper chip 4 corresponds to an underfill material. Since the upper surface of the insulating layer 31 of the lower chip 3, which is in contact with the insulating layer 54, is a flat surface, when the insulating layer 54 is adhered to the insulating layer 31, voids do not form in the interface between the insulating layers and the adhesion of the two insulating layers is satisfactory.

When the upper chip 4 is not provided with the insulating layer 54, after the upper chip 4 is mounted on the lower chip 3, the underfill material is filled between the lower chip 3 and the upper chip 4. Here, since the upper surface of the insulating layer 31 of the lower chip 3 is flat as described above, the flowability of the underfill material filled between the lower chip 3 and the upper chip 4 is enhanced to improve the filling property of the underfill material.

Next, a method for manufacturing the semiconductor package 1 will be described.

First, a method for manufacturing the lower chip 3 will be described with reference to FIGS. 3 to 8. Although the drawings illustrate a single enlarged chip, the lower chip 3 is manufactured from a wafer. Thus, a batch of lower chips is manufactured from a single wafer, and the lower chips are then separated from one another. Here, a method for manufacturing a semiconductor integrated circuit will not be described.

Figure 3A:
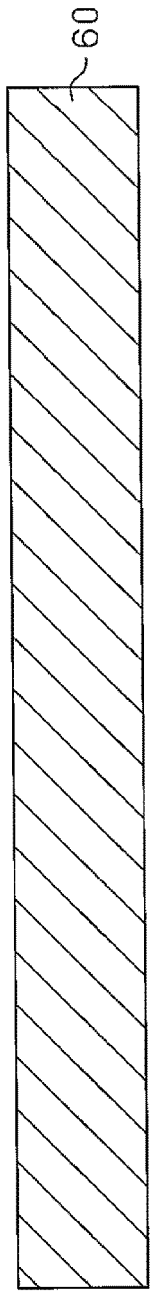

In the step illustrated in FIG. 3A, a base material for manufacturing the semiconductor substrate 30, that is, a substrate 60, is prepared. The substrate 60 is thicker than the semiconductor substrate 30 (for example, about 725 to 775 µm). The substrate 60 may be a silicon substrate.

Figure 3B:
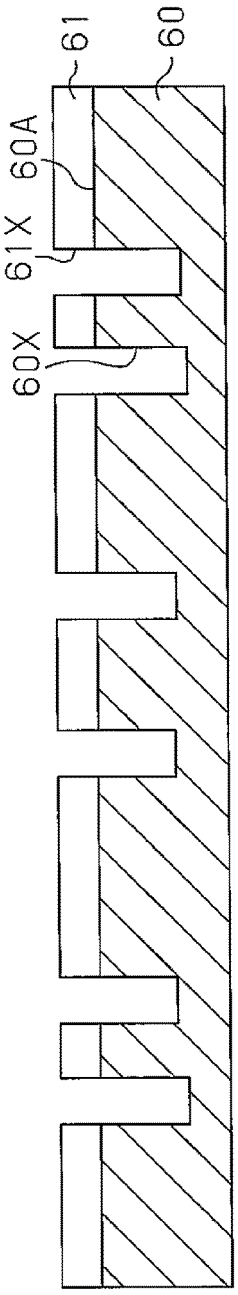

Next, in the step illustrated in FIG. 3B, a resist layer 61 including openings 61X is formed in a first surface 60A of the substrate 60. The openings 61X are formed to expose the first surface 60A of the substrate 60 at portions corresponding to where the through holes 30X (refer to FIG. 1) are formed.

Subsequently, using the resist layer 61 as a mask, grooves 60X are formed in the substrate 60 by anisotropic etching such as deep reactive ion etching (DRIE). The grooves 60X are formed halfway through the substrate 60 from the first surface 60A. When the substrate 60 is thinned in a step described later and illustrated in FIG. 7A, the grooves 60X become the through holes 30X. Accordingly, the grooves 60X are formed to be deeper than the through holes 30X. The grooves 60X formed in the step in FIG. 3B may vary in depth. After the formation of the grooves 60X, the resist layer 61 illustrated in FIG. 3B is removed by performing ashing or the like.

Figure 3C:
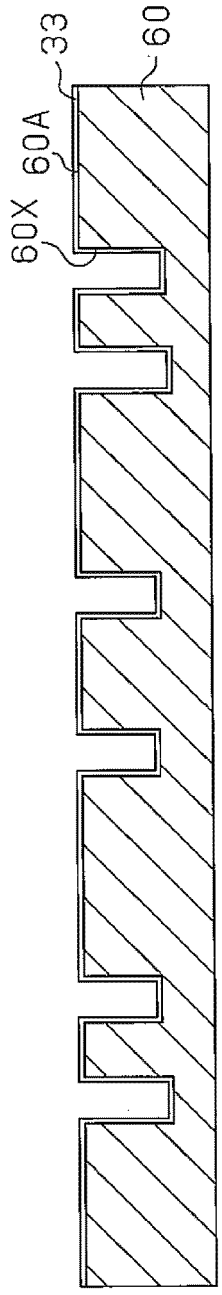

Next, in the step illustrated in FIG. 3C, the insulating film 33 is formed to cover the first surface 60A of the substrate 60 and the wall surfaces of the grooves 60X. When the substrate 60 is a silicon substrate, the insulating film 33 may be formed by thermally oxidizing the substrate 60. The insulating film 33 may be formed by CVD, for example.

Figure 3D:
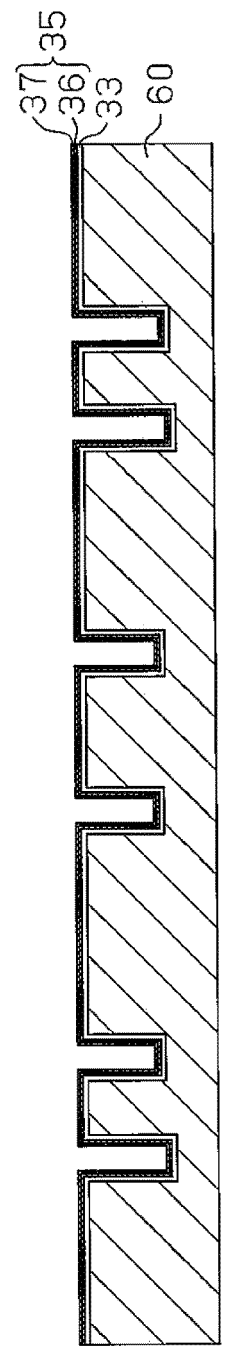

Subsequently, in the step illustrated in FIG. 3D, the seed layer 35 is formed to cover the insulating film 33. The seed layer 35 may be formed by performing sputtering or electroless plating. For example, tantalum nitride (TaN) is deposited to cover the insulating film 33 by performing sputtering thereby forming the metal film 36. Then, copper is deposited on the metal film 36 by performing sputtering to form the metal film 37. This forms the two-layered (TaN/Cu) seed layer 35 is formed. The metal film 36 may have a thickness of about 0.1 µm, and the metal film 37 may have a thickness of about 0.2 µm.

Figure 4A:
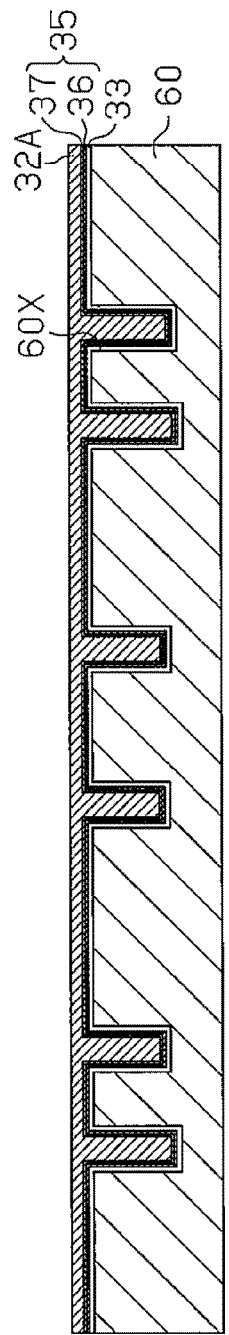

Next, in the step illustrated in FIG. 4A, the conductive layer 32A is formed on the seed layer 35 by performing electrolytic copper plating using the seed layer 35 as a power feeding layer. The conductive layer 32A fills the grooves 60X covered by the insulating film 33 and the seed layer 35. The conductive layer 32A may be formed by embedding, for example, conductive paste, melted metal, or a metal wire into the grooves 60X.

Figure 4B:
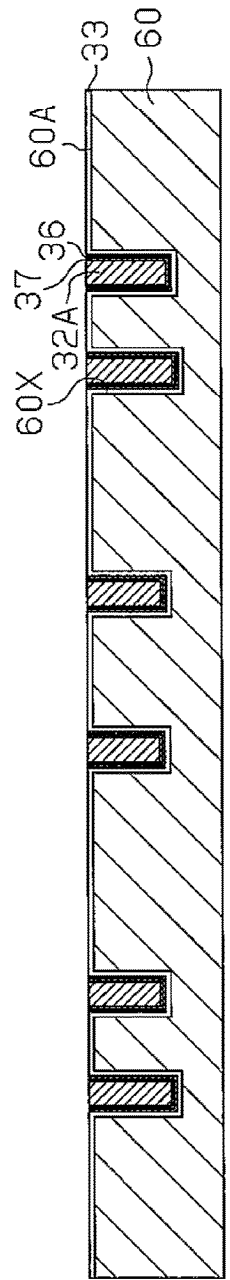

Next, in the step illustrated in FIG. 4B, the conductive layer 32A and the seed layer 35, which are surplus, are polished and removed, for example, with a chemical mechanical polishing (CMP) device. The polishing is performed, for example, until the insulating film 33 formed on the first surface 60A of the substrate 60 is exposed.

Figure 4C:
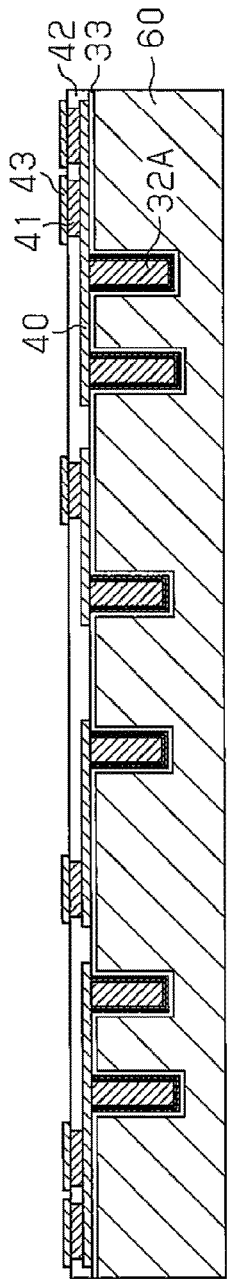

Next, in the step illustrated in FIG. 4C, the wiring pattern 40, the insulating layer 42, the vias 41, and the wiring layers 43 are laminated on the upper side of the structure illustrated in FIG. 4B through any known method.

Figure 4D:
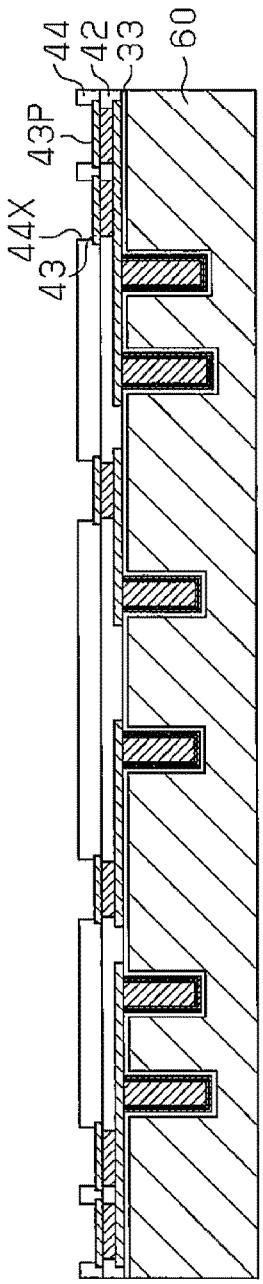

Subsequently, in the step illustrated in FIG. 4D, the protective film 44 including the openings 44X, from which only the electrode pads 43P formed on portions of the wiring layers 43 are exposed, is formed on the insulating layer 42 and the wiring layers 43. The protective film 44 may be obtained by forming the protective film 44 for covering the insulating layer 42 and the wiring layers 43 through CVD, forming a resist layer, which exposes portions where the openings 44X are formed, on the protective film 44, and then removing the exposed portions of the protective film 44 by performing dry etching using the resist layer as a mask.

Next, in the step illustrated in FIG. 5A, a seed layer 64 is formed to cover the upper surface of the protective film 44, the wall surfaces of the openings 44X, and the upper surfaces of the electrode pads 43P exposed from the openings 44X. The seed layer 64 may be formed by performing sputtering or electroless plating. For example, titanium (Ti) is deposited to form a Ti film 65 by performing sputtering to cover the upper surface of the protective film 44, the wall surfaces of the openings 44X, and the upper surfaces of the electrode pads 43P. Then, copper is deposited on the Ti film 65 by performing sputtering to form a Cu film 66. This forms the two-layered (Ti/Cu) seed layer 64. The thickness of the Ti film 65 is, for example, about 0.1 μm, and the thickness of the Cu film 66 is, for example, about 0.2 μm. The lower Ti film 65 of the seed layer 64 is a metal layer for increasing the adhesiveness between the lower protective film 44 and the upper Cu film 66. The material of the metal layer that functions as an adhering layer may be Ti or chromium (Cr).

Next, in the step illustrated in FIG. 5B, a resist layer 67 including openings 67X is formed on the seed layer 64. The openings 67X are formed to expose portions of the upper surface of the seed layer 64 corresponding to where the connection terminals 45 and the metal layers 46 are formed on the electrode pads 43P (refer to FIG. 2). The material of the resist layer 67 may be a photosensitive dry film or liquid photoresist (liquid resist of novolac resin, epoxy resin, or the like). When the dry film is used, a dry film is laminated on the seed layer 64 by performing thermocompression, and the dry film is patterned through exposure and development to form the resist layer 67 having the predetermined pattern of openings 67X corresponding to the connection terminals 45. Also, when the liquid photoresist is used, the resist layer 67 may be formed in a similar step.

Subsequently, in the step illustrated in FIG. 5C, using the resist layer 67 as a plating mask, the seed layer 64 is subjected to electrolytic plating using the seed layer 64 as a plating power-feeding layer. For example, by applying electrolytic plating to the upper surface of the seed layer 64 exposed from the openings 67X of the resist layer 67, a Cu layer 68 that becomes the connection terminal 45 and a metal layer 69 that becomes the metal layer 46 are sequentially formed in each opening 67X. For example, the cylindrical Cu layer 68 is formed on the seed layer 64 by performing electrolytic plating using the seed layer 64 as the plating power-feeding layer. Next, when the metal layer 69 is a lead-free solder (for example, Sn—Ag-based) plated layer, an Sn—Ag solder layer is adhered to the Cu layer 68 by performing electrolytic solder plating using the seed layer 64 as a plating power-feeding layer.

Next, in the step illustrated in FIG. 5D, the resist layer 67 illustrated in FIG. 5C is removed by performing ashing or the like. Subsequently, using the Cu layer 68 and the solder layer 69 as masks, unnecessary portions of the seed layer (the Ti film 65 and the Cu film 66) are etched and removed. As a result, remaining portions of the seed layer (the Ti film 65 and the Cu film 66) and the Cu layer 68 form the connection terminals 45.

Next, in the step illustrated in FIG. 6A, a flux is applied to the solder layer 69 illustrated in FIG. 5D and a reflow process is performed, for example, at a temperature of about 240° C. to 260° C. to melt the solder layer 69 and form the metal layers 46 electrically connected to the connection terminals 45. Then, the flux remaining around the metal layer 46 is washed away. In this step, the metal layers 46 may be formed by performing a fluxless reflow process that uses no flux.

Next, in the step illustrated in FIG. 6B, a support body 71 is adhered with an adhesive 70 to the lower surface of the structure of FIG. 6A that has been flipped upside down, that is, the surface where the connection terminals 45 and the metal layers 46 are formed. The material of the support body 71 may be silicon or glass.

Subsequently, in the step illustrated in FIG. 6C, a second surface 60B of the substrate 60 is polished, for example, by using a back surface polishing device to thin the substrate 60. For example, in this step, the substrate 60 is thinned from the side of the second surface 60B so as not to expose the conductive layer 32A and the insulating film 33.

When the second surface 60B of the substrate 60 is polished in this step, the circumferential edge of the wafer becomes knife-like. This may crack the wafer. Thus, the outer edge (edge) of the wafer may be trimmed before adhering the support body 71 so that the outer edge of the wafer does not become knife-like. Such edge trimming may be performed by a known dicing technique. The edge trimming may be performed after adhering the support body 71.

Next, in the step illustrated in FIG. 7A, the substrate 60 is further thinned to expose the insulating film 33. For example, portions of the substrate 60 (silicon substrate) are selectively removed from the insulating film 33. The thinning of the substrate 60 forms the through holes 30X in the substrate 60, and the substrate 60 becomes a substrate 30C corresponding to the semiconductor substrate 30 (refer to FIG. 1). The substrate 60 may be thinned by performing wet etching using a solution containing nitric acid ($HNO_3$) or hydrogen fluoride (HF) as an etching solution, or plasma etching (dry etching). In this case, since the insulating film 33 is not etched, portions of the conductive layer 32A covered by the insulating film 33 are also exposed from the substrate 30C.

Next, in the step illustrated in FIG. 7B, the insulating layer 31 is formed on the second surface 30B of the substrate 30C to cover the insulating film 33 exposed from the substrate 30C and the conductive layer 32A. For example, the insulating layer 31 may be formed by vacuum-laminating a resin film such as an epoxy resin to cover the second surface 30B of the substrate 30C, the insulating film 33, and the conductive layer 32A, pressing (pushing) the resin film, and then curing the resin film by performing a heating process at about 150° C. to 190° C. Alternatively, the insulating layer 31 may be formed by applying a resin liquid such as an epoxy resin to cover the second surface 30B of the substrate 30C, the insulating film 33, and the conductive layer 32A, and then curing the resin by performing a heating process at about 150° C. to 190° C.

Next, in the step illustrated in FIG. 7C, the insulating layer 31, the insulating film 33, the conductive layer 32A, and the seed layer 35 are flattened so that the upper surfaces of the conductive layer 32A and the seed layer 35 are flush with the upper surface of the insulating layer 31. This exposes the upper surfaces of the conductive layer 32A and the seed layer 35 from the substrate 30C, and the openings 31X are formed in the insulating layer 31 to form the through electrodes 32 that fill the through holes 30X and the openings 31X that are covered by the insulating film 33. At this time, the wall surfaces of the openings 31X of the insulating layer 31 are entirely covered by the insulating film 33, and the through electrodes 32 are each formed by the conductive layer 32A and the seed layer 35 (the metal film 36 made of TaN and the metal film 37 made of Cu) formed between the insulating film 33 and the conductive layer 32A. The flattening methods may be grinding and/or polishing. In the present embodiment, the flattening is achieved by performing grinding with a grinding blade (tool) of tungsten carbide or diamond.

Figure 8A:
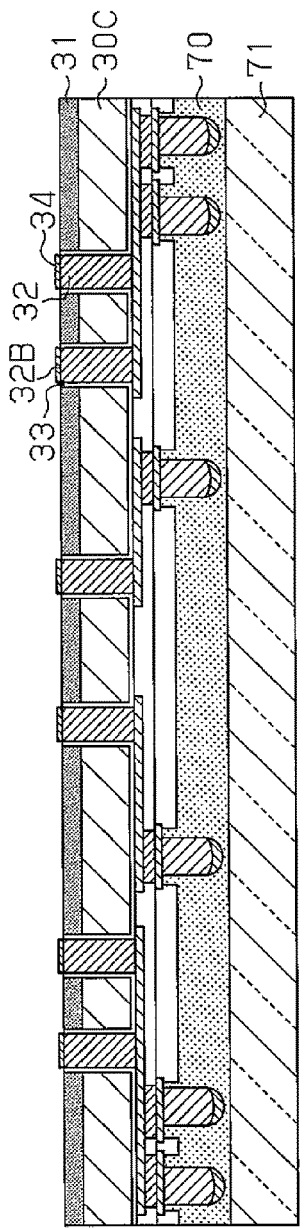

Next, in the step illustrated in FIG. 8A, the connection terminals 34 are formed on the upper end surfaces 32B of the corresponding through electrodes 32. When the connection terminal 34 is a Ni layer/Au layer, a Ni layer and an Au layer are laminated on the upper end surface 32B of the through electrode 32 in this order by performing electroless plating. This forms a structure corresponding to the lower chip 3 above the support body 71.

Figure 8B:
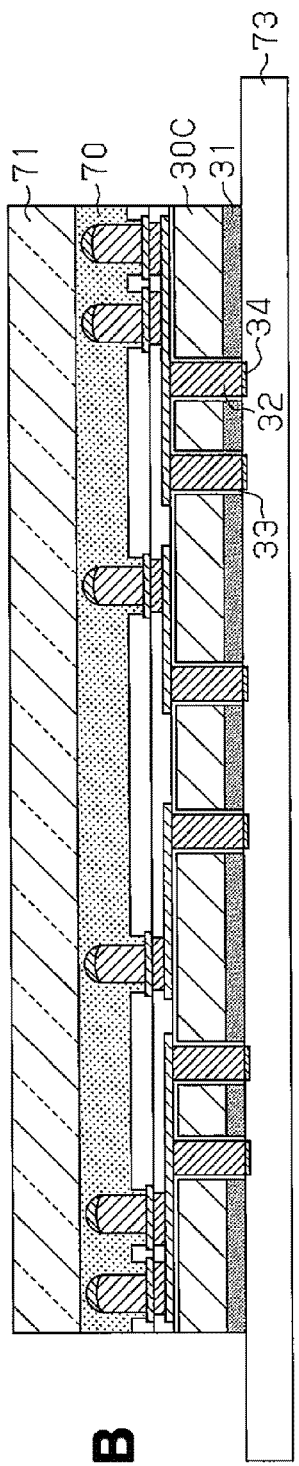
Figure 8C:
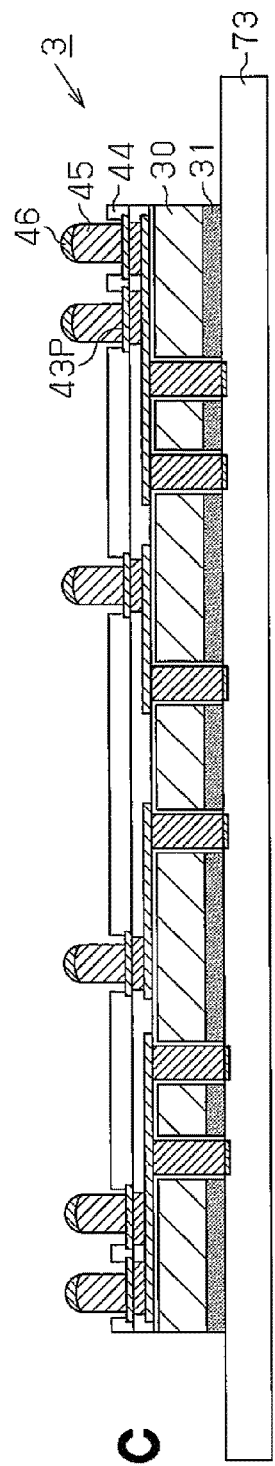

Next, in the step illustrated in FIG. 8B, the surface of the structure corresponding to the lower chip 3, on which the connection terminals 34 are formed, is adhered to a dicing tape 73 supported by a dicing frame. Subsequently, in the step illustrated in FIG. 8C, the adhesive 70 and the support body 71 in FIG. 8B are removed. Then, the wafer (substrate 30C) is cut along lines indicating the region of each chip with a blade of a dicer to obtain each lower chip 3. As a result, the substrate 30C becomes the semiconductor substrate 30. After the dicing, the lower chip 3 held on the dicing tape 73 is picked up, and the picked-up lower chip 3 is used in a next step.

Next, in the step illustrated in FIG. 9A, the wiring substrate 2 is prepared. The wiring substrate 2 may be manufactured through any known manufacturing method as will now be described with reference to FIG. 9A.

When manufacturing the wiring substrate 2, the substrate core 11 is first prepared. The substrate core 11 is produced, for example, by forming a through hole in a copper-clad laminate (CCL) and plating the wall surface of the through hole so that the two opposite surfaces are electrically connected. Then, the wires 14 and 15 are formed in a subtractive process. Next, the insulating layers 12 and 13 are formed on the two surfaces of the substrate core 11 by vacuum laminating resin films that are then heated and cured. The insulating layers 12 and 13 may be formed by applying and heating a resin. Subsequently, an opening is formed in each of the insulating layers 12 and 13, and a desmearing is performed if necessary. Then, the vias 16 and 17 and the wiring patterns 20 and 23 are formed, for example, through a semiadditive method. Next, the solder resist layers 22 and 25 are formed including the openings 22X and 25X for exposing portions of the wiring patterns 20 and 23 as the pads 20P and 23P, respectively.

Next, the connection terminal 21 is formed on the electrode pad 20P. When the connection terminal 21 is a pre-solder, solder paste made of Sn/Ag alloy is applied to the electrode pad 20P and a reflow process is performed. When the connection terminal 21 is an Sn layer (surface-treated layer), the Sn layer is formed on the electrode pad 20P by performing electroless plating. These steps allow for the wiring substrate 2 to be manufactured.

Then, the insulating layer 26A in a B-stage state (semi-cured state) is formed on the upper side of the wiring substrate 2 to cover the connection terminals 21. The thickness of the insulating layer 26A is set according to the height of the connection terminals 45 of the lower chip 3. That is, the thickness of the insulating layer 26A is set to entirely cover the surfaces of the connection terminals 45 when the lower chip 3 is mounted on the wiring substrate 2. When the material of the insulating layer 26A is a sheet of an insulating resin, the sheet of an insulating resin is laminated on the upper surface of the wiring substrate 2. However, in this step, the sheet of an insulating resin is not thermally cured and remains to be in the B-stage state. By laminating the insulating layer 26A in the vacuum atmosphere, the formation of voids in the insulating layer 26A may be prevented. When the material of the insulating layer 26A is a liquid or paste of insulating resin, the liquid or paste of insulating resin is applied to the upper surface of the wiring substrate 2, for example, by performing printing or spin coating. Then, the applied liquid or paste of insulating resin is prebaked to the B-stage state.

Next, in the step illustrated in FIG. 9A, the picked-up lower chip 3 is arranged above the wiring substrate 2 having the insulating layer 26A formed on its upper surface. For example, the surface of the wiring substrate 2 at the side of the electrode pads 20P is opposed to the surface of the lower chip 3 at the side of the electrode pads 43P so that the connection terminals 45 and the metal layers 46 are opposed to the connection terminals 21.

Subsequently, in the step illustrated in FIG. 9B, the connection terminals 45 of the lower chip 3 are flip-chip bonded to the corresponding electrode pads 20P on which the connection terminals 21 are formed. For example, the lower chip 3 is first mounted on the wiring substrate 2 with the insulating layer 26A located in between and temporarily fixed by the adhesiveness of the non-thermally cured insulating layer 26A in the B-stage state. When necessary, the lower chip 3 may be pressed toward the insulating layer 26A (wiring substrate 2). At this time, the connection terminals 45 of the lower chip 3 (and the metal layers 46 formed on the connection terminals 45) are opposed to the connection terminals 21 on the electrode pads 20P of the wiring substrate 2. For example, by applying heat at a temperature of about 240 to 260° C. and a load from the lower chip 3, the electrode pads 20P are electrically connected to the connection terminals 45. Here, when solder is used on at least the connection terminals 21 or the connection terminals 45, the solder is melted and solidified to connect the connection terminals 21 and 45. The insulating layer 26A is thermally cured by the heating. As a result, the electrode pads 20P and 43P and the connection terminals 45 are covered by the thermally cured insulating layer 26.

Next, the upper chip 4, which is stacked on the lower chip 3 flip-chip bonded to the wiring substrate 2, is prepared. A method for manufacturing the upper chip 4 will now be described with reference to FIG. 10. Although the drawings illustrate a single enlarged chip, the upper chip 4 is manufactured from a wafer. Thus, a batch of upper chips is manufactured from a single wafer, and the upper chips are then separated from one another. Here, the separating step will not be described.

In the step illustrated in FIG. 10A, the semiconductor substrate 50 including a semiconductor integrated circuit (not illustrated) and manufactured through a known method is prepared. For example, after the semiconductor substrate 50 undergoes a certain device process, the protective film 51 is formed on the first surface 50A (upper surface in FIG. 10A) on which the semiconductor integrated circuit (not illustrated) of the semiconductor substrate 50 is formed. Further, portions of the protective film 51, which correspond to the electrode pads 52P defined by portions of the large number of wiring layers formed on each device with a certain pattern, are removed. As a result, the openings 51X are formed in the protective film 51. The openings 51X may be formed by laser machining using a YAG laser, an excimer laser, or the like.

Next, in the step illustrated in FIG. 10B, the connection terminals 53 are formed on the electrode pads 52P. In this step, the aluminum surfaces of the electrode pads 52P are first subjected to a zincate treatment to apply electroless plating to the electrode pads 52P. Subsequently, if the connection terminal 53 is a Ni layer/Au layer/Sn layer, the connection terminals 53 are formed by laminating a Ni layer, and Au layer, and an Sn layer are laminated on the electrode pad 52P in this order through electroless plating.

Next, in the step illustrated in FIG. 10C, the insulating layer 54A (third insulating layer) in the B-stage state (semi-cured state) is formed on the protective film 51 to cover the connection terminals 53. When the material of the insulating layer 54A is a sheet of an insulating resin, the sheet of an insulating resin is laminated on the upper surface of the protective film 51. However, in this step, the sheet of an insulating resin is not thermally cured and remains in the B-stage state. By laminating the insulating layer 54A in a vacuum atmosphere, the formation of voids in the insulating layer 54A may be avoided. When the material of the insulating layer 54A is a liquid or paste of insulating resin, the liquid or paste of insulating resin is applied to the upper surface of the protective film 51, for example, through printing or spin coating. Then, the applied liquid or paste of insulating resin is prebaked to the B-stage state.

The above manufacturing process manufactures the upper chip 4 of the present embodiment.

Next, in the step illustrated in FIG. 11A, the manufactured upper chip 4 is arranged above the lower chip 3 in which the connection terminals 34 are formed on the upper end surfaces 32B of the through electrodes 32. For example, the surface of the lower chip 3 at the side of the connection terminals 34 is opposed to the surface of the upper chip 4 at the side of the electrode pads 52P. Thus, the connection terminals 34 of the lower chip 3 are opposed to the connection terminals 53 formed on the electrode pads 52P.

Subsequently, in the step illustrated in FIG. 11B, the connection terminals 53 of the upper chip 4 are flip-chip bonded to the respective through electrodes 32 on which the connection terminals 34 are formed. For example, when the upper surface of the insulating layer 31 of the lower chip 3 is adhered to the lower surface of the insulating layer 54A of the upper chip 4, the connection terminals 53 of the upper chip 4 penetrate the insulating layer 54A in the semi-cured state and come into contact with the connection terminals 34 of the lower chip 3. This electrically connects the connection terminals 34 and 53. Here, when solder is used on at least the connection terminal 34 or the connection terminal 53, the solder is melted and solidified to connect the connection terminals 34 and 53. When the insulating layer 54 is made of ACF or ACP, by arranging the insulating layer 54 (ACF or ACP) between the connection terminals 53 and the connection terminals 34 and pressing the insulating layer 54, the portions between the opposing connection terminals 34 and 53 in the insulating layer 54 are strongly pressed and become conductive in the thickness direction. This electrically connects the connection terminals 34 and 53. When the connection terminals 34 are electrically connected to the connection terminals 53, the electrode pads 52P of the upper chip 4 are electrically connected to the through electrodes 32 by the connection terminals 53 and 34. This electrically connects the electrode pads 52P of the upper chip 4 to the electrode pads 20P of the wiring substrate 2 through the through electrodes 32. Examples of a method for stacking the upper chip 4 on the lower chip 3 include the method for thermocompressing the lower chip 3 and the upper chip 4 with a bonding tool and the method for using a reflow technique. By performing heating during or after the stacking, the insulating layer 54A in the B-stage state is heated at a curing temperature or higher for a predetermined time and thermally cured. As a result, the lower surface of the thermally cured insulating layer 54 is adhered to the upper surface of the insulating layer 31, and the through electrodes 32, the connection terminals 34 and 53, and the electrode pads 52P are covered by the thermally cured insulating layer 54. Here, the material of the insulating layer 54 is the same as the material of the insulating layer 31 formed below the insulating layer 54. This avoids delamination at the interface between the insulating layer 54 and the insulating layer 31 caused by a difference in physical properties (thermal expansion coefficient and so on) between the material of the insulating layer 54 and the material of the insulating layer 31.

Figure 12:
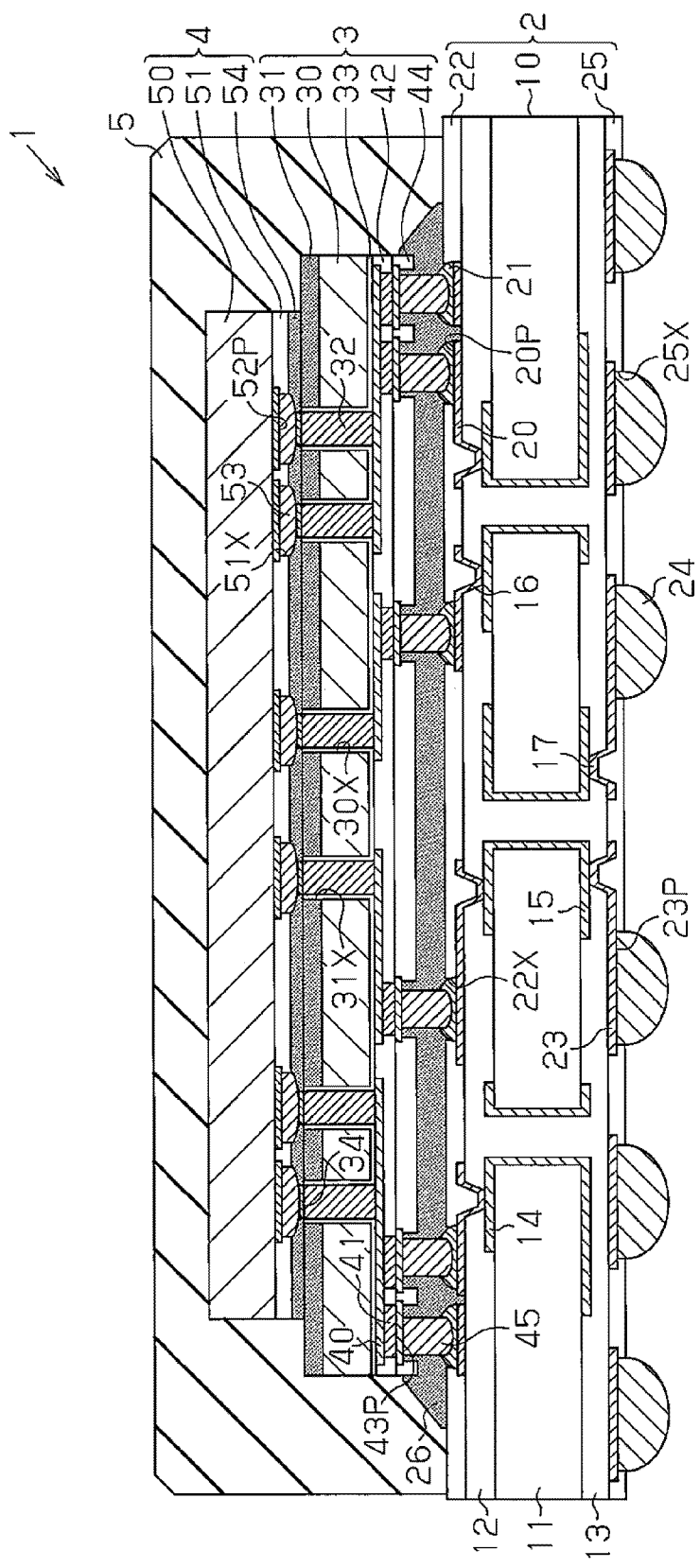

Next, in the step illustrated in FIG. 12, the encapsulation resin 5 is formed to seal the semiconductor chips 3 and 4 stacked on the wiring substrate 2. For example, when a thermally curable mold resin is used as the encapsulation resin 5, the structure illustrated in FIG. 11B is held in a die, and a mold resin to which pressure (for example, 5 to 10 MPa) is applied is filled into the die. Then, the mold resin is heated (heating temperature is, for example, 180° C.) and cured to form the encapsulation resin 5.

Subsequently, in the step illustrated in FIG. 12, the external connection terminals 24 are formed on the external connection pads 23P of the wiring substrate 2. The external connection terminals 24 may each be a solder bump. The semiconductor package 1 in the present embodiment is manufactured in accordance with the above-described manufacturing process.

In the present embodiment, the manufacturing process illustrated in FIGS. 3 to 8 is an example of a first process, the manufacturing process illustrated in FIG. 9 is an example of a second process, the manufacturing process illustrated in FIG. 10 is an example of a third process, and the manufacturing process illustrated in FIG. 11 is an example of a fourth process.

The first embodiment has the advantages described below.

(1) In the lower chip 3, the upper end surfaces of the through electrodes 32 are substantially flush with the first surface 31A of the insulating layer 31 at the side of the second surface 30B of the semiconductor substrate 30. Thus, the upper surface (that is, lower surface in gap between the stacked lower chip 3 and upper chip 4) of the lower chip 3 is flat. When the underfill material is filled between the lower chip 3 and the upper chip 4, steps are small in the surface to which the underfill material is filled. This improves the flowability of the underfill material and the filling property of the underfill material. Further, since voids are not formed in the underfill material, the reliability of the electrical connection between the lower chip 3 and the upper chip 4 is improved.

(2) The insulating film 33 is formed to entirely cover the wall surfaces of the through holes 30X and the entire wall surfaces of the openings 31X. Further, the metal film 36 is formed to cover the insulating film 33. The metal film 36 is a metal barrier layer hindering the dispersion of copper from the conductive layer 32A to the insulating film 33 and the insulating layer 31. This improves the insulation reliability of the semiconductor chip 3 in the planar direction.

(3) The connection terminals 34 are formed on the upper end surfaces 32B of the through electrodes 32 that become the pads when the upper chip 4 is flip-chip bonded to the lower chip 3. Thus, when the upper chip 4 is flip-chip bonded, the solder wettability is sufficient. The solder wettability may be insufficient when the connection terminals 34 are not formed. Accordingly, the connection reliability is maintained since the solder wettability is sufficient.

(4) When the insulating layer 31, the insulating film 33, and the conductive layer 32A are thinned to form the through electrodes 32, grinding is performed on the insulating layer 31, the insulating film 33, and the conductive layer 32A. Since the grinding uniformly removes the insulating layer 31, the insulating film 33, and the conductive layer 32A irrespective of the material, the upper end surfaces 32B of the through electrodes 32 may be flush with the first surface 31A of the insulating layer 31. This forms a smooth plane. Since the grinding is performed until the upper surface of the conductive layer 32A formed in the shallowest groove 60X is exposed, the depths of the grooves 60X become the same.

Moreover, since grinding, unlike CMP, does not use a chemical agent such as slurry, costs for disposing of such liquids may be reduced thereby reducing the manufacturing costs.

(5) The insulating layer 54A in the semi-cured state is formed at the side of the lower surface (surface opposed to the lower chip 3) of the upper chip 4. After stacking the upper chip 4 on the lower chip 3, the insulating layer 54 is thermally cured. The insulating layer 54 thus performs the same function as the underfill material. When the upper chip 4 is stacked on the lower chip 3, the insulating layer 54A in the semi-cured state deforms to cover the connection terminals 34 and 53 and the electrode pads 52P. This hinders the formation of voids in the underfill material. Further, the step of filling the underfill material may be omitted.

(6) The material of the insulating layer 54 and the material of the insulating layer 31 formed below the insulating layer 54 are the same insulating resin having the same composition. Thus, delamination does not occur at the interface between the insulating layer 54 and the insulating layer 31. Delamination would be is caused by a difference in physical properties (thermal expansion coefficient and so on) between the material of the insulating layer 54 and the material of the insulating layer 31.

(7) The connection terminals 34 of the lower chip 3 are formed by performing electroless plating. The connection terminals 53 of the upper chip 4 are formed by performing electroless plating or electrolytic plating. Fine thin-film terminals may easily be formed by performing a wet process such as electroless plating or electrolytic plating. Thus, the number of pins may easily be increased and pads may easily be arranged at narrow pitches. Further, the connection terminals 34 are formed by performing electroless plating. Thus, compared to when the connection terminals 34 are formed through photolithography or with a mask, manufacturing costs can be reduced and the manufacturing process can be shortened.

A second embodiment will now be described with reference to FIGS. 13 to 16.

In the first embodiment, the semiconductor package 1 includes the two semiconductor chips 3 and 4 stacked on the wiring substrate 2. In the second embodiment, a semiconductor package 1A includes three or more (for example, four) semiconductor chips stacked on the wiring substrate 2.

Figure 13:
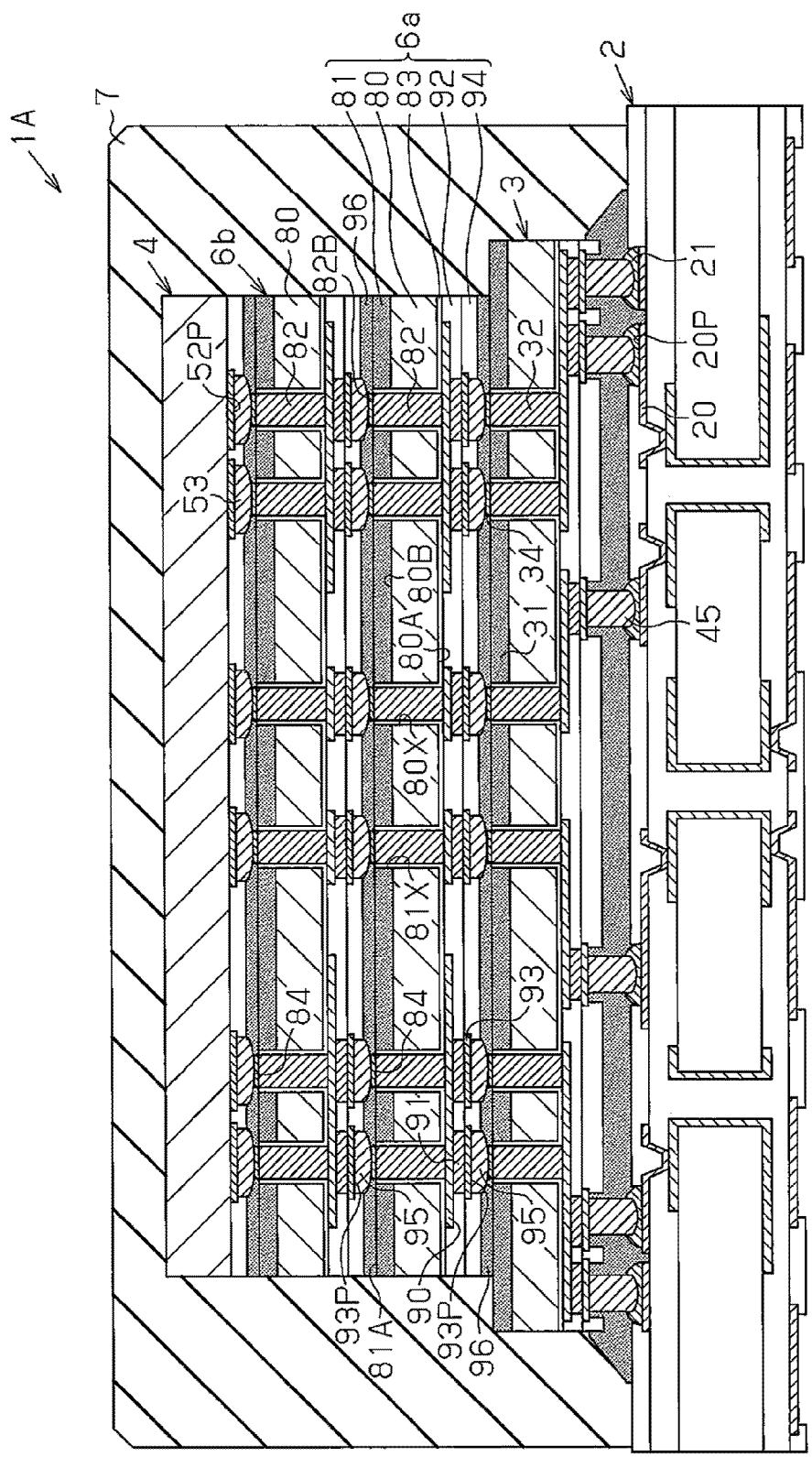
FIG. 13 is a schematic cross-sectional view illustrating a semiconductor package in a second embodiment.

As illustrated in FIG. 13, the semiconductor package 1A includes a wiring substrate 2, a semiconductor chip 3 mounted on the wiring substrate 2, semiconductor chips 6a, 6b, and 4 stacked on the semiconductor chip 3, and a encapsulation resin 7 for sealing the semiconductor chips 3, 6a, 6b, and 4 stacked on the wiring substrate 2. The semiconductor chip 3 may be a semiconductor chip for a logic device such as a CPU or an MPU. The semiconductor chips 6a, 6b, and 4 may each be a semiconductor chip for a memory device such as a DRAM or an SDRAM. The semiconductor chip 3 is a semiconductor chip stacked in the first stage, the semiconductor chip 6a is a semiconductor chip stacked in the second stage, the semiconductor chip 6b is a semiconductor chip stacked in the third stage, and the semiconductor chip 4 is a semiconductor chip stacked in the fourth stage.

The encapsulation resin 7 is provided on the wiring substrate 2 to seal the stacked semiconductor chips 3 and 6a and 6b and 4. The material of the encapsulation resin 7 may be an insulating resin such as an epoxy resin or a polyimide resin. The insulating resin may be a resin liquid, resin tablets, or resin powder. Examples of methods for filling the encapsulation resin 7 include transfer molding, compression molding, injection molding, and potting. Alternatively, printing may be performed by applying a resin paste.

Next, the structure of the semiconductor chip 6a will be described. The semiconductor chip 6a includes a semiconductor substrate 80, an insulating layer 81 (first insulating layer), through electrodes 82, an insulating film 83, a wiring pattern 90, vias 91, an insulating layer 92 (second insulating layer), electrode pads 93P, a protective film 94, connection terminals 95 (second connection terminal), an insulating layer 96. The connection terminals 95 of the semiconductor chip 6a are flip-chip bonded to the connection terminals 34 of the semiconductor chip 3.

A semiconductor integrated circuit (not illustrated) is formed on a first surface 80A (lower surface in FIG. 13) of the semiconductor substrate 80. The semiconductor integrated circuit has a diffusion layer (not illustrated) formed on the semiconductor substrate 80, an insulating layer laminated on the semiconductor substrate 80, and vias and wiring that are provided in the laminated insulating layer. Through holes 80X extending from the first surface 80A to a second surface 80B (in FIG. 13, upper surface) of the semiconductor substrate 80 are formed in the semiconductor substrate 80 at certain locations. The material of the semiconductor substrate 80 may be silicon (Si). The thickness of the semiconductor substrate 80 is, for example, about 30 to 200 μm. The semiconductor substrate 80 is, for example, a fragment of a thinned Si wafer.

The insulating layer 81 is formed to cover the second surface 80B (surface on which the semiconductor chip 6b is stacked) of the semiconductor substrate 80. Openings 81X are formed in the insulating layer 81 at positions opposed to the through holes 80X. The openings 81X are in communication with the corresponding through holes 80X and have the substantially same diameter as the through holes 80X.

The material of the insulating layer 81 may be an insulating resin such as an epoxy resin or a polyimide resin. For example, the material of the insulating layer 81 may be an adhesive sheet of insulating resin (for example, NCF), a paste of insulating resin (for example, NCP), a build-up resin (filler-containing epoxy resin), or a crystal polymer liquid. The material of the insulating layer 81 may be an adhesive sheet of anisotropic conductive resin (for example, ACF) or a paste of anisotropic conductive resin (for example, ACP). The thickness of the insulating layer 81 is, for example, about 0.1 to 50 μm.

The insulating film 83 is formed to cover the first surface 80A of the semiconductor substrate 80, the entire wall surfaces of the through holes 80X, and the entire wall surfaces of openings 81X. The insulating film 83 may be an inorganic insulating film made of SiN or $SiO_2$. The thickness of the insulating film 83 is, for example, about 0.1 to 1.0 μm.

The through electrodes 82 fill the through holes 80X and openings 81X that are covered by the insulating film 83. The lower end surfaces of the through electrodes 82 are substantially flush with the insulating film 83 at the side of the first surface 80A of the semiconductor substrate 80. The lower end surfaces of the through electrodes 82 are electrically connected to the wiring pattern 90.

Upper end surfaces (first end surfaces) 82B of the through electrodes 82 are substantially flush with a first surface 81A (surface opposite to the surface in contact with the semiconductor substrate 80) of the insulating layer 81 at the side of the second surface 80B of the semiconductor substrate 80. For example, the through electrodes 82 each have a circular shape as viewed from above and a diameter of about 5 to 20 μm. The pitch of the through electrodes 82 is, for example, about 20 to 200 μm.

A connection terminal 84 is formed on the upper end surface 82B of the through electrode 82. The connection terminal 84 may be an Sn layer, a Ni layer/Sn layer, an Au layer, a Ni layer/Au layer (a metal layer formed by laminating a Ni layer and an Au layer in this order), a Pd layer/Au layer (a metal layer formed by laminating a Pd layer and an Au layer in this order), or a Ni layer/Pd layer/Au layer (a metal layer formed by laminating a Ni layer, a Pd layer, and Au layer in this order). Each of the Sn layer, the Ni layer, the Au layer, and the Pd layer may be a metal layer (electroless plating metal layer) formed by performing electroless plating. When the connection terminal 84 is the Ni layer/Au layer, the thickness of the connection terminal 84 allows the Ni layer to have a thickness of about 0.1 to 5.0 μm and the Au layer to have a thickness of about 0.001 to 1.0 μm. When the connection terminal 84 is the Ni layer/Pd layer/Au layer, the thickness of the connection terminal 84 allows for the Ni layer to have a thickness of about 0.1 to 5.0 μm, the Pd layer to have a thickness of about 0.01 to 0.3 μm, and the Au layer to have a thickness of about 0.001 to 1.0 μm.

The wiring pattern 90 is formed on the lower surface of the insulating film 83 that covers the first surface 80A of the semiconductor substrate 80. A first end of the wiring pattern 90 is connected to the lower end surfaces of the through electrodes 82, and a second end of the wiring pattern 90 is connected to the electrode pads 93P through the vias 91. That is, the wiring pattern 90 and the vias 91 electrically connect the through electrodes 82 to the electrode pads 93P. The materials for the wiring pattern 90 and the vias 91 may be copper.

The insulating layer 92 is formed to cover the wiring pattern 90. Openings for exposing portions of the wiring pattern 90 are formed in the insulating layer 92 at certain locations. The vias 91 are formed in the openings. The material of the insulating layer 92 may be a low-dielectric material having a low dielectric constant (so-called Low-k material). Examples of the low-dielectric material include SiOC, SiOF, and organic polymers. The dielectric constant of the insulating layer 92 is, for example, about 3.0 to 3.5. The thickness of the insulating layer 92 is, for example, about 0.5 to 2 μm.

A wiring layer 93 is formed on the lower surface of each via 91. The shape of the wiring layers 93 as viewed from above is larger than that of the vias 91. The material of the wiring layers 93 may be aluminum (Al). The material of the wiring layers 93 may be a Cu/Al alloy or a Cu/Al/Si alloy.

The protective film 94 is formed on the lower surface of the insulating layer 92 to cover the lower surface of the insulating layer 92 and a portion of the wiring layers 93. The protective film 94 has a plurality of openings for exposing portions of the wiring layers 93 as the electrode pads 93P. The protective film 94 is a film for protecting the semiconductor integrated circuit (not illustrated) formed at the side of the first surface 80A of the semiconductor substrate 80 and also referred to as a passivation film. The protective film 94 may be an SiN film or a PSG film. The protective film 94 may be a laminated layer formed by laminating a polyimide layer on a layer made of an SiN film or PSG film.

The connection terminals 95 are formed on the electrode pads 93P. The connection terminals 95 are electrically connected to the through electrodes 82 and the semiconductor integrated circuit (not illustrated). When the semiconductor chip 6a is stacked on the semiconductor chip 3, the connection terminals 95 are electrically connected to the through electrodes 32 by the connection terminals 34 of the semiconductor chip 3. Thus, the through electrodes 82 of the semiconductor chip 6a are electrically connected to the corresponding through electrodes 32 of the semiconductor chip 3 by the wiring pattern 90, the vias 91, the electrode pads 93P, the connection terminals 95, and the connection terminals 34. That is, the semiconductor chip 3 is electrically connected to the semiconductor chip 6a by the through electrodes 32 and 82.

The connection terminals 95 each may be a Ni layer/Au layer/Sn layer (a metal layer formed by laminating a Ni layer, an Au layer, and an Sn layer in this order) or a Ni layer/Pd layer/Au layer/Sn layer (a metal layer formed by laminating a Ni layer, a Pd layer, an Au layer, and an Sn layer in this order), which is formed by Al zincate or electroless plating. The connection terminals 95 each may be a Ni layer/Au layer (a metal layer formed by laminating an Ni layer and an Au layer in this order) or Ni layer/Pd layer/Au layer (a metal layer formed by laminating a Ni layer, a Pd layer, and an Au layer in this order), which is formed by Al zincate or electroless plating. Like the connection terminals 45 and the metal layers 46 in FIG. 1, the connection terminals 95 may each be obtained by forming a solder layer on the cylindrical connection bump. In this case, the material of the connection bump may be a Cu layer, and the material of the solder layer may be a lead-free solder.

When the semiconductor chip 6a is stacked on the semiconductor chip 3, the insulating layer 96 is formed on the lower surface of the protective film 94 to cover the connection terminals 95 of the semiconductor chip 6a and the connection terminals 34 and the through electrodes 32 of the semiconductor chip 3. The insulating layer 96 increases the strength connecting the connection terminals 34 of the semiconductor chip 3 and the connection terminals 95 of the semiconductor chip 6a. Further, the insulating layer 96 suppresses corrosion of the through electrodes 32 and the occurrence of electromigration. The insulating layer 96 also maintains the reliability of the through electrodes 32. The material of the insulating layer 96 is the same insulating resin as the insulating layer 31 of the uppermost layer, that is, the insulating layer 31 in contact with the insulating layer 96 when the semiconductor chip 6a is stacked on the semiconductor chip 3. That is, the material of the insulating layer 96 may be an insulating resin such as an epoxy resin or a polyimide resin. For example, the material of the insulating layer 96 may be an adhesive sheet of insulating resin (for example, NCF), a paste of insulating resin (for example, NCP), a build-up resin (filler-containing epoxy resin), or a crystal polymer liquid. The material of the insulating layer 96 may be an adhesive sheet of anisotropic conductive resin (for example, ACF) or a paste of anisotropic conductive resin (for example, ACP). The thickness of the insulating layer 96 is, for example, about 5 to 15 μm.

Next, the structure of semiconductor chip 6b will be described. Since the semiconductor chip 6b has substantially the same structure as the semiconductor chip 6a, the same members are given the same reference numerals and will not be described in detail.

Like the semiconductor chip 6a, the semiconductor chip 6b includes the through electrodes 82, the connection terminals 84 formed on the upper surfaces of the through electrodes 82, the electrode pads 93P that are formed on the lower side of the through electrodes 82 and are electrically connected to the through electrodes 82, the connection terminals 95 formed on the electrode pads 93P, and the insulating layer 96 formed to cover the connection terminals 95. The connection terminals 95 of the semiconductor chip 6b are flip-chip bonded to the connection terminals 84 of the semiconductor chip 6a. The semiconductor chips 6a and 6b are electrically connected to each other by the through electrodes 82 formed in both of the semiconductor chips 6a and 6b. The connection terminals 53 of the semiconductor chip 4 are flip-chip bonded to the connection terminals 84 of the semiconductor chip 6b. The semiconductor chips 4 and 6b are electrically connected to each other by the through electrodes 82 formed in the semiconductor chip 6b.

Next, a method for manufacturing the semiconductor package 1A will be described. The structure in FIG. 14, in which the semiconductor chip 3 is flip-chip bonded to the wiring substrate 2, may be manufactured by the manufacturing process described with reference to FIGS. 3 to 9. The semiconductor chip 6a may be manufactured through substantially the same manufacturing steps as those illustrated in FIGS. 3 to 10. Thus, these steps will not be described in detail. Manufacturing steps similar to those illustrated in FIG. 3A to 8C allows for the formation of the semiconductor substrate 80, the insulating layer 81, the through electrodes 82, the insulating film 83, the connection terminals 84, the wiring pattern 90, the vias 91, the insulating layer 92, the protective film 94, and the connection terminals 95. However, the connection terminals 95 may be formed in the step illustrated in FIG. 10B in place of the steps illustrated in FIGS. 5A to 6A. An insulating layer 96A (third insulating layer) in the B-stage state (semi-cured state) is formed on the lower surface of the protective film 94 to cover the connection terminals 95. When the material of the insulating layer 96A is a sheet of an insulating resin, the sheet of an insulating resin is laminated on the lower surface of the protective film 94. However, in this step, the sheet of an insulating resin is not thermally cured and remains in the B-stage state. By laminating the insulating layer 96A in a vacuum atmosphere, the formation of voids in the insulating layer 96A may be avoided. When the material of the insulating layer 96A is a liquid or paste of insulating resin, the liquid or paste of insulating resin is applied to the upper surface of the protective film 94, for example, through printing or spin coating. Then, the applied liquid or paste of insulating resin is prebaked to the B-stage state. This manufactures the semiconductor chip 6a.

Figure 14:
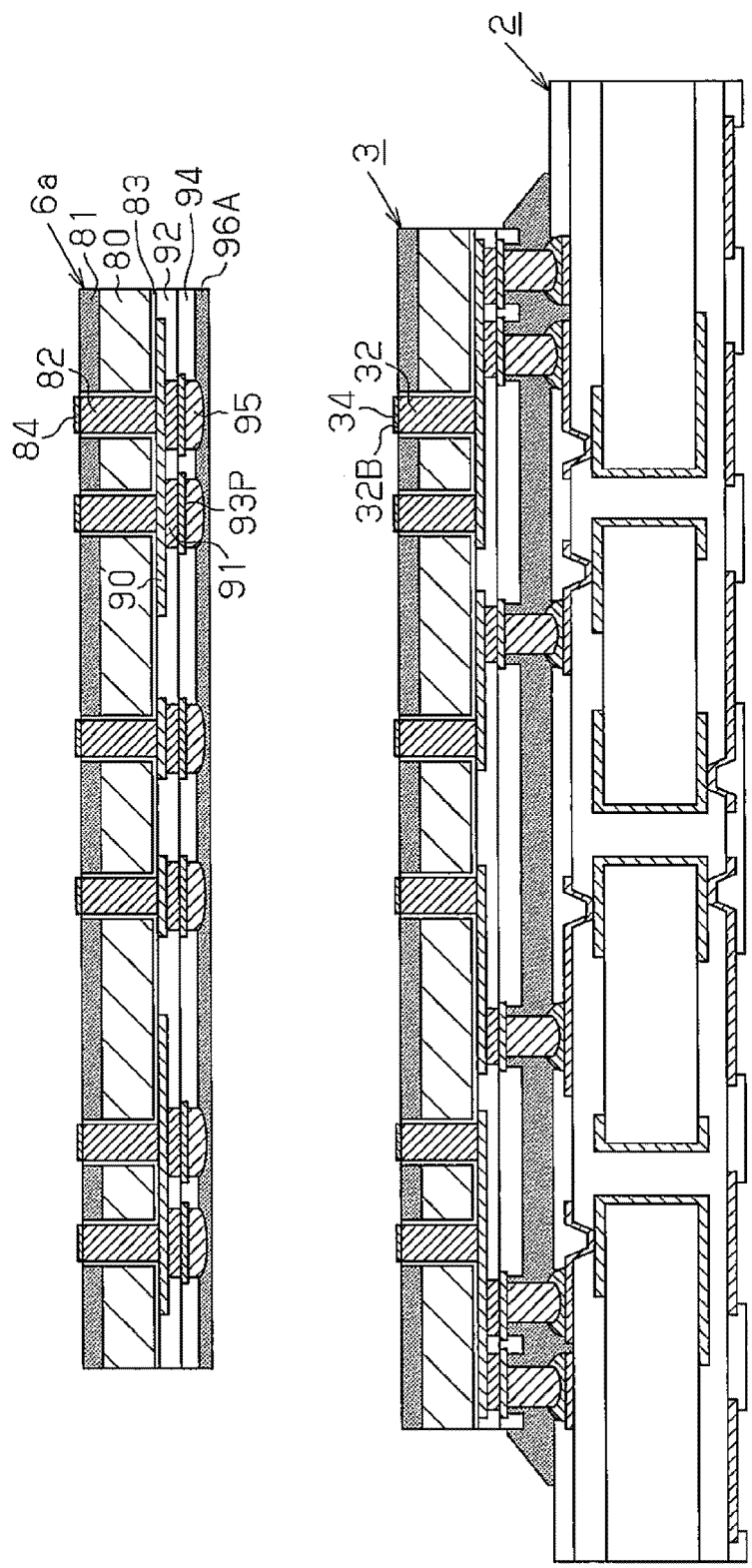
FIGS. 14 to 16 are schematic cross-sectional views each illustrating a method for manufacturing a semiconductor package in the second embodiment.

In the step illustrated in FIG. 14, the manufactured semiconductor chip 6a is arranged above the semiconductor chip 3 in which the connection terminals 34 are formed on the upper end surfaces 32B of the through electrodes 32. For example, the surface of the semiconductor chip 3 at the side of the connection terminals 34 are opposed to the surface of the semiconductor chip 6a at the side of the electrode pads 93P. Thus, the connection terminals 34 of the semiconductor chip 3 are opposed to the connection terminals 95 formed on the electrode pads 93P of the semiconductor chip 6a.

Figure 15:
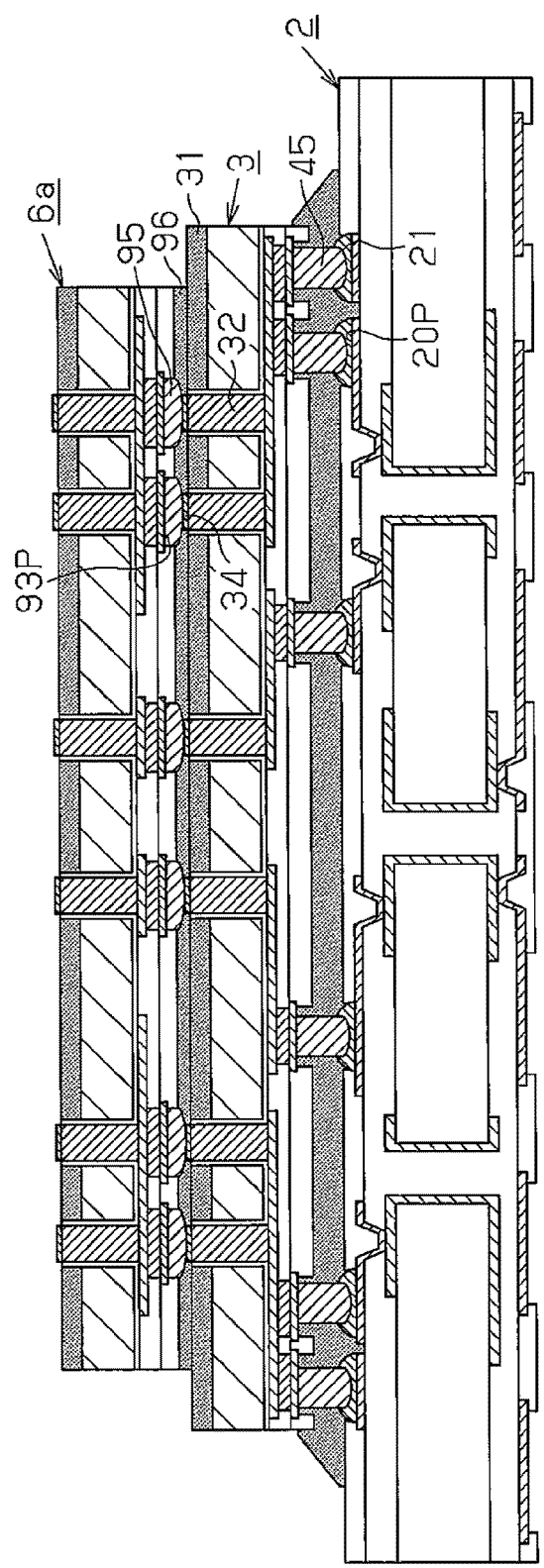

Subsequently, in the step illustrated in FIG. 15, the connection terminals 95 of the semiconductor chip 6a are flip-chip bonded to the through electrodes 32 on which the connection terminals 34 are formed. As a result, the electrode pads 93P of the semiconductor chip 6a are electrically connected to the through electrodes 32 by the connection terminals 95 and the connection terminals 34. Accordingly, the electrode pads 93P of the semiconductor chip 6a are electrically connected to the electrode pad 20P of the wiring substrate 2 by the through electrodes 32. Examples of a method for stacking the semiconductor chip 6a on the semiconductor chip 3 include a method of thermocompressing the semiconductor chips 3 and 6a by using a bonding tool and the method of performing a reflow process. By performing heating during or after the stacking, the insulating layer 96A in the B-stage state is heated at a curing temperature or higher for a predetermined time and thermally cured. As a result, the through electrodes 32, the connection terminals 34 and 95, and the electrode pads 93P are coated with the thermally cured insulating layer 96. At this time, since the material of the insulating layer 96 is the same as the material of the insulating layer 31 formed below the insulating layer 96, delamination is limited at the interface between the insulating layer 96 and the insulating layer 31, which would be caused by a difference in physical properties (thermal expansion coefficient and so on) between the material of the insulating layer 96 and the material of the insulating layer 31.

Figure 16:
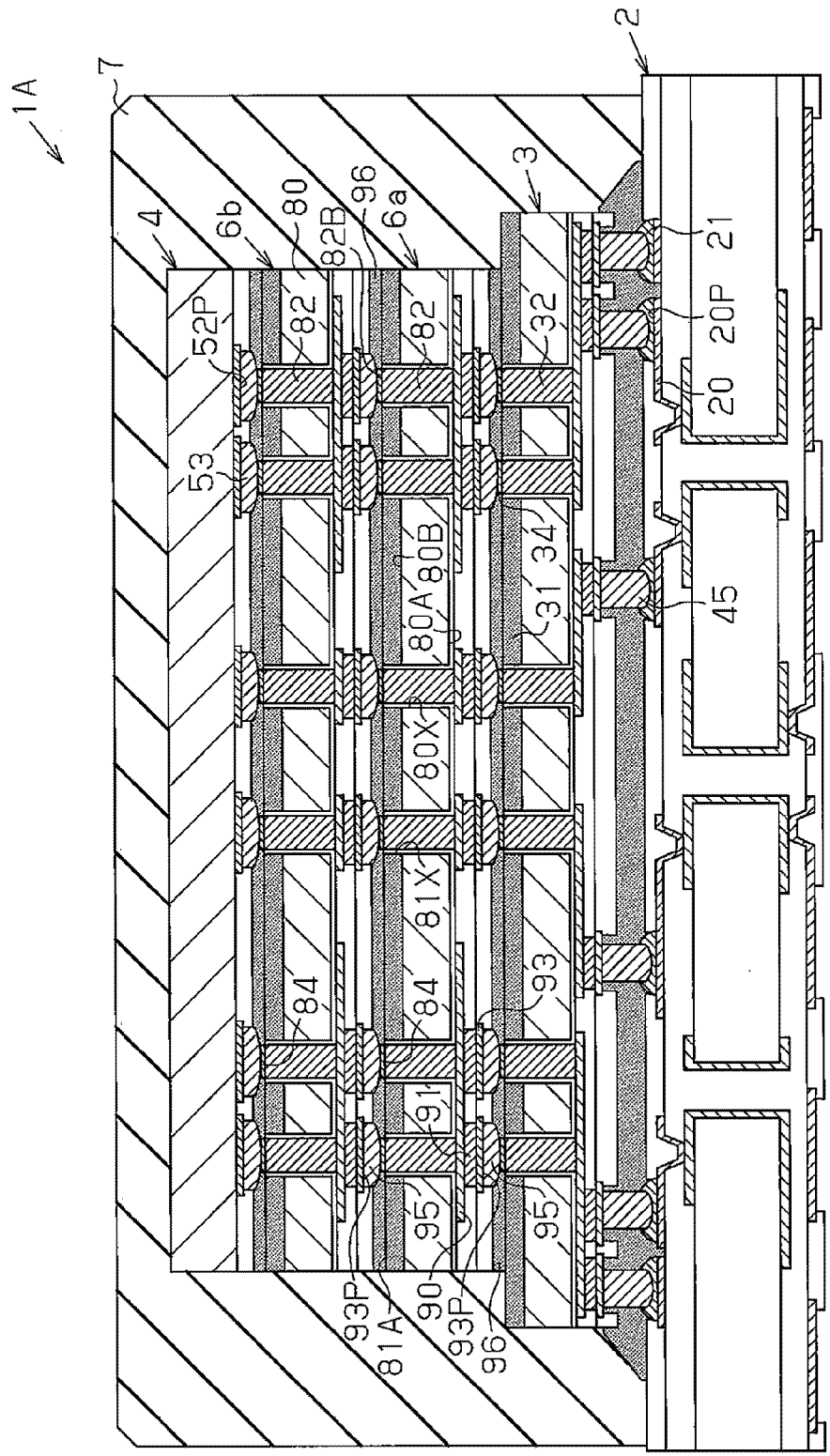

Then, as illustrated in FIG. 16, the connection terminals 95 of the semiconductor chip 6b are flip-chip bonded to the through electrodes 82 of the semiconductor chip 6a. Subsequently, the connection terminals 53 of the semiconductor chip 4 are flip-chip bonded to the through electrodes 82 of the semiconductor chip 6b. The encapsulation resin 7 for sealing the plurality of semiconductor chips 3, 6a, 6b and 4 stacked on the wiring substrate 2 is formed. This manufactures the semiconductor package 1A of the present embodiment.

The second embodiment has the same advantages as the first embodiment.

A third embodiment will now be described with reference to FIGS. 17 and 18. The present embodiment differs from first embodiment in the connection between the lower chip and the upper chip. The following description will focus on differences from the first embodiment.

Figure 17A:
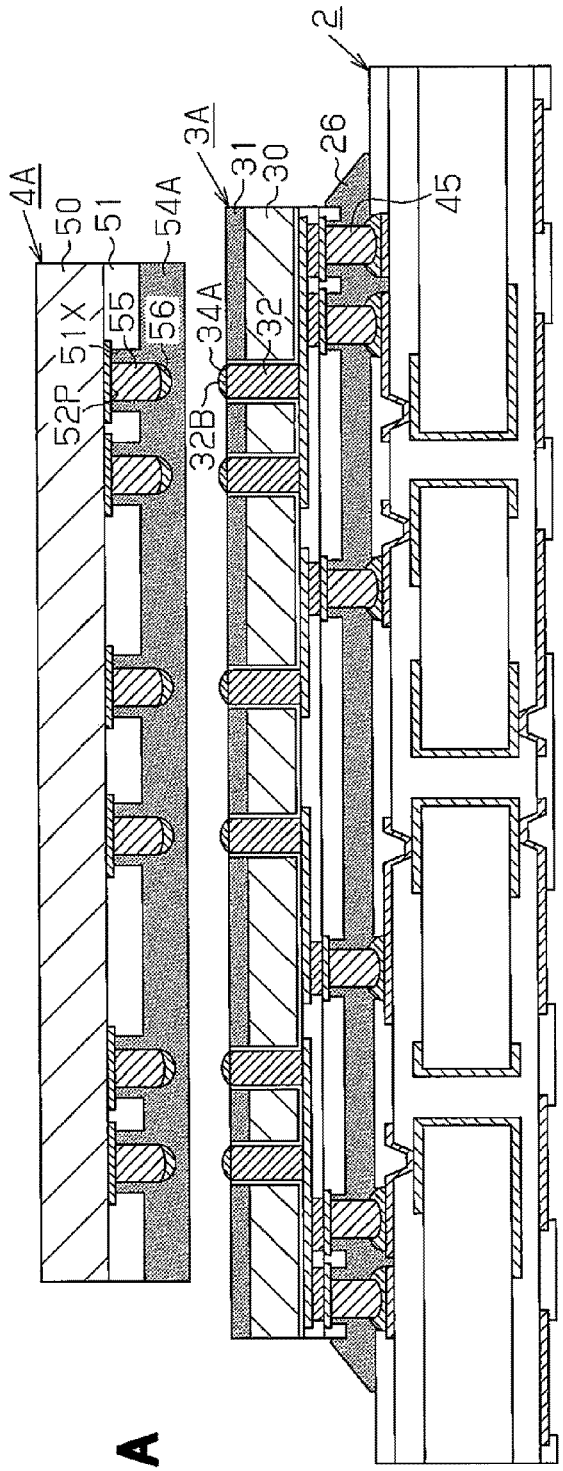
FIGS. 17A and 17B are schematic cross-sectional views each illustrating a method for manufacturing a semiconductor package in a third embodiment.
Figure 17B:
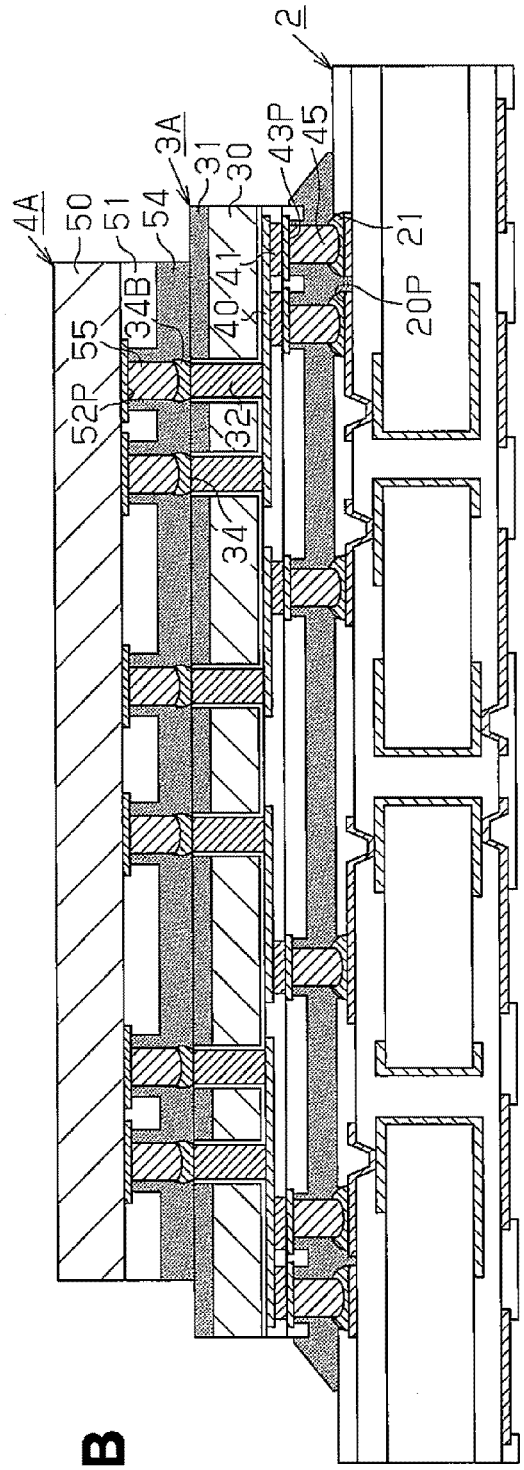
Figure 18:
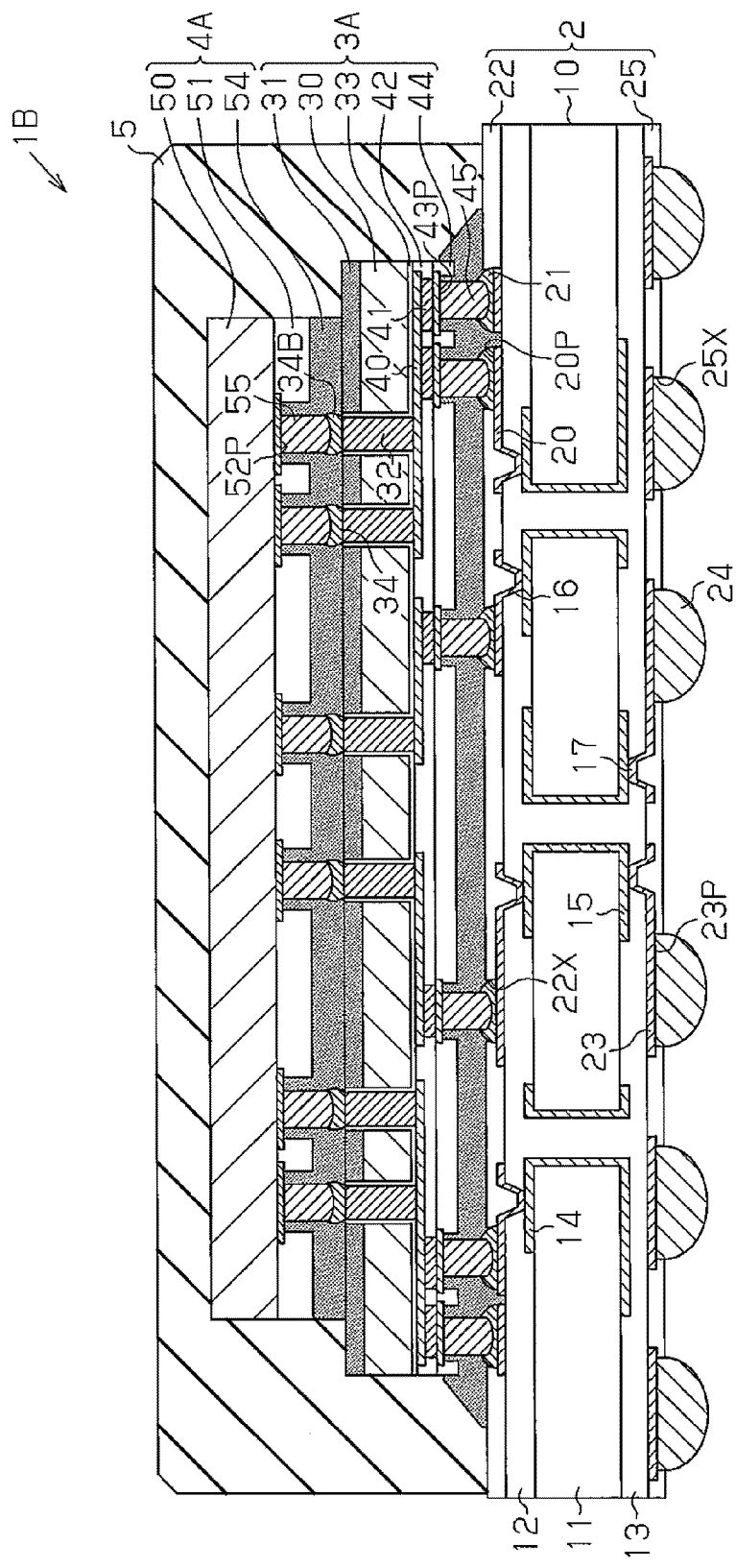
FIG. 18 is a schematic cross-sectional view illustrating the method for manufacturing the semiconductor package in the third embodiment.

FIGS. 17 and 18 illustrate the state of the semiconductor package 1B in the present embodiment during manufacturing. For example, FIG. 17 illustrates the semiconductor package 1B in the step illustrated in FIG. 11, that is, the step of stacking the upper chip 4A on the lower chip 3A flip-chip bonded to the wiring substrate 2.

As illustrated in FIG. 17A, in the lower chip 3A of the present embodiment, connection terminals 34A are formed of the upper end surfaces 32B of the through electrodes 32. The connection terminal 34A may be a preliminary solder (presolder). The material of the preliminary solder may be a lead-free solder such as Sn-3.5 Ag, Sn-2.5 Ag, Sn-3.0 Ag-0.5 Cu, or Sn—Cu. For example, the connection terminal 34A (preliminary solder) may be formed by adhering spherical ultrafine solder powder (for example, diameter of 10 μm or less) to the upper end surface 32B of the through electrode 32 and melting the solder powder. Alternatively, the connection terminal 34A may be formed by applying solder paste to the upper end surface 32B of the through electrode 32 or mounting a solder ball on the upper end surface 32B of the through electrode 32 and then performing a reflow process.

In the upper chip 4A of the present embodiment, a connection terminal 55 is formed on each electrode pad 52P exposed from the opening 51X of the protective film 51. The connection terminals 55 are electrically connected to the semiconductor integrated circuit (not illustrated) by the electrode pads 52P. Each connection terminal 55 is a cylindrical connection bump extending downward from the lower surface of the electrode pad 52P. The connection terminals 55 are opposed to the connection terminals 34A formed in the lower chip 3A. The height of the connection terminals 55 is, for example, about 20 to 40 μm, and the diameter of the connection terminals 55 is, for example, about 10 to 40 μm. The pitch of the connection terminals 55 is about 30 to 60 μm. The material of the connection terminals 55 may be copper or copper alloy.

A solder layer 56 is formed on the lower surface of each connection terminal 55. The solder layer 56 may be a plated lead-free solder (for example, Sn-2.5 Ag). The height of the solder layers 56 is, for example, about 5 to 10 μm. The connection terminals 55 and the solder layers 56 may be formed in the same method as the method of forming the connection terminals 45 and the metal layers 46 (for example, refer to FIG. 5A to FIG. 6A). The connection terminals 55 and the solder layers 56 are covered by the insulating layer 54A in the B-stage state.

In the step illustrated in FIG. 17A, the upper chip 4A is arranged above the lower chip 3A on which the connection terminals 34A are formed. For example, the surface of the lower chip 3A at the side of the connection terminals 34A is opposed to the surface at the side of the electrode pads 52P of the upper chip 4A. Thus, the connection terminals 34A of the lower chip 3A are opposed to the connection terminals 55 of the upper chip 4A.

Next, in the step illustrated in FIG. 17B, the connection terminals 55 of the upper chip 4A are flip-chip bonded to the through electrodes 32 on which the connection terminals 34A are formed. For example, the lower surface of the insulating layer 54A of the upper chip 4A is adhered to the upper surface of the insulating layer 31 of the lower chip 3A, and the connection terminals 55 and the solder layers 56 of the upper chip 4A penetrate the insulating layer 54A in the semi-cured state and are electrically connected to the connection terminals 34A. The connection terminals 55 are connected to the connection terminals 34A by, for example, heating the solder layers 56 and the connection terminals 34A to about 230° C. to 260° C. to melt and solidify the solders. At this time, since the solder layer 56 and the connection terminal 34A are made of solders, the solder layer 56 and the connection terminal 34A are melted into an alloy to form a solder bump 34B. The through electrode 32 is electrically connected to the connection terminal 55 by the solder bump 34B. Then, the electrode pad 52P of the upper chip 4A is electrically connected to the through electrode 32 by the connection terminals 55. Thus, the electrode pad 52P of the upper chip 4A is electrically connected to the electrode pad 20P of the wiring substrate 2 by the through electrode 32. By performing heating during or after the stacking, the insulating layer 54A in the B-stage state is heated at a curing temperature or higher for a predetermined time and thermally cured. As a result, the lower surface of the thermally cured insulating layer 54 is adhered to the upper surface of the insulating layer 31. Further, the through electrodes 32, the solder bumps 34B, the connection terminals 55, and the electrode pads 52P are covered by the thermally cured insulating layer 54.

Subsequently, in the step illustrated in FIG. 18, the encapsulation resin 5 for sealing the plurality of semiconductor chip 3A and 4A stacked on the wiring substrate 2 is formed. Then, the external connection terminals 24 are formed on the external connection pads 23P of the wiring substrate 2. This manufactures the semiconductor package 1B of the present embodiment.

The third embodiment has the following advantage in addition to advantages (1) to (6) of the first embodiment.

(8) The connection terminals 34A made of a preliminary solder are formed on the upper end surfaces 32B of the respective through electrodes 32 of the lower chip 3A. The cylindrical connection terminals 55 and the solder layers 56 are formed on the electrode pads 52P of the upper chip 4A. Thus, the solders of the lower chip 3A may be bonded to the solders of the upper chip 4A. As compared to when the solders are formed only on the lower chip 3A or the upper chip 4A, the wettability is improved, and due to an increase in the amount of bonding solder (solder volume), the connection strength is also improved. Therefore, the reliability of connection between the lower chip 3A and the upper chip 4A is improved.

The fine connection terminals 34A may be formed by adhering ultrafine solder powder onto the upper end surfaces 32B of the through electrodes 32 and melting the solder powder. Thus, the number of pins may easily be increased and pads may easily be arranged at narrow pitches.

A fourth embodiment will now be described with reference to FIG. 19. In each of the above-described embodiments, the combination of the material of the connection terminals 34 and 84 formed on the upper end surfaces 32B and 82B of the through electrodes 32 and 82 and the material of the connection terminals 53 and 95 formed on the electrode pads 52P and 93P may be changed. For example, when each of the connection terminals 34 and 84 is an Ni layer/Au layer, preferably, each of the connection terminals 53 and 95 is an Ni layer/Au layer/Sn layer or a Ni layer/Pd layer/Au layer/Sn layer. When each of the connection terminals 34 and 84 is an Sn layer, preferably, each of the connection terminals 53 and 95 is a Ni layer/Au layer or a Ni layer/Pd layer/Au layer.

When each of the connection terminals 34 and 84 is a Ni layer/Au layer, preferably, each of the connection terminals 53 and 95 is a solder layer formed on the cylindrical connection bump. In this case, for example, as illustrated in FIG. 19A, the connection terminals 34 are formed as the Ni layer/Au layers on the upper end surfaces 32B of the through electrodes 32 of the lower chip 3, and the cylindrical connection terminals 55 and the solder layers 56 extend downward from the lower surfaces of the electrode pads 52P of the upper chip 4A. In the step illustrated in FIG. 19A, the upper chip 4A is arranged above the lower chip 3 such that the connection terminals 34 of the lower chip 3 are opposed to the connection terminals 55 of the upper chip 4A. Subsequently, as illustrated in FIG. 19B, the connection terminals 55 of the upper chip 4A are flip-chip bonded to the through electrodes 32 on which the connection terminals 34 are formed. For example, the lower surface of the insulating layer 54A of the upper chip 4A is adhered to the upper surface of the insulating layer 31 of the lower chip 3, and the connection terminals 55 and the solder layers 56 of the upper chip 4A penetrate the insulating layer 54A in the semi-cured state and are electrically connected to the connection terminals 34. At this time, the solder layers 56 are heated to about 230° C. to 260° C. to melt and solidify the solders. This electrically connects the connection terminals 55 to the connection terminals 34 with the solder layers 56. In this manner, the electrode pads 52P of the upper chip 4A are electrically connected to the through electrodes 32 by the connection terminals 55, the solder layers 56, and the connection terminals 34.

A fifth embodiment will now be described with reference to FIGS. 20 and 21. The present embodiment differs from third and fourth embodiments in the shape of connection terminals formed on the upper end surfaces 32B of the through electrodes 32. The description hereafter will focus on the difference of the fifth embodiment from the third and fourth embodiments.

As illustrated in FIG. 20A, a semiconductor package 1C includes a wiring substrate 2, a semiconductor chip (lower chip) 3B mounted on the wiring substrate 2, a semiconductor chip (upper chip) 4A stacked on the semiconductor chip 3B, and a encapsulation resin 5 for sealing the semiconductor chips 3B and 4A stacked on the wiring substrate 2. The semiconductor chip 3B is an example of a semiconductor device.

The lower chip 3B includes a semiconductor substrate 30, an insulating layer 31, through electrodes 32, an insulating film 33, a wiring pattern 40, vias 41, an insulating layer 42, electrode pads 43P, a protective film 44, connection terminals 45, and connection terminals 100 (first connection terminal). The lower chip 3 is flip-chip bonded to the wiring substrate 2.

The insulating layer 31 may be formed by an organic insulating film made of an epoxy resin or a polyimide resin, or an inorganic insulating film made of SiN or $SiO_2$.

As illustrated in FIG. 20B, each of the connection terminals 100 is formed on the first surface 31A of the insulating layer 31, the upper surface of the insulating film 33, and the upper end surface 32B of the through electrode 32. The connection terminal 100 has a larger diameter than the through electrode 32. Thus, the connection terminal 100 having a larger diameter than the through electrode 32 is formed on the first surface 31A of the insulating layer 31, the upper surface of the insulating film 33, and the upper end surface 32B of the through electrode 32. The connection terminal 100 covers a portion of the upper end surface 32B of the through electrode 32 (the conductive layer 32A and the seed layer 35), the upper surface of the insulating film 33 that covers the side surface of the metal film 36, and a portion of the first surface 31A of the insulating layer 31 that covers the side surface of the insulating film 33. Here, for example, the through electrode 32 has a circular shape as viewed from above and a diameter about 5 to 20 μm. The pitch of the through electrode 32 is, for example, about 20 to 200 μm. The connection terminal 100 has a circular shape as viewed from above and a diameter about 5.2 to 30 μm. The thickness of the connection terminal 100 is, for example, about 0.1 to 10 μm. The diameter of the connection terminal 100 is obtained by adding a value that is about two times greater than the thickness of the connection terminal 100 to the diameter of the through electrode 32.

Each of the connection terminals 100 may be a Ni layer/Au layer, a Ni layer/Pd layer/Au layer, a Ni layer/Sn layer, or an Sn layer. Each of the Ni layer, the Au layer, the Pd layer, and the Sn layer may be a metal layer (electroless plating metal layer) formed, for example, by performing electroless plating. When the connection terminal 100 is the Ni layer/Pd layer/Au layer, the thickness of the Ni layer is, for example, about 0.1 to 10 μm, and the thickness of each of the Pd layer and the Au layer is, for example, about 0.001 to 1.0 μm. When the connection terminal 100 is the Ni layer/Au layer, the thickness of the Ni layer is, for example, about 1.0 to 5.0 μm, and the thickness of the Au layer is, for example, about 0.001 to 1.0 μm. When the connection terminal 100 is the Ni layer/Sn layer, the thickness of the Ni layer is, for example, about 0.1 to 10 μm, and the thickness of the Sn layer is, for example, about 0.1 to 10 μm. When the connection terminal 100 is the Sn layer, the thickness of the Sn layer is, for example, about 1 to 10 μm. In the present embodiment, a Ni layer 101 and an Au layer 102 are laminated on the first surface 31A of the insulating layer 31 and the upper end surface 32B of the through electrode 32 in this order to form the connection terminal 100. The Au layer 102 is formed to entirely cover the surface (the upper surface and the side surface) of the Ni layer 101.

As illustrated in FIG. 20A, when the upper chip 4A is stacked on the lower chip 3B, the connection terminals 100 are bonded to the connection terminals 55 of the upper chip 4A by the solder layers 56. Further, the connection terminals 100 are electrically connected to the connection terminals 55 by the solder layers 56.

Next, a method for manufacturing the semiconductor package 1C (method for manufacturing the connection terminals 100) will be described with reference to FIG. 21.

Figure 21A:
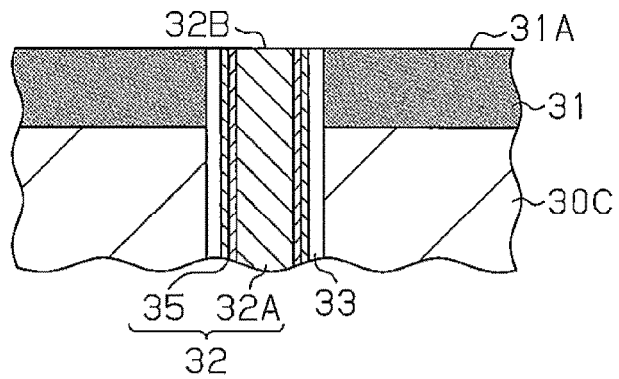
FIGS. 21A to 21E are schematic cross-sectional views each illustrating a method for manufacturing the semiconductor package in a fifth embodiment.

First, the manufacturing process of the steps illustrated in FIGS. 3A to 7C are performed to form the structure illustrated in FIG. 21A. That is, the structure in which the first surface 31A of the insulating layer 31 is substantially flush with the upper end surfaces 32B of the through electrodes 32 is produced.

Figure 21B:
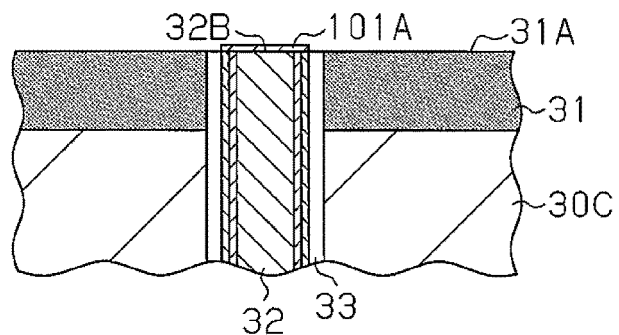
Figure 21C:
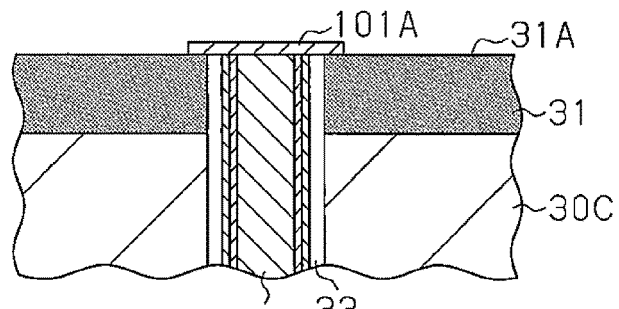
Figure 21D:
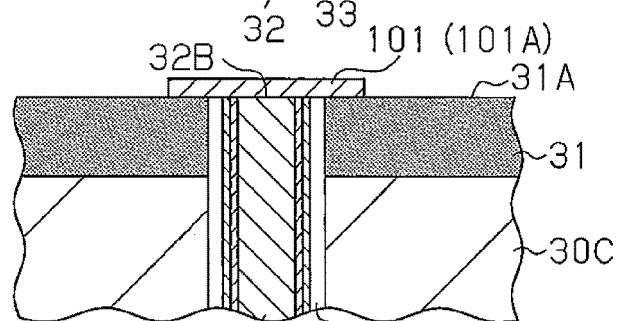

Next, in the steps illustrated in FIGS. 21B to 21D, the Ni layer 101 having a larger diameter than the through electrode 32 is formed on the upper end surface 32B of the through electrode 32 and the first surface 31A of the insulating layer 31 by performing electroless plating. In detail, when the structure illustrated in FIG. 21A is subjected to electroless Ni plating, first, as illustrated in FIG. 21B, an electroless Ni plating film 101A is deposited on the upper end surface 32B of the metal through electrode 32. Then, as illustrated in FIG. 21C and FIG. 21D, further continuation of electroless Ni plating isotropically deposits the electroless Ni plating film 101A. As a result, the Ni layer 101 has a larger diameter than the through electrode 32 formed on the upper surface of the insulating film 33 and the first surface 31A of the insulating layer 31. Thus, the diameter of the Ni layer 101 is substantially equal to the sum of a value that is two times greater than the thickness of the Ni layer 101 (e.g., the thickness from the upper end surface 32B of the through electrode 32 to the upper surface of the Ni layer 101) and the diameter of the through electrode 32. The Ni layer 101 covers the upper surface of the insulating film 33 and a portion of the first surface 31A of the insulating layer 31 formed around the through electrode 32 (insulating film 33).

Figure 21E:
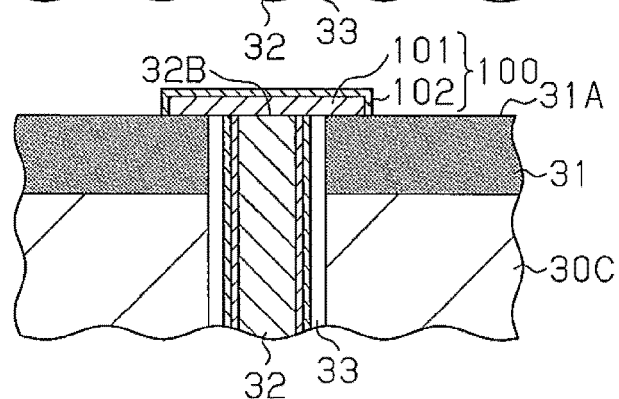

Subsequently, in the step illustrated in FIG. 21E, the Au layer 102 is formed on the Ni layer 101 by performing electroless plating. In detail, when the structure illustrated in FIG. 21D is subjected to electroless Au plating, an electroless Au plating film is deposited on the surface (the side surface and the upper surface) of the metal Ni layer 101 as illustrated in FIG. 21E. This forms the Au layer 102 that covers the side surface and the upper surface of the Ni layer 101.

The manufacturing process forms the connection terminals 100, which include the Ni layer 101 and the Au layer 102, on the through electrodes 32, the insulating layer 31, and the insulating film 33.

A fifth embodiment has the following advantage in addition to advantages (1) to (7) of the first embodiment.

(9) The connection terminals 100 having a larger diameter than the through electrodes 32 are formed on the first surface 31A of the insulating layer 31, the upper surface of the insulating film 33, and the upper end surfaces 32B of the through electrodes 32. Thus, compared to when the connection terminals are formed only on the upper end surfaces 32B of the through electrodes 32, the bonding area between the connection terminal 100 of the lower chip 3B and the connection terminals 55 of the upper chip 4A may be increased. This increases the connection strength between the connection terminals 100 and the connection terminals 55. Accordingly, the reliability of the connection between the lower chip 3B and the upper chip 4A is improved.

Modified Examples of the Fifth Embodiment

Figure 22:
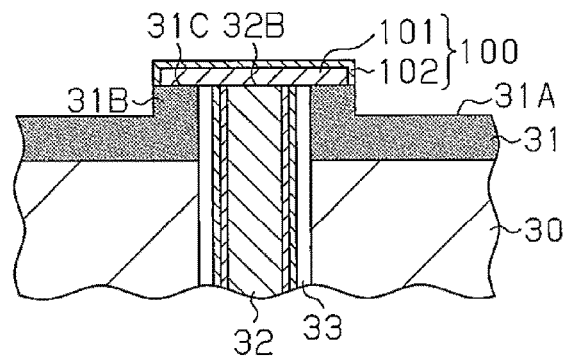
FIG. 22 is an enlarged cross-sectional view illustrating part of a semiconductor chip in a modified example.

As illustrated in FIG. 22, the structure around the connection terminal 100 may be modified. In detail, a projection 31B (first projection) may be formed on the insulating layer 31 projecting upward from the first surface 31A of the insulating layer 31 (toward the opposite side to the semiconductor substrate 30). The through electrode 32 and the insulating film 33 may be formed to be substantially flush with an upper surface 31C of the projection 31B. That is, portions of the through electrode 32 and the insulating film 33 project upward from the first surface 31A of the insulating layer 31. The connection terminal 100 may be formed on the upper end surface 32B of the through electrode 32 projecting from the first surface 31A of the insulating layer 31, the upper surface of the insulating film 33, and the upper surface 31C of the projection 31B. Thus, the connection terminal 100 is formed to project from the first surface 31A of the insulating layer 31. By projecting the connection terminal 100 (pad) from the first surface 31A of the insulating layer 31, for example, even when the connection terminal 55 of the upper chip 4A has a small diameter, the connection terminal 100 may be easily connected to the connection terminal 55. In detail, when the diameter of the connection terminal 55 is small, a connection failure may occur between the connection terminal 55 and the connection terminal 100 when the first surface 31A of the insulating layer 31 is uneven. However, in this modified example, since the connection terminal 100 projects upward from the first surface 31A of the insulating layer 31, even when the first surface 31A of the insulating layer 31 is uneven, the effect is limited. This connects the connection terminal 55 and the connection terminal 100 in a satisfactory manner.

The height (thickness) from the first surface 31A of the insulating layer 31 to the lower surface of the connection terminal 100, that is, the height of the projection 31B is, for example, about 0.1 to 10 μm.

Next, a method for manufacturing the projection 31B and the connection terminals 100 will be described with reference to FIG. 23.

Figure 23A:
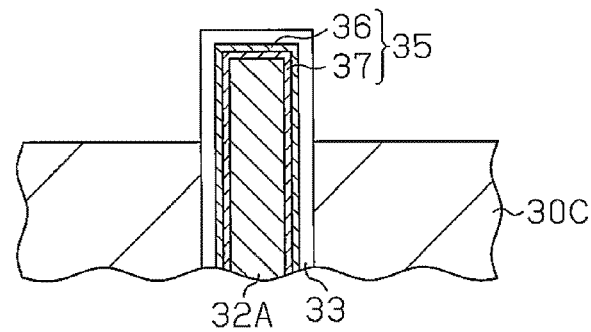
FIGS. 23A to 23C are schematic cross-sectional views each illustrating a method for manufacturing the semiconductor chip of FIG. 22.

First, the structure illustrated in FIG. 23A is produced by performing the steps illustrated in FIGS. 3A to 7A. This obtains a structure in which portions of the insulating film 33, the conductive layer 32A, and the metal film 36 and 37 are exposed from the substrate 30C.

Figure 23B:
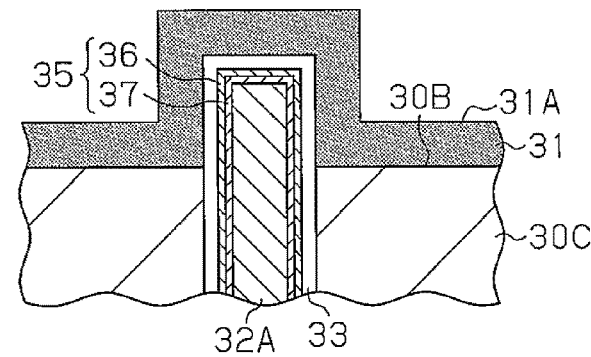

Next, in the step illustrated in FIG. 23B, the insulating layer 31 is formed to cover the second surface 30B of the substrate 30C and the insulating film 33 exposed from the substrate 30C. In this step, the insulating layer 31 is shaped in conformance with the second surface 30B of the substrate 30C, and the side surface and the upper surface of the insulating film 33 exposed from the substrate 30C. In other words, the insulating layer 31 is formed so as not to embed the conductive layer 32A projecting from the second surface 30B of the substrate 30C in the thickness of the insulating layer 31 as in the step illustrated in FIG. 7B. When the material of the insulating layer 31 is an inorganic insulating film made of SiN, SiO$_2$, or the like, the insulating layer 31 may be formed by performing chemical vapor deposition (CVD). When the material of the insulating layer 31 is an organic insulating film made of an epoxy resin or the like, for example, the resin film is laminated on the second surface 30B of the substrate 30C and then is heated and cured at about 150° C. to 190° C. while being pressed to form the insulating layer 31.

Figure 23C:
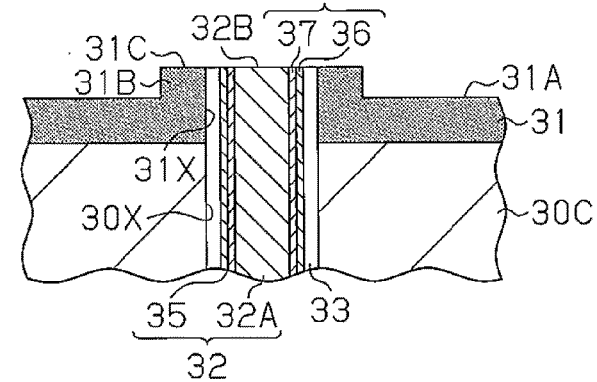

Next, in the step illustrated in FIG. 23C, the insulating film 33, and the metal films 36 and 37 formed on the conductive layer 32A are removed (polished) with a CMP device or the like. The removal is performed until the upper surface of the conductive layer 32A (end surface) is exposed and finished before removal of the first surface 31A of the insulating layer 31 is started. Thus, the upper surface of the conductive layer 32A projects upward from the first surface 31A of the insulating layer 31. In this step, the opening 31X including the projection 31B is formed in the insulating layer 31. Further, the through electrode 32 including the conductive layer 32A and the seed layer 35 is formed in the through hole 30X and the opening 31X that are covered by the insulating film 33. At this time, portions of the through electrodes 32 and the insulating film 33 project upward from the first surface 31A of the insulating layer 31. The projection 31B projecting upward from the first surface 31A is formed on the insulating layer 31. Further, the upper surface 31C of the projection 31B, the upper end surface 32B of the through electrode 32, and the upper surface of the insulating film 33 are substantially flush with one another.

Subsequently, by applying electroless plating to the structure illustrated in FIG. 23C, the connection terminal 100 including the Ni layer 101 and the Au layer 102 is formed on the upper surfaces of the through electrode 32, the insulating film 33, and the projection 31B, as illustrated in FIG. 22.

Then, the connection terminals 55 formed on the upper chip 4A are bonded to the connection terminals 100 formed on the lower chip 3B. For example, in steps similar to those illustrated in FIG. 11B, the insulating layer in the semi-cured state is formed on the lower side of the upper chip 4A and adhered to the insulating layer 31. At this time, the connection terminals 55 and the solder layers 56 of the upper chip 4A penetrate the insulating layer in the semi-cured state and are electrically connected to the connection terminals 100. When the connection terminals 100 project upward from the first surface 31A of the insulating layer 31, the insulating resin between the connection terminals 100 and the connection terminals 55 may easily be removed. This improves the connection reliability of the connection terminals 100 and the connection terminals 55.

The connection terminal 100 illustrated in FIG. 22 is formed to cover the upper end surface 32B of the through electrode 32, the upper surface of the insulating film 33, and the upper surface 31C of the projection 31B. However, the shape of the connection terminal 100 may be modified.

Figure 24:
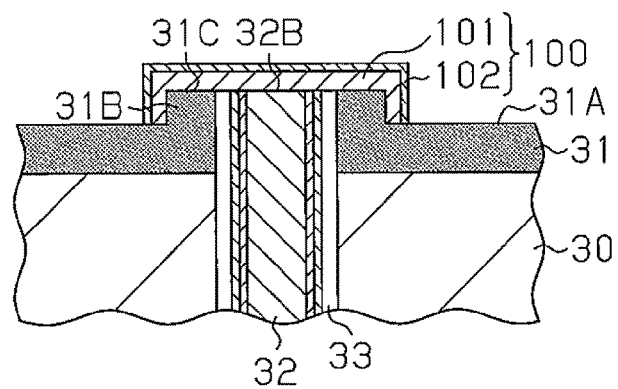
FIGS. 24 to 26 are enlarged cross-sectional views each illustrating part of a semiconductor chip in another modified example.

For example, as illustrated in FIG. 24, the connection terminal 100 may be formed to entirely cover the surfaces of the projection 31B, the insulating film 33, and the through electrode 32 that project upward from the first surface 31A of the insulating layer 31. For example, the Ni layer 101 covers the upper surface 31C of the projection 31B, the upper surface of the insulating film 33, and the upper end surface 32B of the through electrodes 32 in addition to the side surface of the projection 31B. Further, the Ni layer 101 also covers a portion of the first surface 31A of the insulating layer 31 formed around the projection 31B. The Au layer 102 is shaped in conformance with the Ni layer 101 to cover the surface (the upper surface and the side surface) of the Ni layer 101. Such connection terminal 100 that also covers a portion of the first surface 31A of the insulating layer 31 may be formed by increasing the processing time of electroless Ni plating when forming the Ni layer 101.

In this structure, the bonding area of the solder layers 56 may be increased when the connection terminals 100 are electrically connected to the respective connection terminals 55. This increases the bonding strength between the connection terminals 55 and the connection terminals 100.

Figure 25:
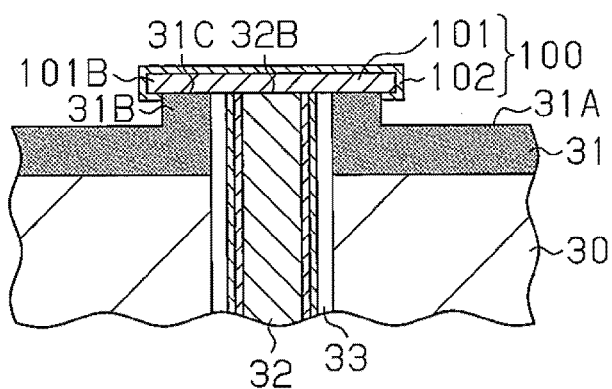

For example, as illustrated in FIG. 25, the Ni layer 101 that covers the upper surface 31C of the projection 31B, the upper surface of the insulating film 33, and the upper end surface 32B of the through electrode 32 may be provided with a projection 101B projecting laterally from the outer side surface of the projection 101B to form the Au layer 102 that covers the entire surface of the Ni layer 101 including the lower surface of the projection 101B. That is, the Au layer 102 is formed to cover the upper surface and the side surface of the Ni layer 101 and the lower surface of the projection 101B (lower surface of a portion of the Ni layer 101). The connection terminal 100 including the Ni layer 101 and the Au layer 102 may be formed by increasing the processing time of electroless Ni plating during the formation of the Ni layer 101.

In the modified example illustrated in FIGS. 22 to 25, portions of the insulating layer 31 (projection 31B), the insulating film 33, and the through electrode 32 project upward from the first surface 31A of the insulating layer 31. Instead, only a portion of the projection 31B, the insulating film 33, or the through electrode 32 may project upward from the first surface 31A of the insulating layer 31.

Figure 26:
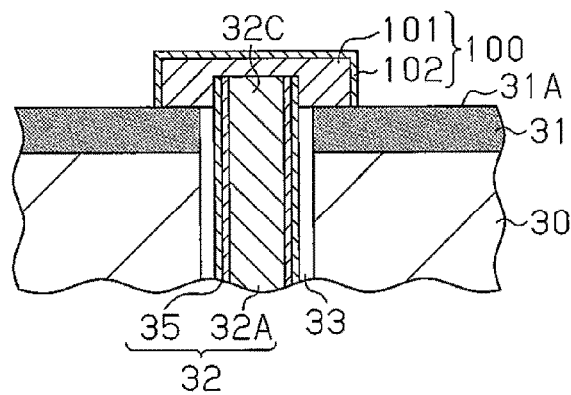

For example, as illustrated in FIG. 26, among a portion of the insulating layer 31 (projection 31B), the insulating film 33, and the through electrode 32, it may be only the through electrode 32 (the conductive layer 32A and the seed layer 35) that projects upward from the first surface 31A of the insulating layer 31. That is, the through electrode 32 may be formed including a projection 32C (projecting end) exposed from the insulating layer 31 and projected upward from the first surface 31A of the insulating layer 31. Further, in this case, the connection terminal 100 may be formed to entirely cover the surface (the upper surface and the side surface) of the projection 32C, the upper surface of the insulating film 33, and a portion of the first surface 31A of the insulating layer 31 formed around the through electrode 32. The height from the first surface 31A of the insulating layer 31 to the upper surface of the projection 32C, that is, the height of the projection 32C is, for example, about 1 to 10 μm. A method for manufacturing the through electrode 32 and the connection terminal 100 in FIG. 26 will now be described.

Figure 27A:
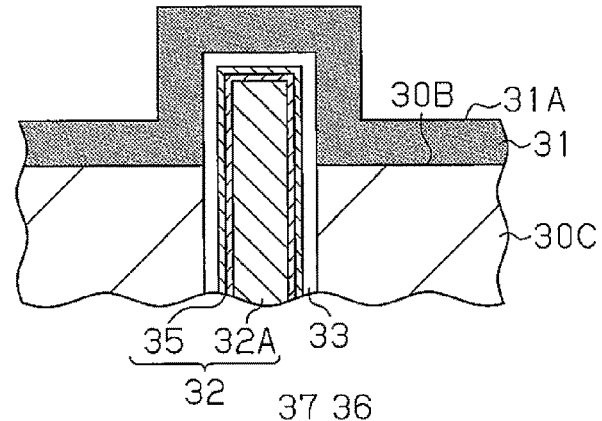
FIGS. 27A to 27C are schematic cross-sectional views each illustrating a method for manufacturing the semiconductor chip of FIG. 24.

First, in the step illustrated in FIG. 27A, following the steps illustrated in FIG. 3A to FIG. 7A, the step illustrated in FIG. 23B is performed. This forms the insulating layer 31 that covers the second surface 30B of the substrate 30C and the insulating film 33 exposed from the substrate 30C.

Figure 27B:
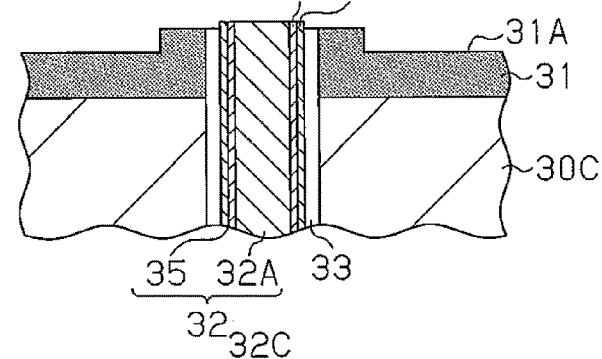
Figure 27C:
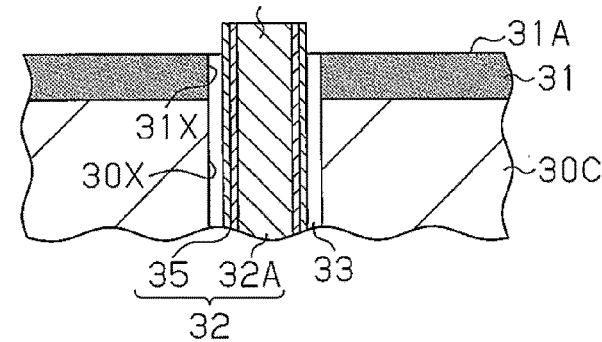

Next, in the steps illustrated in FIG. 27B and FIG. 27C, the insulating film 33 and the metal film 36 and 37, which are formed on the conductive layer 32A, are removed (polished) by using, for example, a CMP device. At this time, the CMP may adjust the material of the slurry and the hardness of the polishing pad. This adjusts the polished amount of each of the insulating layer 31, the insulating film 33, the seed layer 35, and the conductive layer 32A. In this example, the material of the slurry and the hardness of the polishing pad are adjusted such that the polished amount of the insulating layer 31 and the insulating film 33 is larger than the polished amount of the seed layer 35 and the conductive layer 32A. Thus, as illustrated in FIGS. 27B and 27C, part of the seed layer 35 and the conductive layer 32A remains exposed from the insulating layer 31 and the insulating film 33 without being polished. Polishing using the CMP is performed until the upper surface of the insulating layer 31, which is located at a higher position than the upper surface of the insulating film 33 and the first surface 31A, becomes flush with the first surface 31A, as illustrated in FIG. 27C. This forms the through electrode 32 having the projection 32C projecting upward from the first surface 31A of the insulating layer 31 and the upper surface of the insulating film 33. In this step, the opening 31X is formed in the insulating layer 31.

Subsequently, electroless plating is applied to the structure illustrated in FIG. 27C to form the Ni layer 101 that covers the upper surface and the side surface of the through electrode 32 in addition to the insulating film 33 formed around the through electrode 32 and a portion of the upper surface of the insulating layer 31, as illustrated in FIG. 26. Then, the Au layer 102 that covers the upper surface and the side surface of the Ni layer 101 is formed by performing electroless plating to form the connection terminal 100 including the Ni layer 101 and the Au layer 102.

Figure 28:
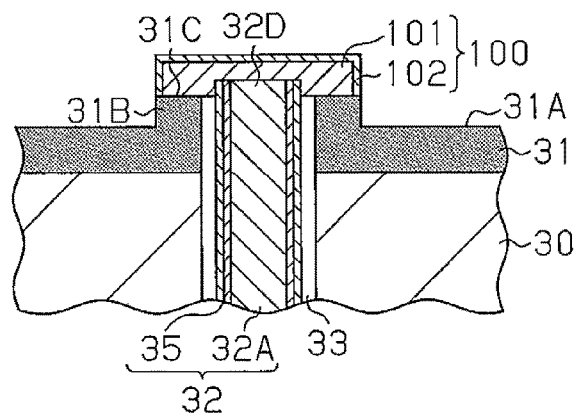
FIGS. 28 to 34 are enlarged cross-sectional views each illustrating part of a semiconductor chip in a modified example.
Figure 29:
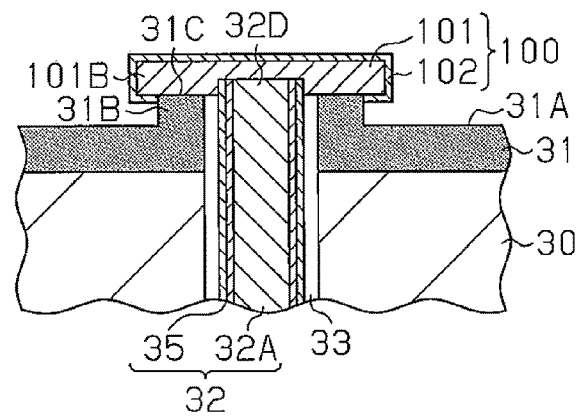
Figure 30:
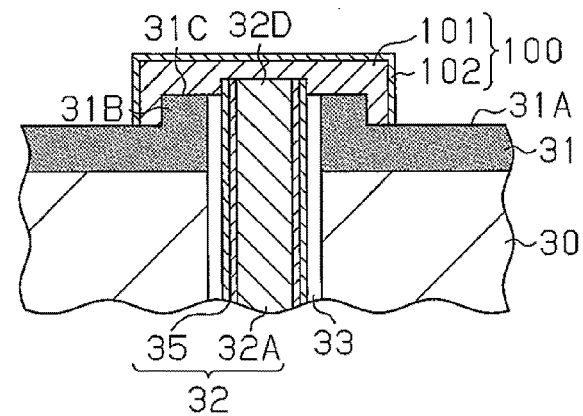

As illustrated in FIGS. 28 to 30, the structure around the connection terminal 100 may be modified. In detail, the insulating layer 31 may include the projection 31B, and the upper surface of the insulating film 33 may be substantially flush with the upper surface of the projection 31B. Further, the through electrode 32 may include a projection 32D (projecting end) projecting upward from the insulating film 33 and the upper surface 31C of the projection 31B. Such a structure may be formed, for example, by performing finishing polishing using the CMP in the step illustrated in FIG. 27B. Further, the structure may include the connection terminal 100 having the following structure.

For example, as illustrated in FIG. 28, the connection terminal 100 may be formed on the insulating film 33 and the projection 31B to entirely cover the surface (the side surface and the upper surface) of the projection 32D in addition to the upper surface of the insulating film 33 and the upper surface 31C of the projection 31B.

For example, as illustrated in FIG. 29, the Ni layer 101 may be formed including the projection 101B projecting sideward from the outer surface of the projection 31B, and the Au layer 102 may be formed to entirely cover the surface of the Ni layer 101 including the lower surface of the Ni layer 101.

For example, as illustrated in FIG. 30, the connection terminal 100 may be formed to entirely cover the surface of the projection 32D and entirely cover the surfaces (side surface and upper surface) of the projection 31B and the insulating film 33. Further, the connection terminal 100 may be formed to partially cover the first surface 31A of the insulating layer 31 formed around the projection 31B.

Figure 31:
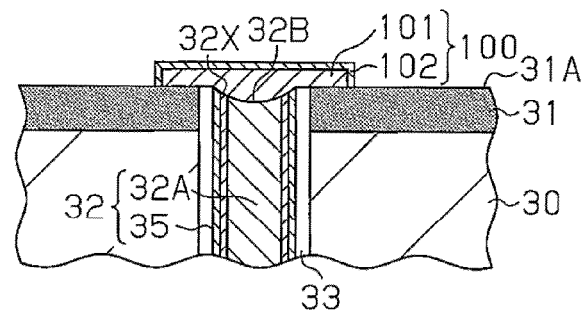

As illustrated in FIG. 31, the structure of the connection terminal 100 and the surrounding structure of the connection terminal 100 may be modified. In detail, the upper end surface 32B of the through electrode 32 may have a recess 32X extending into the through electrodes 32 (toward the lower side as viewed in FIG. 31). In this modified example, the recess 32X having a substantially semielliptical cross-section and extending toward the lower side, as viewed in FIG. 31, from the first surface 31A of the insulating layer 31 is formed in the upper end surface 32B of the through electrode 32. That is, the bottom surface of the recess 32X is a curved surface that is curved downward from the first surface 31A. Further, in this case, the connection terminal 100 (Ni layer 101) may be formed to fill the recess 32X and cover the upper surface of the insulating film 33 and a portion of the first surface 31A of the insulating layer 31 formed around the through electrodes 32. In other words, the connection terminal 100 may be formed with a projection projecting downward (toward the through electrode 32) from the first surface 31A of the insulating layer 31.

For example, in the steps illustrated in FIG. 27B and FIG. 27C, the recess 32X may be formed such that the polished amount of the seed layer 35 and the conductive layer 32A is larger than the polished amount of the insulating layer 31 and the insulating film 33 by adjusting the material of the slurry or the hardness of the polishing pad when performing CMP.

Figure 32:
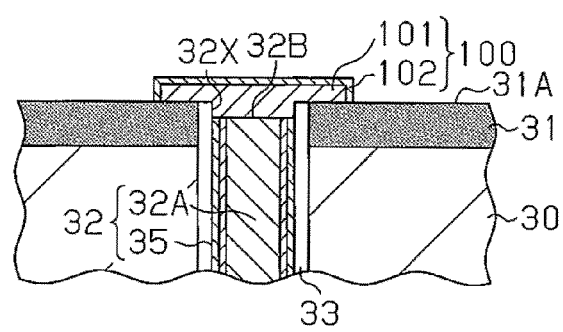

Although the bottom surface of the recess 32X is a curved surface in the modified example illustrated in FIG. 31. However, as illustrated in FIG. 32, the bottom surface of the recess 32X may be a flat surface that is substantially parallel to the first surface 31A of the insulating layer 31. More For example, a recess 32X having a substantially tetragonal cross-sectional view and extending toward the lower side as viewed in FIG. 32 from the first surface 31A of the insulating layer 31 may be formed in the upper end surface 32B of the through electrode 32. In other words, the upper end surface 32B of the through electrode 32 may be lower than the first surface 31A of the insulating layer 31.

In the modified example illustrated in FIGS. 31 and 32, the structure of the insulating film 33 and the through electrodes 32 may be changed.

Figure 33:
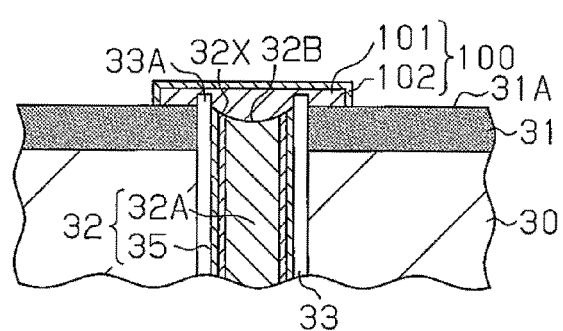

For example, as illustrated in FIG. 33, a portion of the insulating film 33 may project upward from the first surface 31A of the insulating layer 31. That is, the insulating film 33 may be formed including a projection 33A projecting upward from the first surface 31A of the insulating layer 31. Further, in this case, the connection terminal 100 may be formed to entirely cover the surface (the upper surface and the side surface) of the projection 33A. For example, by adjusting the material of the slurry and the hardness of the polishing pad when performing CMP in the step illustrated in FIG. 27B, the projection 33A may be formed such that the polished amount of the seed layer 35 and the conductive layer 32A is greater than that of the insulating layer 31 and the insulating film 33, and the polished amount of the insulating film 33 is smaller than that of the insulating layer 31.

Figure 34:
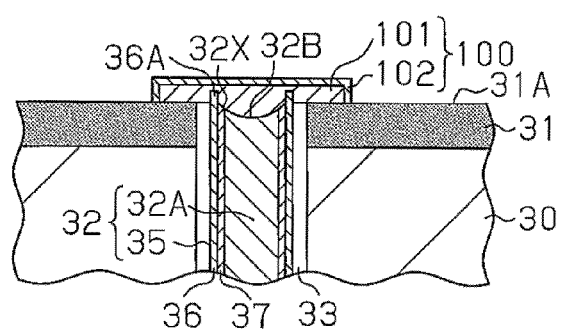

For example, as illustrated in FIG. 34, a portion of the metal film 36 in the seed layer 35 may project upward from the first surface 31A of the insulating layer 31. That is, the metal film 36 may be formed including a projection 36A projecting upward from the first surface 31A of the insulating layer 31. Further, in this case, the connection terminal 100 may be formed to entirely cover the surface (upper surface and side surface) of the projection 36A. The projection 36A may be formed by adjusting the material of the slurry and the hardness of the polishing pad when performing CMP in the step illustrated in FIG. 27B such that the polished amount of the metal film 37 and the conductive layer 32A is greater than that of the insulating layer 31 and the insulating film 33, and the polished amount of the metal film 36 is smaller than that of the insulating layer 31 and the insulating film 33.

The insulating layer 31, the through electrodes 32, the insulating film 33, and the connection terminals 100 in the fifth embodiment and the modified examples illustrated in FIG. 22 to FIG. 34 may be applied to the semiconductor chip 3 in the first and second embodiments and the semiconductor chips 6a and 6b in the second embodiment. For example, when applied to the semiconductor chip 3, instead of the insulating layer 31, the through electrodes 32, the insulating film 33, and the connection terminals 100 illustrated in FIGS. 1 and 13, the insulating layer 31, the through electrodes 32, the insulating film 33, and the connection terminals 34 of the fifth embodiment and the modified examples are used. Further, when applied to the semiconductor chips 6a and 6b, instead of the insulating layer 81, the through electrodes 82, the insulating film 83, and the connection terminals 84, the insulating layer 31, the through electrodes 32, the insulating film 33, and the connection terminals 100 of fifth embodiment and the modified examples are used.

Each end of the connection terminals 100 in the fifth embodiment and the modified examples in FIGS. 22 to 34 may be round.

Sixth Embodiment

A sixth embodiment will now be described with reference to FIGS. 35 and 36. The present embodiment differs from fifth embodiment and the modified examples illustrated in FIGS. 22 to 34 in the shape of connection terminals formed on the first surface 31A of the insulating layer 31. The description hereafter will focus on the differences from the fifth embodiment.

Figure 35A:
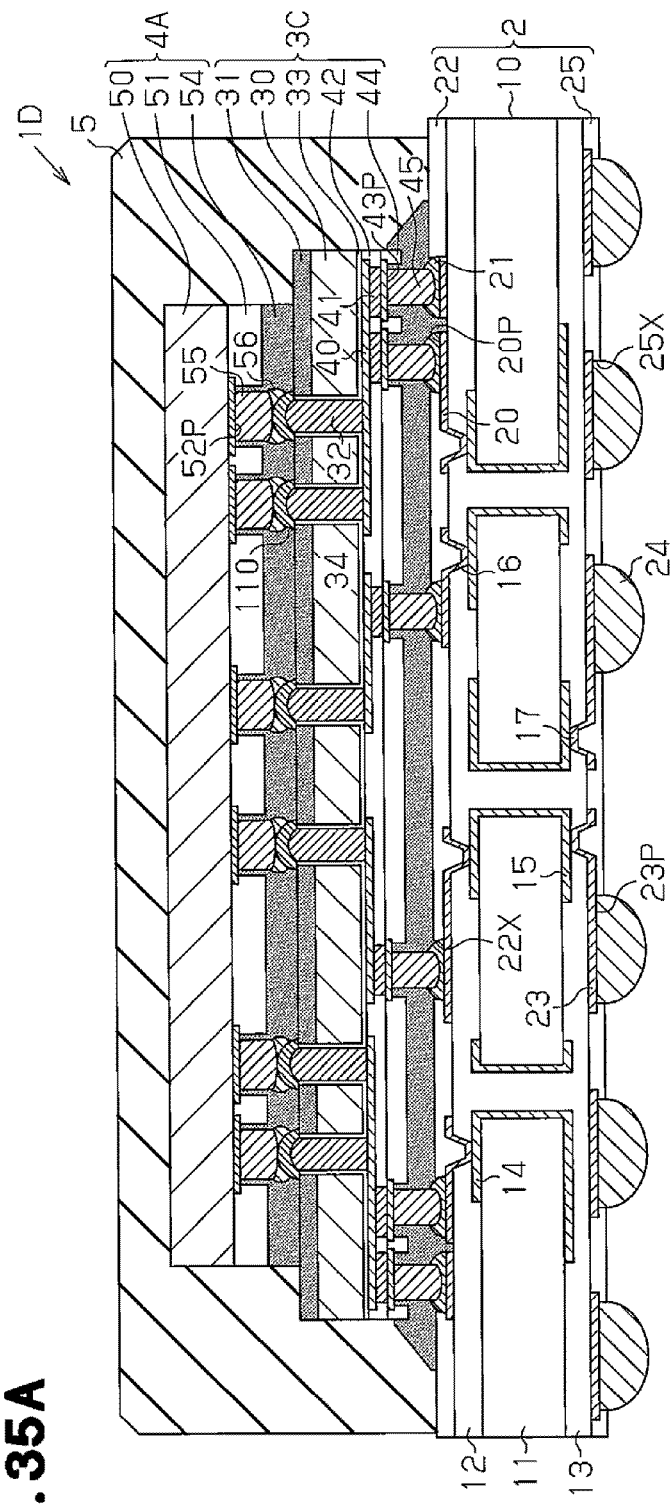
FIG. 35A is a schematic cross-sectional view illustrating a semiconductor package in a sixth embodiment.

As illustrated in FIG. 35A, a semiconductor package 1D includes a wiring substrate 2, a semiconductor chip (lower chip) 3C mounted on the wiring substrate 2, a semiconductor chip (upper chip) 4A stacked on the semiconductor chip 3C, and a encapsulation resin 5 for sealing the semiconductor chip 3C and 4A stacked on the wiring substrate 2.

The lower chip 3C includes a semiconductor substrate 30, an insulating layer 31, through electrodes 32, an insulating film 33, a wiring pattern 40, vias 41, an insulating layer 42, electrode pads 43P, a protective film 44, connection terminals 45, and connection terminals 110 (first connection terminal). The lower chip 3 is flip-chip bonded to the wiring substrate 2.

The insulating layer 31 may be formed by an organic insulating film, made of an epoxy resin or a polyimide resin, or an inorganic insulating film, made of SiN or $SiO_2$.

Figure 35B:
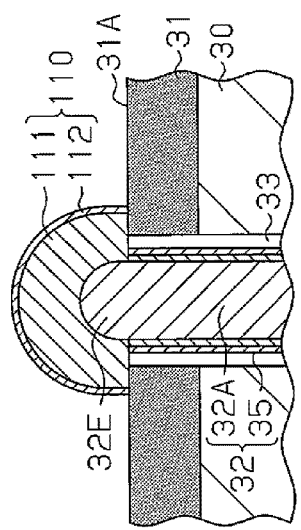
FIG. 35B is an enlarged cross-sectional view illustrating part of the semiconductor chip in FIG. 35A.

As illustrated in FIG. 35B, the through electrode 32 includes the conductive layer 32A and the seed layer 35. The conductive layer 32A has a projection 32E (projecting end) projecting upward from the first surface 31A of the insulating layer 31 and the upper surface of the insulating film 33. The projection 32E has a substantially semicircular or convex cross-section. That is, the projection 32E has an upper surface curved upward from the first surface 31A. The projection 32E of this example includes a first portion having a substantially tetragonal cross-section and a second portion having a substantially semicircular cross-section and formed integrally with the first portion. The upper surface of the seed layer 35 is substantially flush with the upper surface of the insulating film 33 and the first surface 31A of the insulating layer 31.

The connection terminal 110 is formed on the first surface 31A of the insulating layer 31 and the upper surface of the insulating film 33. The diameter of the connection terminal 110 is larger than that of the through electrode 32. The connection terminal 110 is formed to entirely cover the surface (the upper surface and the side surface) of the projection 32E and the upper surface of the seed layer 35. Further, the connection terminal 110 is formed to cover the upper surface of the insulating film 33 and a portion of the first surface 31A of the insulating layer 31 formed around the insulating film 33. The connection terminal 110 is shaped in conformance with the projection 32E. Thus, like the projection 32E, the connection terminal 110 has a substantially semicircular or convex cross-section. That is, the connection terminal 110 includes an upper surface that is curved upward from the first surface 31A. In the connection terminal 110 of this example includes a first portion having a substantially tetragonal cross-section and a second portion having a substantially semicircular cross-section and formed integrally with the first portion. For example, each through electrodes 32 is circular as viewed from above and has a diameter about 5 to 20 μm. For example, each connection terminal 110 is circular as viewed from above and has a diameter of about 5.2 to 30 μm. The thickness of the connection terminal 110 (thickness from the side surface of the projection 32E to the side surface of the connection terminal 110) is, for example, about 1 to 5 μm.

Each of the connection terminals 110 may be a Ni layer/Au layer, a Ni layer/Pd layer/Au layer, a Ni layer/Sn layer, or an Sn layer. Each of the Ni layer, the Au layer, the Pd layer, and the Sn layer may be a metal layer (electroless plating metal layer) formed by performing electroless plating. When the connection terminal 110 is the Ni layer/Pd layer/Au layer, the thickness of the Ni layer may be about 1.0 to 5.0 μm, and the thickness of each of the Pd layer and the Au layer may be about 0.001 to 1.0 μm. When the connection terminal 110 is the Ni layer/Au layer, the thickness of the Ni layer may be about 1.0 to 5.0 μm, and the thickness of the Au layer may be about 0.001 to 1.0 μm. When the connection terminal 110 is the Ni layer/Sn layer, the thickness of the Ni layer may be about 3.0 μm, and the thickness of the Sn layer may be about 2.0 μm. When the connection terminal 110 is the Sn layer, the thickness of the Sn layer may be about 2.0 μm. The connection terminal 110 in the present embodiment includes a Ni layer 111 that entirely covers the surface (the upper surface and the side surface) of the projection 32E in addition to the upper surface of the seed layer 35, the upper surface of the insulating film 33, and the first surface 31A of the insulating layer 31 formed around the insulating film 33, and an Au layer 112 that covers the entire surface of the Ni layer 111.

As illustrated in FIG. 35A, when the upper chip 4A is stacked on the lower chip 3C, the connection terminals 110 are bonded to the connection terminals 55 of the upper chip 4A by the solder layers 56 and electrically connected to the connection terminals 55 by the solder layers 56.

Next, a method for manufacturing the semiconductor package 1D (here, a method for manufacturing the projection 32E of the through electrodes 32) will be described with reference to FIG. 36.

Figure 36A:
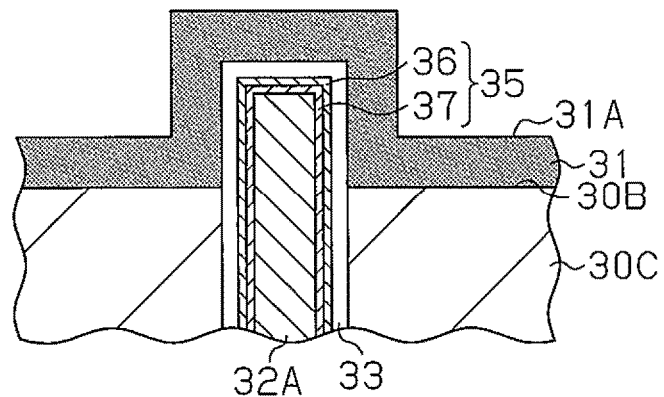
FIGS. 36A to 36C are schematic cross-sectional views each illustrating a method for manufacturing a semiconductor chip in the sixth embodiment.

First, in the step illustrated in FIG. 36A, following the steps illustrated in FIG. 3A to FIG. 7A, the step illustrated in FIG. 23B is performed. This forms the insulating layer 31 to cover the second surface 30B of the substrate 30C and the insulating film 33 exposed from the substrate 30C.

Figure 36B:
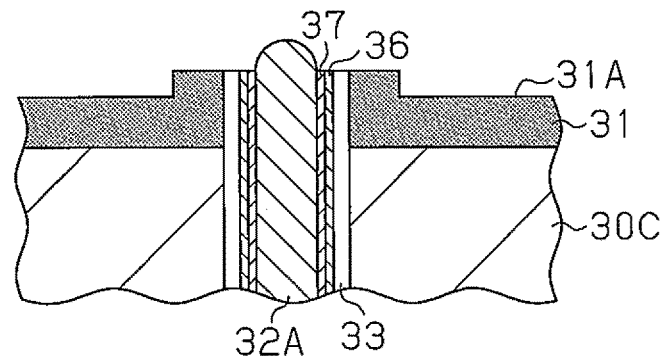
Figure 36C:
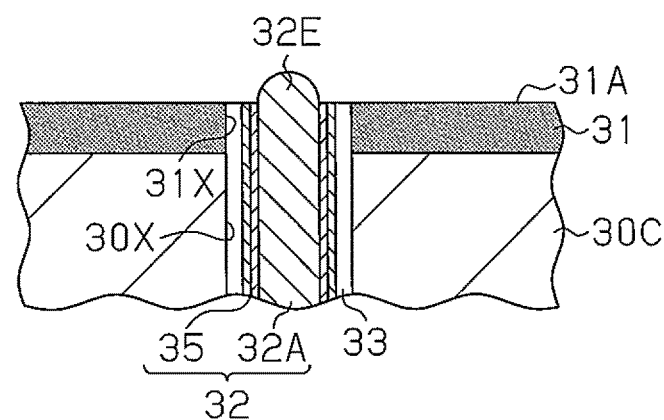

Next, in the steps illustrated in FIG. 36B and FIG. 36C, the insulating film 33 and the metal film 36 and 37, which are formed on the conductive layer 32A, are removed (polished), for example, by using a CMP device. At this time, the material of the slurry and the hardness of the polishing pad are adjusted such that the polished amount of the insulating layer 31, the insulating film 33, and the seed layer 35 is greater than that of the conductive layer 32A. Thus, as illustrated in FIGS. 36B and 36C, a portion of the conductive layer 32A remains exposed from the insulating layer 31, the insulating film 33, and the seed layer 35 without being polished. Further, as illustrated in FIG. 36B and FIG. 36C, in the CMP, the upper surface of the conductive layer 32A is rounded by slightly polishing the conductive layer 32A. In other words, in the CMP, the material of the slurry and the hardness of the polishing pad are adjusted such that the upper surface of the conductive layer 32A becomes a curved surface. As illustrated in FIG. 36C, the polishing in the CMP is performed until the upper surfaces of the insulating layer 31, the upper surface of the insulating film 33, and the upper surface of the seed layer 35 that are located at a higher position than the first surface 31A become substantially flush with the first surface 31A. In this step, the opening 31X is formed in the insulating layer 31, and the through electrode 32 is formed including the conductive layer 32A having the projection 32E and the seed layer 35.

Subsequently, electroless Ni plating is applied to the structure illustrated in FIG. 36C to form the Ni layer 111 that covers the upper surface and the side surface of the projection 32E in addition to the upper surface of the seed layer 35, the upper surface of the insulating film 33, and a portion of the first surface 31A of the insulating layer 31 formed around the insulating film 33, as illustrated in FIG. 35B. At this time, an electroless Ni plating film is isotropically deposited on the surface of the projection 32E to form the Ni layer 111. Thus, the Ni layer 111 is shaped in conformance with the projection 32E. Next, the Au layer 112 that covers the upper surface and the side surface of the Ni layer 111 is formed by electroless Au plating so that the connection terminal 110 is formed including the Ni layer 111 and the Au layer 112.

Then, the connection terminals 110 formed on the lower chip 3C are bonded to the connection terminals 55 formed on the upper chip 4A. For example, the manufacturing step illustrated in FIG. 11B is performed to form the insulating layer in the semi-cured state at the lower side of the upper chip 4A adhered to the insulating layer 31. Then, the connection terminals 55 and the solder layers 56 of the upper chip 4A penetrate the insulating layer in the semi-cured state and are electrically connected to the connection terminals 110. At this time, since the upper surfaces (surfaces opposed to the connection terminals 55) of the connection terminals 110 are curved, the insulating layer in the semi-cured state between the connection terminals 110 and the connection terminals 55 is discharged in a satisfactory manner. Thus, the insulating layer in the semi-cured state is not included between the connection terminals 110 and the connection terminals 55. This improves the reliability of the connection between the connection terminals 110 and the connection terminals 55.

Modified Examples of the Sixth Embodiment

The structure around the connection terminal 110 in the sixth embodiment may be modified.

Figure 37:
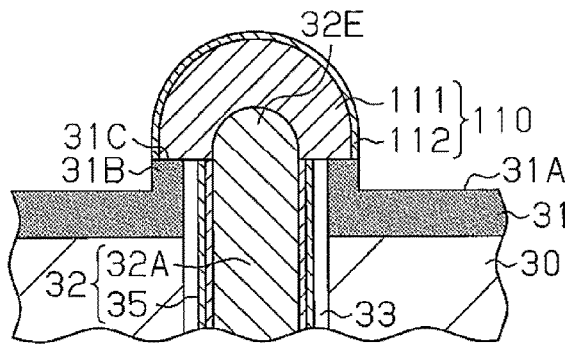
FIGS. 37 to 49 are enlarged cross-sectional views each illustrating part of a semiconductor chip in a modified example.
Figure 38:
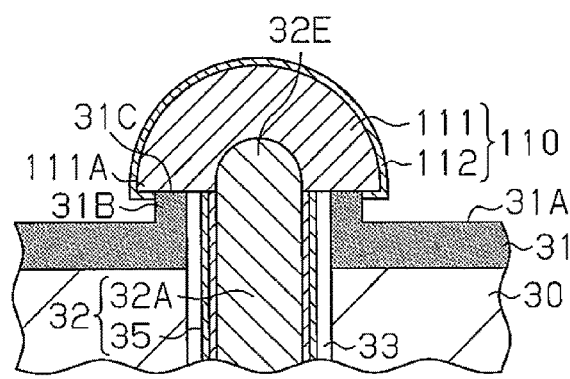
Figure 39:
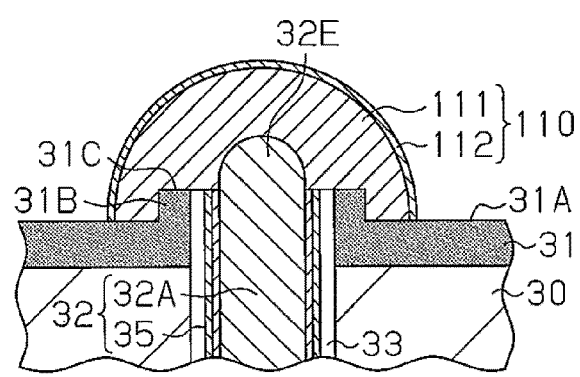

For example, as illustrated in FIG. 37 to FIG. 39, the insulating layer 31 may include the projection 31B. The upper surface of the insulating film 33 and the upper surface of the seed layer 35 may be substantially flush with the upper surface 31C of the projection 31B. The projection 32E projecting upward from the upper surface 31C of the projection 31B may be arranged on the conductive layer 32A. Such a structure may be formed by performing finishing polishing with the CMP in the step illustrated in FIG. 36B. Further, the structure may be provided with the connection terminal 110 having the following structure.

For example, as illustrated in FIG. 37, the connection terminal 110 may be formed on the insulating film 33 and the projection 31B to entirely cover the surface of the projection 32E in addition to the upper surface of the seed layer 35, the upper surface of the insulating film 33, and the upper surface 31C of the projection 31B.

For example, as illustrated in FIG. 38, the Ni layer 111 having a projection 111A projecting sideward from the outer side surface of the projection 31B may be formed, and the Au layer 112 that entirely covers the surface of the Ni layer 111 including the lower surface of the projection 111A may be formed.

For example, as illustrated in FIG. 39, the connection terminal 110 may be formed to entirely cover the surface of the projection 32E in addition to the upper surface of the insulating film 33, the upper surface of the seed layer 35, and the entire surface of the projection 31B. Further, the connection terminal 110 may be formed to cover a portion of the first surface 31A of the insulating layer 31 formed around the projection 31B.

Figure 40:
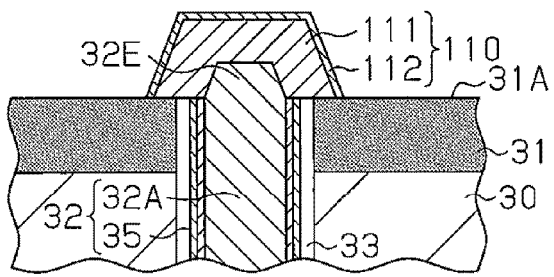

In the sixth embodiment and the modified example in FIGS. 37 to 39, the projection 32E of the conductive layer 32A may have a substantially semispherical cross-section. Instead, as illustrated in FIG. 40, the projection 32E may have a substantially trapezoidal cross-section. In this case, like the projection 32E, the connection terminal 110 has a substantially trapezoidal cross-section.

The structure around the connection terminal 110 in FIG. 40 may be modified.

Figure 41:
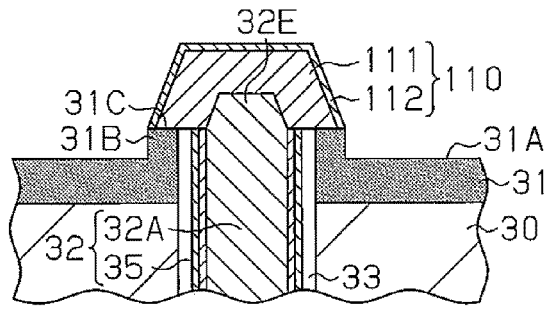
Figure 42:
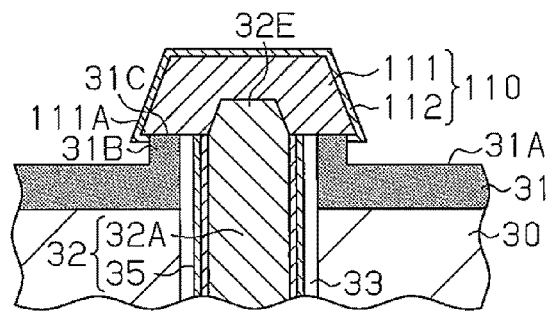
Figure 43:
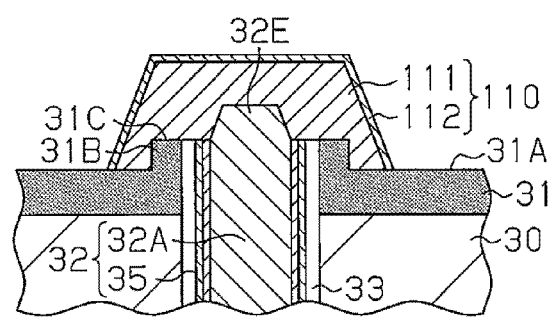

For example, as illustrated in FIGS. 41 to 43, the insulating layer 31 may include the projection 31B. The upper surface of the insulating film 33 and the upper surface of the seed layer 35 may be substantially flush with the upper surface 31C of the projection 31B, and the conductive layer 32A may include the projection 32E having a substantially trapezoidal a cross-sectional view and projecting upward from the upper surface 31C of the projection 31B. Further, the structure may include the connection terminal 110 having the following structure.

For example, as illustrated in FIG. 41, the connection terminal 110 may be formed on the insulating film 33 and the projection 31B to entirely cover the surface of the projection 32E having a substantially trapezoidal cross-section in addition to the upper surface of the seed layer 35, the upper surface of the insulating film 33, and the upper surface 31C of the projection 31B. In this case, like the projection 32E, the connection terminal 110 has a substantially trapezoidal cross-section.

For example, as illustrated in FIG. 42, the Ni layer 111 may be formed including the projection 111A projecting sideward from the outer surface of the projection 31B. The Au layer 112 may be formed entirely covering the surface of the Ni layer 111 including the lower surface of the projection 111A. In this case, like the projection 32E, the connection terminal 110 has a substantially trapezoidal cross-section.

For example, as illustrated in FIG. 43, the connection terminal 110 may be formed to entirely cover the surface of the projection 32E having a substantially trapezoidal cross-section in addition to the upper surface of the insulating film 33, the upper surface of the seed layer 35, and the entire surface of the projection 31B. Further, the connection terminal 110 may cover a portion of the first surface 31A of the insulating layer 31 formed around the projection 31B. In this case, like the projection 32E, the connection terminal 110 has a substantially trapezoidal cross-section.

Figure 44:
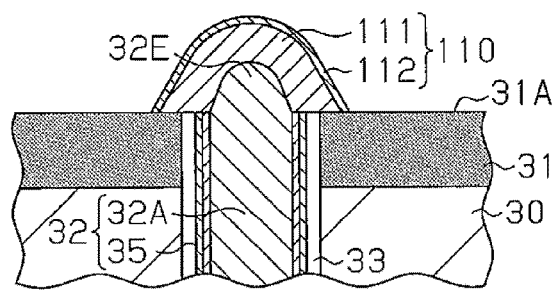

As illustrated in FIG. 44, the projection 32E of the conductive layer 32A may be arched. That is, the projection 32E in this example is formed to be bulged upward from the outer edge of the conductive layer 32A toward the center of the conductive layer 32A. In this case, like the projection 32E, the connection terminal 110 is also arched on the first surface 31A of the insulating layer 31 and the upper surface of the insulating film 33 to entirely cover the surface of the projection 32E. That is, the connection terminal 110 in the present embodiment is formed to be bulged upward from the outer side of the through electrode 32 toward the center of the through electrode 32.

The projection 32E of the conductive layer 32A may be substantially bell-shaped. That is, in this case, the projection 32E is gently bulged at the outer side of the conductive layer 32A, and steeply bulged near the center of the conductive layer 32A. Further, in this case, like the projection 32E, the connection terminal 110 is substantially bell-shaped.

The structure around the connection terminal 110 in FIG. 44 may be modified.

Figure 45:
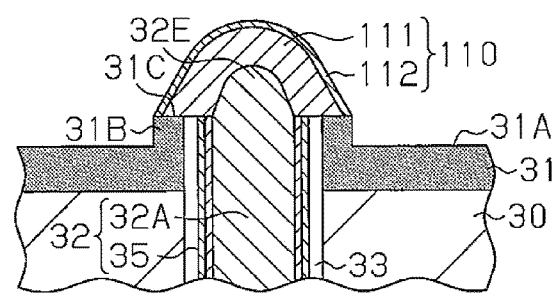
Figure 46:
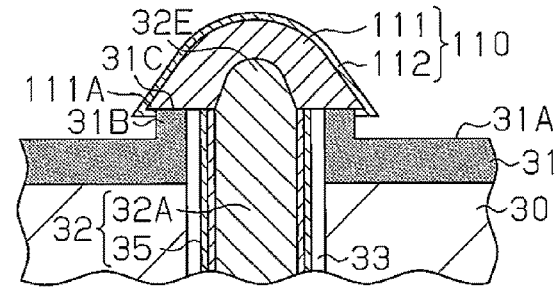
Figure 47:
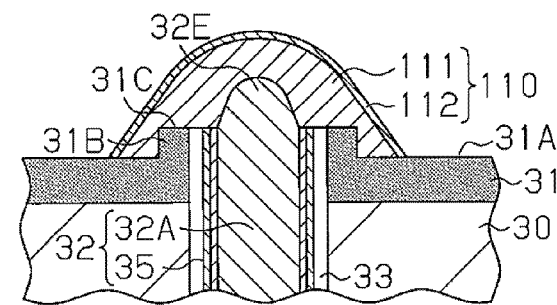

For example, as illustrated in FIGS. 45 to 47, the insulating layer 31 may include the projection 31B. The upper surface of the insulating film 33 and the upper surface of the seed layer 35 may be substantially flush with the upper surface 31C of the projection 31B. The projection 32E that is bulged upward from the upper surfaces of the insulating film 33, the seed layer 35, and the projection 31B may be arranged on the conductive layer 32A. Further, such a structure may include a connection terminal 110 having the following structure.

For example, as illustrated in FIG. 45, the connection terminal 110 may be formed on the insulating film 33 and the projection 31B to entirely cover the surface of the arched projection 32E in addition to the upper surface of the seed layer 35, the upper surface of the insulating film 33, and the upper surface of the projection 31B. In this case, like the projection 32E, the connection terminal 110 is arched.

For example, as illustrated in FIG. 46, the Ni layer 111 may be formed including the projection 111A projecting sideward from the outer side surface of the projection 31B, and the Au layer 112 may entirely cover the surface of the Ni layer 111 including the lower surface of the projection 111A. In this case, like the projection 32E, the connection terminal 110 is arched.

For example, as illustrated in FIG. 47, the connection terminal 110 may be formed to entirely cover the surface of the arched projection 32E as well as the upper surface of the insulating film 33, the upper surface of the seed layer 35, and the entire surface of the projection 31B. Further, the connection terminal 110 may be formed to cover part of the first surface 31A of the insulating layer 31 formed around the projection 31B. In this case, like the projection 32E, the connection terminal 110 is arched.

The insulating layer 31, the through electrodes 32, the insulating film 33, and the connection terminals 110 in sixth embodiment and the modified examples illustrated in FIGS. 37 to 47 may be applied to the semiconductor chip 3 in the first and second embodiments and the semiconductor chips 6a and 6b in the second embodiment. When applied to the semiconductor chip 3, instead of the insulating layer 31, the through electrodes 32, the insulating film 33, and the connection terminals 34 in FIGS. 1 and 13, the insulating layer 31, the through electrodes 32, the insulating film 33, and the connection terminals 110 of the sixth embodiment and the modified examples are formed. When applied to the semiconductor chips 6a and 6b, instead of the insulating layer 81, the through electrodes 82, the insulating film 83, and the connection terminals 84, the insulating layer 31, the through electrodes 32, the insulating film 33, and the connection terminals 110 of the sixth embodiment and the modified examples are formed.

The ends of the connection terminals 110 in the modified examples illustrated in FIGS. 40 to 43 may be rounded.

Other Embodiments

Each of the above-described embodiments may be modified as follows.

For example, an inorganic insulating film of SiN, $SiO_2$, or SiON, or a laminated film in which a plurality of inorganic insulating films are laminated (for example, a SiN film/$SiO_2$ film formed by laminating an SiN film and an $SiO_2$ film in this order) may be used as the insulating layers 31 and 81 in the first to fourth embodiments.

Figure 48:
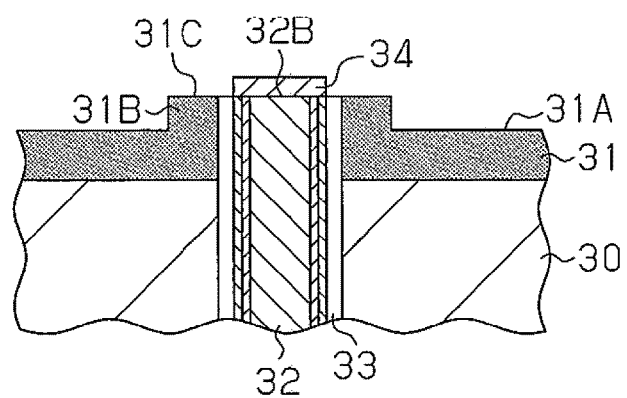

In this case, as illustrated in FIG. 48, for example, the projection 31B projecting upward from the first surface 31A of the insulating layer 31 is formed on the insulating layer 31. The through electrodes 32 and the insulating film 33 are formed to be substantially flush with the upper surface 31C of the projection 31B. The connection terminal 34 is formed on the upper end surface 32B of the through electrode 32 that projects from the first surface 31A of the insulating layer 31 and is exposed from the insulating layer 31 and the insulating film 33. Such an insulating layer 31 may be formed through the manufacturing process illustrated in FIGS. 23A to 23C.

FIG. 48 illustrates a modified example of the insulating layer 31. The insulating layer 81 may also be deformed in the same manner.

The connection terminals 34 and 84 and 100 in each of the above-described embodiments and the modified examples, and the connection terminals 110 illustrated in FIG. 40 to FIG. 43 have tetragonal cross-sections that include corners. Instead, for example, the connection terminals 34 and 84 and 100 and 110 may each have a circular cross-section.

Figure 49:
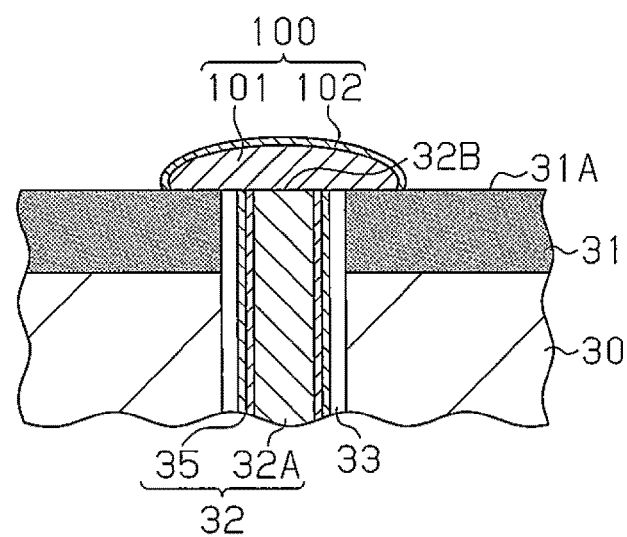

For example, as illustrated in FIG. 49, the connection terminals 100 may have substantially semielliptical cross-sections. In this case, for example, the Ni layer 101 is formed to have a substantially semielliptical cross-section, and the Au layer 102 is formed to entirely cover the surface of the Ni layer 101. Although FIG. 49 illustrates a modified example of the connection terminal 100 illustrated in FIG. 20, the other connection terminals 100 illustrated in FIG. 22, and FIG. 24 to FIG. 34 may be modified in the same manner, and the connection terminals 34 and 84 and 110 may also be modified in the same manner.

In each of the above-described embodiments, the type and the number of the semiconductor chips stacked on the wiring substrate 2 are not limited. For example, the semiconductor chips stacked on the wiring substrate 2 may all be used for a memory device.

In each of the above-described embodiments, when the upper and lower semiconductor chips are stacked, the insulating layer 54A is formed on the lower side of the upper chip 4, and the upper chip 4 is stacked on the lower chip 3. Then, the insulating layer 54 is thermally cured. Thus, the insulating layer 54 performs the same function as the underfill material.

Instead, for example, as illustrated in FIG. 50A, when the upper and lower semiconductor chips are stacked, the insulating layer 54A may be formed on the upper side of the lower chip 3. At this time, the insulating layer 54A is formed to entirely cover the surface of the connection terminal 34 formed on the upper end surface 32B of the through electrode 32. When the material of the insulating layer 54A is a sheet of an insulating resin, the sheet of an insulating resin is laminated on the upper surface of the insulating layer 31. However, in the step illustrated in FIG. 50A, the sheet of an insulating resin is not thermally cured and remains in the B-stage state. When the material of the insulating layer 54A is a liquid or paste of insulating resin (for example, NCP), the liquid or paste of insulating resin is applied to the upper surface of the insulating layer 31, for example, by performing printing or spin coating. When necessary, the applied liquid or paste of insulating resin may be prebaked to the B-stage state.

Subsequently, in the step illustrated in FIG. 50B, after the lower chip 3 is aligned with the upper chip 4, the connection terminals 53 of the upper chip 4 are flip-chip bonded to the through electrodes 32 on which the connection terminals 34 are formed. When the insulating layer 54A is in the semi-cured state, the lower surface of the protective film 51 of the upper chip 4 is adhered to the upper surface of the insulating layer 54A of the lower chip 3, and the connection terminals 53 of the upper chip 4 penetrate the insulating layer 54A in the semi-cured state and hit the connection terminals 34 of the lower chip 3. Thus, the connection terminals 34 and 53 are electrically connected to each other. The insulating layer 54A in the semi-cured state is heated at a curing temperature or higher for a predetermined time and thermally cured. When the insulating layer 54A is still liquid, the upper chip 4 may be flip-chip bonded to the lower chip 3, and the insulating layer 54A may be thermally cured at the same time as when the connection terminals 34 and 53 are connected. Such insulating layer 54A performs the same function as the underfill material.

Alternatively, after the upper chip 4 is stacked on the lower chip 3, the underfill material may be filled between the lower chip 3 and the upper chip 4.

In the first to third embodiments, when the insulating layer 31, the insulating film 33, and the conductive layer 32A are thinned to form the through electrodes 32 (refer to FIG. 7C), the insulating layer 31, the insulating film 33, and the conductive layer 32A are ground. Instead, the insulating layer 31, the insulating film 33, and the conductive layer 32A may be thinned to form the through electrodes 32 with a CMP device.

The disclosure further encompasses various example(s) described below.

[Clause 1] A method for manufacturing a semiconductor device, the method comprising:
    forming a groove in a main surface of a base material;
    forming an insulating film that covers a wall surface of the groove;
    forming a metal barrier layer that covers the wall surface of the groove so that the insulating film is located between the groove and the metal barrier layer;
    forming a conductive layer in the groove that is covered by the insulating film and the metal barrier layer;
    laminating a wiring pattern, which is connected to the conductive layer, and a second insulating layer on the main surface of the base material;
    forming a semiconductor substrate by thinning the base material from an opposite side of the main surface such that the groove becomes a through hole and portions of the conductive layer and the metal barrier layer, which are covered by the insulating film, are protruded from the base material;
    covering the opposite side of the semiconductor substrate with a first insulating layer;
    grinding or polishing the first insulating layer, the insulating film, and the conductive layer to expose an end surface of the conductive layer, wherein the grinding or polishing includes forming, in the first insulating layer, an opening that is in communication with the through hole and has the same diameter as the through hole, and forming a through electrode including the conductive layer and the metal barrier layer in the through hole and the opening; and
    forming, on the insulating film, a first connection terminal including an electroless plating metal layer that covers an end surface of the through electrode exposed from the first insulating layer and has a larger diameter than the through electrode.

[Clause 2] The method according to Clause 1, wherein the grinding or polishing includes adjusting a slurry material for a polishing pad hardness to adjust a polished amount of the first insulating layer, the insulating film, the metal barrier layer, and the conductive layer.

[Clause 3] The method according to Clause 1, further comprising forming a second connection terminal on an electrode pad connected to the wiring pattern.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

The invention claimed is:
1. A semiconductor device comprising:
    a semiconductor substrate including a first surface, a second surface, and a through hole extending through the semiconductor substrate from the first surface to the second surface;
    a first insulating layer that covers the second surface of the semiconductor substrate, wherein the first insulating layer includes an opening that is in communication with the through hole and has a diameter that is the same as that of the through hole;
    an insulating film that covers a wall surface of the through hole and a wall surface of the opening;
    a through electrode formed in the through hole and the opening that are covered by the insulating film, wherein the through electrode includes a metal barrier layer, which covers the insulating film in the through hole and the opening, and a conductive layer, which fills the through hole and the opening and which is surrounded by and in contact with the metal barrier layer;
    a first connection terminal formed on the first insulating layer, the first connection terminal including an electroless plating metal layer that is formed on an end surface of the through electrode and on an the end surface of the insulating film, wherein the first connection terminal has a larger diameter than the through electrode;

a wiring pattern and a second insulating layer that are laminated on the first surface of the semiconductor substrate; and
an electrode pad connected to the wiring pattern,
wherein the through electrode is connected to the wiring pattern.

2. The semiconductor device according to claim 1, wherein
the first connection terminal covers the end surface of the through electrode that is exposed from the opening of the first insulating layer,
the first connection terminal covers the end surface of the insulating film exposed from the opening of the first insulating layer, and
the first connection terminal covers a portion of the first insulating layer that surrounds the end surface of the insulating film.

3. The semiconductor device according to claim 1, wherein
the first insulating layer includes a contact surface, which is in contact with the semiconductor substrate, and a main surface, which is located at an opposite side of the contact surface, and
the first connection terminal is formed by a first projection projecting outward from the main surface of the first insulating layer.

4. The semiconductor device according to claim 3, wherein
a portion of the through electrode and a portion of the insulating film are exposed from the first projection, and
the first connection terminal covers the portion of the through electrode exposed from the first projection and the portion of the insulating film exposed from the first projection.

5. The semiconductor device according to claim 4, wherein the first connection terminal entirely covers the first projection and a portion of the main surface of the first insulating layer that surrounds the first projection.

6. The semiconductor device according to claim 2, wherein
the first insulating layer includes a contact surface, which is in contact with the semiconductor substrate, and a main surface, which is located at an opposite side of the contact surface,
the conductive layer includes a projecting end projecting from the main surface of the first insulating layer,
the projecting end has a curved end surface or a semispherical end surface, and
the first connection terminal entirely covers the projecting end.

7. A semiconductor device comprising:
a semiconductor substrate including a first surface, a second surface, and a through hole extending through the semiconductor substrate from the first surface to the second surface;
a first insulating layer that covers the second surface of the semiconductor substrate, wherein the first insulating layer includes an opening that is in communication with the through hole and has a diameter that is the same as that of the through hole;
an insulating film that covers a wall surface of the through hole and a wall surface of the opening;
a through electrode formed in the through hole and the opening that are covered by the insulating film, wherein the through electrode includes a metal barrier layer, which covers the insulating film in the through hole and the opening, and a conductive layer, which fills the through hole and the opening and which is surrounded by the metal barrier layer;
a first connection terminal including an electroless plating metal layer that is formed on an end surface of the through electrode and on an the end surface of the insulating film, wherein the first connection terminal has a larger diameter than the through electrode;
a wiring pattern and a second insulating layer that are laminated on the first surface of the semiconductor substrate; and
an electrode pad connected to the wiring pattern,
wherein
the through electrode is connected to the wiring pattern,
the first insulating layer includes a contact surface, which is in contact with the semiconductor substrate, and a main surface, which is located at an opposite side of the contact surface, and
the first connection terminal is formed by a first projection projecting outward from the main surface of the first insulating layer.

8. The semiconductor device according to claim 7, wherein
the first connection terminal covers the end surface of the through electrode that is exposed from the opening of the first insulating layer,
the first connection terminal covers the end surface of the insulating film exposed from the opening of the first insulating layer, and
the first connection terminal covers a portion of the first insulating layer that surrounds the end surface of the insulating film.

9. The semiconductor device according to claim 7, wherein
a portion of the through electrode and a portion of the insulating film are exposed from the first projection, and
the first connection terminal covers the portion of the through electrode exposed from the first projection and the portion of the insulating film exposed from the first projection.

10. The semiconductor device according to claim 9, wherein the first connection terminal entirely covers the first projection and a portion of the main surface of the first insulating layer that surrounds the first projection.

11. A semiconductor device comprising:
a semiconductor substrate including a first surface, a second surface, and a through hole extending through the semiconductor substrate from the first surface to the second surface;
a first insulating layer that covers the second surface of the semiconductor substrate, wherein the first insulating layer includes an opening that is in communication with the through hole and has a diameter that is the same as that of the through hole;
an insulating film that covers a wall surface of the through hole and a wall surface of the opening;
a through electrode formed in the through hole and the opening that are covered by the insulating film, wherein the through electrode includes a metal barrier layer, which covers the insulating film in the through hole and the opening, and a conductive layer, which fills the through hole and the opening and which is surrounded by the metal barrier layer;
a first connection terminal including an electroless plating metal layer that is formed on an end surface of the through electrode and on an the end surface of the insulating film, wherein the first connection terminal has a larger diameter than the through electrode;
a wiring pattern and a second insulating layer that are laminated on the first surface of the semiconductor substrate; and
an electrode pad connected to the wiring pattern,
wherein
the through electrode is connected to the wiring pattern, the first connection terminal covers the end surface of the through electrode that is exposed from the opening of the first insulating layer, the first connection terminal covers the end surface of the insulating film exposed from the opening of the first insulating layer, and the first connection terminal covers a portion of the first insulating layer that surrounds the end surface of the insulating film, the first insulating layer includes a contact surface, which is in contact with the semiconductor substrate, and a main surface, which is located at an opposite side of the contact surface, the conductive layer includes a projecting end projecting from the main surface of the first insulating layer, the projecting end has a curved end surface or a semispherical end surface, and the first connection terminal entirely covers the projecting end.

12. The semiconductor device according to claim 11, wherein the first insulating layer includes a contact surface, which is in contact with the semiconductor substrate, and a main surface, which is located at an opposite side of the contact surface, and the first connection terminal is formed by a first projection projecting outward from the main surface of the first insulating layer.

13. The semiconductor device according to claim 12, wherein a portion of the through electrode and a portion of the insulating film are exposed from the first projection, and the first connection terminal covers the portion of the through electrode exposed from the first projection and the portion of the insulating film exposed from the first projection.

14. The semiconductor device according to claim 13, wherein the first connection terminal entirely covers the first projection and a portion of the main surface of the first insulating layer that surrounds the first projection.

* * * * *